(12) United States Patent
Jones et al.

(10) Patent No.: US 12,114,081 B2
(45) Date of Patent: Oct. 8, 2024

(54) SYSTEMS AND METHODS FOR CREATING A FULL-COLOR IMAGE IN LOW LIGHT

(71) Applicant: Chromatra, LLC, Lincoln, MA (US)

(72) Inventors: Peter W. J. Jones, Belmont, MA (US); Ellen Cargill, Norfolk, MA (US); Dennis W. Purcell, Medford, MA (US)

(73) Assignee: Chromatra, LLC, Lincoln, MA (US)

( * ) Notice: Subject to any disclaimer, the term of this patent is extended or adjusted under 35 U.S.C. 154(b) by 302 days.

(21) Appl. No.: 17/651,698

(22) Filed: Feb. 18, 2022

(65) Prior Publication Data

US 2022/0174245 A1    Jun. 2, 2022

Related U.S. Application Data

(63) Continuation of application No. PCT/US2020/048565, filed on Aug. 28, 2020.
(Continued)

(51) Int. Cl.
*H04N 23/84* (2023.01)
*H04N 23/71* (2023.01)
(Continued)

(52) U.S. Cl.
CPC .......... *H04N 23/843* (2023.01); *H04N 23/71* (2023.01); *H04N 23/741* (2023.01); *H04N 25/13* (2023.01);
(Continued)

(58) Field of Classification Search
CPC ...... H04N 23/71; H04N 23/741; H04N 23/84; H04N 23/843; H04N 25/13; H04N 25/131; H04N 25/133; H04N 25/134
See application file for complete search history.

(56) References Cited

U.S. PATENT DOCUMENTS

| 2,971,093 A | 2/1961 | Max |
| 3,736,050 A | 5/1973 | Bolum |
(Continued)

FOREIGN PATENT DOCUMENTS

| CN | 106375742 A | 2/2017 |
| WO | 03079057 A2 | 9/2003 |
| WO | 2019023277 A1 | 1/2019 |

OTHER PUBLICATIONS

Notification of Transmittal of the International Search Report and the Written Opinion of the International Searching Authority, or the Declaration dated Feb. 26, 2013 in connection with International Patent Application No. PCT/ US2012/070170, 12 pages.
(Continued)

*Primary Examiner* — Daniel M Pasiewicz

(57) ABSTRACT

Imaging devices and methods for generating a color image from a low-light scene. A method incudes filtering light from the low-light scene to produce a first light channel having filtered light filtered by a first filter and a second light channel having unfiltered light. The method includes producing a first information channel and a second information channel. The first information channel includes first brightness information corresponding to the first light channel and the second information channel includes second brightness information corresponding to the second light channel. The method includes receiving the first information channel and the second information channel and assigning the first brightness information to a first color channel. The method includes assigning the second brightness information to second color channel and processing the first color channel and the second color channel to produce a full-color image stream. The method includes outputting the full-color image stream.

18 Claims, 39 Drawing Sheets

Related U.S. Application Data

(60) Provisional application No. 62/894,435, filed on Aug. 30, 2019.

(51) Int. Cl.
  *H04N 23/741* (2023.01)
  *H04N 25/13* (2023.01)
  *H04N 25/133* (2023.01)

(52) U.S. Cl.
  CPC ......... *H04N 25/133* (2023.01); *H04N 25/134* (2023.01)

(56) References Cited

U.S. PATENT DOCUMENTS

| | | |
|---|---|---|
| 3,971,065 A | 7/1976 | Bayer |
| 4,085,421 A | 4/1978 | Gilmour |
| 4,679,068 A | 7/1987 | Lillquist et al. |
| 4,800,474 A | 1/1989 | Bornhorst |
| 5,051,821 A | 9/1991 | Vittot et al. |
| 5,214,503 A | 5/1993 | Chiu et al. |
| 5,812,187 A | 9/1998 | Watanabe |
| 5,986,767 A | 11/1999 | Nakano et al. |
| 6,327,093 B1 | 12/2001 | Nakanishi et al. |
| 6,614,606 B2 | 9/2003 | Jones |
| 7,345,277 B2 | 3/2008 | Zhang |
| 7,507,964 B2 | 3/2009 | Jones et al. |
| 7,929,727 B2 | 4/2011 | Jones et al. |
| 8,130,292 B2 | 3/2012 | Lee |
| 8,259,201 B2 | 9/2012 | Stuck et al. |
| 8,295,631 B2 | 10/2012 | Adams, Jr. et al. |
| 8,988,590 B2 | 3/2015 | Gillet et al. |
| 9,177,988 B2 | 11/2015 | Jones et al. |
| 9,955,127 B2 | 4/2018 | Jones et al. |
| 10,341,621 B2 | 7/2019 | Jones et al. |
| 11,070,773 B2 | 7/2021 | Jones et al. |
| 2001/0019363 A1 | 9/2001 | Katta et al. |
| 2001/0045988 A1 | 11/2001 | Yamauchi et al. |
| 2002/0067560 A1 | 6/2002 | Jones |
| 2003/0218676 A1 | 11/2003 | Miyahara |
| 2004/0086186 A1 | 5/2004 | Kyusojin et al. |
| 2004/0212677 A1 | 10/2004 | Uebbing |
| 2004/0247173 A1 | 12/2004 | Nielsen et al. |
| 2005/0200701 A1 | 9/2005 | Jones |
| 2005/0207015 A1 | 9/2005 | Jones et al. |
| 2006/0017829 A1 | 1/2006 | Gallagher |
| 2006/0088298 A1 | 4/2006 | Frame et al. |
| 2006/0125921 A1 | 6/2006 | Foote |
| 2006/0187326 A1 | 8/2006 | Spencer |
| 2007/0081084 A1 | 4/2007 | Wernersson |
| 2008/0237771 A1 | 10/2008 | Pilla et al. |
| 2009/0296247 A1 | 12/2009 | Jones et al. |
| 2010/0245636 A1 | 9/2010 | Kumar et al. |
| 2011/0115934 A1 | 5/2011 | Wang |
| 2012/0147243 A1 | 6/2012 | Townsend et al. |
| 2012/0200734 A1 | 8/2012 | Tang |
| 2013/0329053 A1 | 12/2013 | Jones et al. |
| 2016/0073067 A1 | 3/2016 | Jones et al. |
| 2016/0330358 A1 | 11/2016 | Fergus et al. |
| 2020/0169653 A1* | 5/2020 | Jones ..................... G02B 23/12 |

OTHER PUBLICATIONS

Google search for NPL log, Nov. 23, 2017, 1 page.
Notification of Transmittal of the International Search Report and the Written Opinion of the International Searching Authority, or the Declaration dated Oct. 22, 2018 in connection with International Patent Application No. PCT/US2018/043553, 12 pages.
Google Search for NPL log, Mar. 22, 2021, 1 page.
Office Action dated Jul. 16, 2020 in connection with U.S. Appl. No. 16/453,900, 9 pages.
Vincent et al., "Stacked Denoising Autoencoders: Learning Useful Representations in a Deep Network with a Local Denoising Criterion", Journal of Machine Learning Research, 2010, 38 pages.
Jones et al., "System and Apparatus for Color Imaging Device", PCT Application No. PCT/JS/2018/043553, filed Jul. 24, 2018, 74 pages.
International Search Report and Written Opinion of the International Searching Authority dated Nov. 9, 2020, in connection with International Application No. PCT/US2020/048565, 11 pages.
International Preliminary Report on Patentability (Chapter I of the Patent Cooperation Treaty) dated Mar. 1, 2022 in connection with International Patent Application No. PCT/US2020/048565, 9 pages.

\* cited by examiner

Pixel Pattern 1000

| Pixel 1002 | Pixel 1004 | Pixel 1004 | Pixel 1004 |
|---|---|---|---|
| Pixel 1004 | Pixel 1004 | Pixel 1002 | Pixel 1004 |
| Pixel 1004 | Pixel 1002 | Pixel 1004 | Pixel 1004 |
| Pixel 1004 | Pixel 1004 | Pixel 1004 | Pixel 1002 |

FIG. 10

Pixel Pattern 1100

| Pixel 1102 | Pixel 1104 | Pixel 1104 | Pixel 1104 |
| --- | --- | --- | --- |
| Pixel 1104 | Pixel 1104 | Pixel 1104 | Pixel 1104 |
| Pixel 1102 | Pixel 1104 | Pixel 1102 | Pixel 1104 |
| Pixel 1104 | Pixel 1102 | Pixel 1104 | Pixel 1102 |

FIG. 11

Pixel Pattern 1200

| Pixel 1204 | Pixel 1204 | Pixel 1202 | Pixel 1204 |
|---|---|---|---|
| Pixel 1204 | Pixel 1204 | Pixel 1204 | Pixel 1204 |
| Pixel 1204 | Pixel 1204 | Pixel 1204 | Pixel 1204 |
| Pixel 1202 | Pixel 1202 | Pixel 1204 | Pixel 1202 |

FIG. 12

Pixel Pattern 1300

| Pixel 1304 | Pixel 1304 | Pixel 1304 | Pixel 1304 |
|---|---|---|---|
| Pixel 1304 | Pixel 1302 | Pixel 1302 | Pixel 1304 |
| Pixel 1304 | Pixel 1302 | Pixel 1302 | Pixel 1304 |
| Pixel 1304 | Pixel 1304 | Pixel 1304 | Pixel 1304 |

FIG. 13

SYSTEMS AND METHODS FOR CREATING A FULL-COLOR IMAGE IN LOW LIGHT

REFERENCE TO OTHER APPLICATIONS

This application is a continuation of international patent application PCT/US2020/048565, filed Aug. 28, 2020, and claims the benefit of the filing date of U.S. Provisional Patent Application 62/894,435, filed Aug. 30, 2019, both of which are hereby incorporated by reference. The following patents and applications are also hereby incorporated by reference in their entireties:

U.S. Pat. No. 10,341,621;
U.S. Pat. No. 9,955,127;
U.S. Pat. No. 9,177,988;
U.S. Pat. No. 6,614,606;
U.S. Pat. No. 7,507,964;
U.S. Pat. No. 7,929,727;
U.S. patent application Ser. No. 16/453,900, filed Jun. 26, 2019;
International Patent Application PCT/US2018/043553, filed Jul. 24, 2018;
U.S. Provisional Application No. 62/536,349, filed Jul. 24, 2017;
U.S. Provisional Application No. 61/576,769, filed Dec. 16, 2011; and
U.S. Provisional Application No. 61/609,762, filed Mar. 12, 2012.

BACKGROUND

Many fields demand low-light imaging and video. Security cameras must often record minimally illuminated scenes; most marine environments receive little sunlight; the human body does not admit much of the light required for medical endoscopy.

A number of modern image sensor technologies have been developed to satisfy these demands. These modern low-light image sensors are, at their base, a digital camera. A digital camera replaces photosensitive film with an array of photoelectric sensors. The camera lens focuses an image onto the sensor array; each sensor produces an electrical signal proportional to the intensity of the light falling upon it; and the digital camera's processor converts the signals from the array of sensors into an image. To record the color of the light falling on a sensor, digital cameras typically include a color filter array (CFA) disposed over the sensor array. Each filter of the CFA transmits specific wavelengths of light. These digital cameras take color pictures by measuring the intensity of incoming light passing through the CFA. One example of a typical CFA is the RGB Bayer pattern, described in U.S. Pat. No. 3,971,065 (hereby incorporated by reference) and composed of red, green, and blue (RGB) filters in a checkerboard pattern. Red-filtered sensors measure the intensity of the red light that passes through the red filters, green-filtered sensors measure the intensity of the green light that passes through the green filters, and blue-filtered sensors measure the intensity of the blue light that passes through the blue filters. A digital camera processor typically interpolates the red, green, and blue intensity data to assign an RGB value to each pixel. Currently, several approaches within this digital camera paradigm have been used to produce digital cameras in general, and low-light cameras in specific. These methods include charge-coupled device (CCD) cameras and variations on active-pixel sensor cameras produced using the complementary metal oxide semiconductor process (CMOS cameras).

CCD cameras typically include a two-dimensional array of photosensitive elements or photoelectric sensors. Each element is coupled to a capacitor that can store light intensity information as a quantity of charge. One example of an image-sensing CCD is depicted in FIG. 3. The array of capacitors transfers the stored charge to a charge amplifier, which converts the charge into a readily measured voltage. The capacitors transfer charge down and across the CCD array until the entire CCD has been read. Most CCD cameras include an RGB Bayer CFA overlaid on the sensor array to discern colors.

Although CCD technology offers high light sensitivity and low noise, it suffers from several disadvantages. The charge generated in a CCD pixel array is transferred as an analog signal through only a few output nodes, requiring a higher data transfer rate and at least an analog-to-digital converter (ADC) outside the sensor. CCDs thus take up more space than comparable non-CCD sensors. Moreover, CCDs can consume up to 100 times as much power as comparable non-CCD sensors, generating heat that can degrade image quality. Additionally, light may be falsely recorded during the reading process: if light falls on a pixel while charge is being transferred between pixels, the light will increase the charge associated with a different pixel, erroneously creating a "smear" of light in the recorded image.

In contrast with CCDs, every pixel of a CMOS camera sensor includes its own amplifier. These active-pixel sensors can be made using the common complementary metal-oxide semiconductor (CMOS) process, and are thus commonly referred to as CMOS sensors. Like CCD cameras, CMOS cameras typically include an RGB Bayer CFA to discern color. The CMOS process allows more features to be added to the CMOS sensor. For example, image processing can be performed on the CMOS sensor chip, and adding an amplifier and an analog-to-digital converter to each pixel eliminates the data bottlenecks of CCD sensors. CMOS sensors thus take higher-resolution images more rapidly and efficiently than CCD cameras while eliminating smear.

However, the additional circuitry surrounding each pixel in a CMOS sensor reduces the light sensitivity of CMOS sensors relative to CCDs, a particular disadvantage in low-light applications. To improve the low-light performance of CMOS sensors, researchers have developed several techniques, including frontside illumination (FSI) optimization, backside illumination (BSI), and direct CMOS systems.

A standard CMOS pixel places circuitry above the photosensitive layer. This circuitry scatters some of the light entering the CMOS pixel, reducing the effective sensitivity of the sensor. The FSI optimization technique uses a number of methods to reduce light scattering by the circuitry, including adding a waveguide to the pixel and applying antireflective coatings to the pixel array.

The BSI technique places the photosensitive layer directly behind the color filters and the circuitry behind the photosensitive layer. BSI may suffer from cross-talk, where data from one pixel creates noise by bleeding into nearby pixels. Both BSI and optimized FSI require relatively new manufacturing techniques. Moreover, despite the substantial changes in structure, both FSI and BSI techniques can claim no more than modest improvements in low-light conditions.

Direct CMOS cameras attempt to improve the low-light performance of CMOS sensors by replacing a single pixel covered by a red, green, or blue filter with a stack of three photodiodes embedded in silicon. Red, green, and blue light penetrate silicon to different depths, so different layers absorb primarily red, green, or blue light. A direct CMOS system thus acquires full-color information without a CFA, and thereby offers greater low-light sensitivity and higher resolution than a traditional RGB system. But each of the photodiodes is made of silicon: each photodiode absorbs overlapping portions of the spectrum. This overlap creates issues of color accuracy, particularly in low-light conditions. Moreover, as a direct CMOS system must acquire data for three different photodetectors per pixel, it is appreciably more difficult to manufacture than a standard CMOS system.

Other approaches have attempted to use a "sparse filter array" of RGB pixels interspersed amongst unfiltered pixels (called "white," "w," or "clear"). This RGBW system is practically ineffective at low light because of the difference between in the amount of light getting to the filtered pixels and the amount of light getting to the unfiltered pixels. Especially in low light, if the sensor's exposure is determined by the light reaching filtered pixel's wells, then the unfiltered pixels will be saturated. If the sensor's exposure is determined by the light reaching the unfiltered pixel's well, then the filtered pixels—especially the blue pixels—may be underexposed to the extent that the signal to noise ratio may be to low to be useful in creating a color image.

Accordingly, there is still a need for an improved low-light image sensor.

SUMMARY

Current technologies for low-light image sensors rely on substantial changes to the sensor structure itself, but all rely on three light channels: that is, all rely on measuring intensities associated with three different sets of wavelengths of electromagnetic radiation. It is widely believed that three light channels are required for good color reproduction, as indeed the human eye is itself a three-light-channel system. However, the inventors have recognized that the common RGB Bayer CFA plus its generally required approximately 650 nm IR cut filter filters out approximately two-thirds of incoming light. Other three-channel systems present similar problems. The inventors also recognized that CMOS sensors and image intensifier are also sensitive near-IR light generally from 650 nm to 900 nm and that it would be useful to develop a color encoding schema that could make use of the near-IR wavelengths in addition to the visible wavelengths and still produce an acceptable color image. The inventors have developed a two-light-channel system that can differentiate a set of predetermined colors without the disadvantages of three-light-channel systems. As an illustrative example, a two-light-channel system may produce a full-color image, allowing a viewer to correctly identify a car as green rather than red or blue where an equivalent three-channel device would barely generate a signal. Leaving the three-channel paradigm will increase the amount of available light regardless of whether the sensor is a CCD, a PSI CMOS, or a BSI CMOS, allowing color identification in lower-light conditions. And as a two-light-channel array uses fewer colors to differentiate the same number of pixels, a two-light-channel system is less susceptible to noise than an equivalent three-channel system.

Humans perceive color by comparing brightness differences between the three cone receptors in the retina (red, green and blue). A two-channel system comprising one unfiltered channel and one filtered channel (with specific characteristics) can provide sufficient differentiation in the two data streams for a person's visual system to perceive full color image, and for a, image processing stack to create a full color image for a display.

The systems and methods described herein further include techniques to define the light channels of an imaging system, to process the signals from the two channels, produce a color image, especially in low light conditions.

Accordingly, in one aspect the systems and methods described herein relate to generating color images using an array of photosensitive pixels configured to generate electrical signals in response to incident light from a scene. The array comprises two pluralities of pixels, the first sensitive only to light associated with a first light channel, the second sensitive only to light associated with a second light channel. Various disclosed embodiments can include an unfiltered channel. Various disclosed embodiments can include or a channel with only slight filtration (for example, a narrow band-blocking filter) that can be useful in producing a better quality color image in certain conditions. Pixels sensitive to a light channel generate an electrical signal only in response to incident light within the light channel. Pixels of the first plurality thus generate a first set of electrical signals in response to incident light within the first light channel, and pixels of the second plurality generate a second set of electrical signals in response to incident light within the second light channel. An image processor receives the first and second set of electrical signals and generates a full-color image by processing only signals generated by the first and second pluralities of photosensitive pixels of the array, thereby using only two light channels to generate a full-color image.

In another aspect, the systems and methods described herein relate to generating color images using an array of photosensitive elements and a color filter array (CFA). The array of photosensitive elements is configured to generate electrical signals in response to incident light from a scene. The CFA filters light from a scene into only two light channels, wherein a light channel is at least one band of wavelength of light, and may include more than one noncontiguous bands of wavelengths. The CFA is disposed in front of the array of photosensitive elements such that each element of the photosensitive array receives light within only one of the two light channels passed by the color filter array. An image processor connected to the array of photosensitive elements generates a full-color image based on the electrical signals generated by the array of photosensitive elements, thereby using only two light channels to generate a full-color image.

Various embodiments can include a CFA located in front of the photocathode of an image intensifier tube in a hybrid system, including where a monochrome digital sensor is used to digitize and record the intensifier's output. The sensor's image processing stack can be trained to recognize which part of the intensifier's phosphor screen's image are coming through one channel and which parts are coming through the second channel, and use that information to create a color image in like manner to how the channel information from a two-channel filtered sensor are used.

In another aspect, the systems and methods described herein relate to generating color images using an array of preselected photosensitive pixels configured to generate electrical signals in response to incident light from a scene. The pixels are preselected such that there are at least two pluralities of pixels. Each pixel in a plurality of pixels is sensitive to a single light channel, wherein a light channel is at least one band of wavelength of light, and may include more than one noncontiguous bands of wavelengths. Pixels sensitive to a light channel generate an electrical signal only in response to incident light within the light channel. The pixels are preselected such that, in a color space having axes corresponding to the light channels represented by the pixels, the distances between elements of a predetermined set of reference colors is no smaller than a predetermined threshold. An image processor receives a set of electrical signals from each plurality of pixels and generates a full-color image by processing the signals.

In certain implementations, the full-color image generated may allow a viewer to distinguish between various colors, including at least one of a set of primary colors, natural colors, and artificial colors. Illustrative examples of such implementations include full-color images in which a viewer may distinguish red, yellow, green, and blue, or between the color of healthy tissue and the color of diseased tissue, or between the color of foliage and the color of water.

In certain implementations, the image processor may be configured to generate full-color images of a scene having an ambient light intensity of less than about 0.2 lux at a rate of fifteen images per second.

In certain implementations, the image processor may be further configured to convert a full-color scene or image into an RGB image or other an image in another color format or using another color combination.

In certain implementations, each pixel of the first plurality of photosensitive pixels includes a color filter blocking light not associated with the first light channel. In some such implementations, each pixel of the second plurality of photosensitive pixels may not include a color filter.

One embodiment includes a method performed by an imaging device for generating a color image from a low-light scene. The method includes filtering light from the low-light scene by a two-channel color filter array to produce a first light channel having unfiltered light and a second light channel having light filtered by a first filter. The method includes receiving the first light channel and the second light channel by a radiation sensitive sensor. The method includes producing a first information channel and a second information channel by the radiation sensitive sensor, wherein the first information channel includes first brightness information corresponding to the first light channel and the second information channel includes second brightness information corresponding to the second light channel. The method includes receiving the first information channel and the second information channel by an image processor. The method includes assigning, by the image processor, the first brightness information to a first color channel. The method includes assigning, by the image processor, the second brightness information to second color channel. The method includes assembling, by the image processor, a full-color image stream from the first color channel and the second color channel. The method includes outputting the full-color image stream. In various embodiments, the first filter is a long wave pass filter, the first color channel is a red color channel, and the second color channel includes blue and green color channels. In various embodiments, the first filter is a short wave pass filter, the second color channel is a red color channel, and the first color channel includes blue and green color channels. Various embodiments include stretching, by the image processor, a histogram of the second brightness information so that a dynamic range of the histogram of the second brightness information is substantially matched to a dynamic range of the first brightness information.

Still other embodiments include a color imaging system comprising a two-channel color filter array, a radiation sensitive sensor, and an image processor, configured to perform processes as described herein. The radiation sensitive sensor can be a sensor that detects primarily visible-spectrum light wavelengths, and can be a sensor that also or alternatively detects radiation wavelengths outside of the visible spectrum. For example, a SWIR sensor (sensitive to the 0.9 to 1.7 micron wavelengths), using a two channel approach as disclosed herein, with a short wave pass filter can produce a color image where foliage, pavement, cars colors, sand and pavement are all rendered in distinct and repeatable colors, just as they would be with a visible light color camera. The radiation sensitive sensor can be a sensor that operates in any of the UV, visible, near IR, or IR ranges, or other ranges. A sensor as described herein can be implemented with or integral to a hybrid image intensifier/sensor device.

Certain implementations can include assigning the output of the two-channels to the color channels of the resulting image.

A color image may be created for display or recording by assigning the output of one light channel of the sensor to one color channel of a RGB display, and the output of the other light color channel of the sensor to the remaining two color channels of the display in substantially equal proportion.

Alternatively, a color image may be created for display by assigning the output of one light channel of the sensor to one color channel of a RGB display, and the output of the other light channel of the sensor to the remaining two color channels of the display in unequal proportion Alternatively, a color image may be created for display by assigning the output of one light channel of the sensor to one color channel of RGB display and selected proportions of the output of the other light channel of the sensor to each of the three RGB color channels of the display.

In certain implementations, the two-channel sensor is configured with unfiltered pixels and filtered pixels, when the filtration is a substantially short wave pass filter. For such a sensor with primarily visible light sensitivity, the output of the filtered channel can be assigned to the blue, green, or blue and green color channels of the output image, and the output of the unfiltered channel is assigned to the red color channel of the output image in order to produce a substantially lifelike image.

In another implementation, the two-channel sensor is configured with unfiltered pixels and filtered pixels, when the filtration is substantially a long wave pass filter. For such a sensor with primarily visible light sensitivity, the output of the filtered channel can be assigned to the red color channel of the output image, and the output of the unfiltered channel assigned to the green, blue, or blue and green channels of the output image in order to produce a substantially lifelike image.

In yet another implementation, the two-channel sensor whose sensitivity does not lie primarily in the visible spectrum, but rather in other ranges such as the UV or SWIR (midrange infrared) domain, is configured with unfiltered pixels and filtered pixels. The decision as to which color channels of the output image to assign the unfiltered and filtered channels to may be determined by noting which configuration produces the most effective differentiation of different materials of interest in the subject area. In some configurations of a device in accordance with the disclosed embodiments, the user can be given the option of actively switching between differing assignment of the output of the two sensor channels to the color channels of the output image in order to better differentiate materials, and thus objects, in the subject area.

For a sensor with substantially visible light sensitivity, where the filtration is a long wave pass filter, the output of the filtered channel can be assigned to the red color channel of the output image, and the output of the unfiltered channel assigned to the green, blue, or blue and green channels of the output image in order to produce an essentially lifelike image.

Certain implementations can include mixing outputs of the two-channels in low light conditions.

In very low light conditions near the limits of a sensor's ability to produce a color image, the output of the filtered channel may have a signal to noise ratio that is below the threshold of being able to be able to produce a good quality color image. In those cases, a reduced amount of the signal from the unfiltered channel—having a SNR above threshold due to being unfiltered—may be added to the output of the filtered channel in order boost the signal to noise ratio sufficiently to raise SNR above threshold and thus produce a color image, though at the cost of reduced color saturation to the resulting displayed image. In certain conditions where part of the subject area has sufficient brightness to produce a good color image, but other parts of the subject area are more shadowed or otherwise do not have enough brightness to produce a good color image, the output of the unfiltered channel can be added to the output of filtered channel sufficient to produce a color image of only in those less well lit areas in the overall image. The amount of output of the unfiltered channel to be locally added can be varied up to and including replacing the filtered channel's output on those pixels. In that case, shadowed areas will be monochrome, not in color, but parts of the subject area with sufficient brightness to produce a color image will still be in color and thus may provide important color information about the scene to the user.

In certain implementations, the first plurality of photosensitive pixels or the second plurality of photosensitive pixels may be sensitive to visible light, non-visible light, or both, where non-visible light may include infrared and ultraviolet radiation. In some such implementations, the first and the second pluralities of photosensitive pixels may have substantially the same sensitivity to wavelengths of non-visible light.

Various embodiments can include the use of "leaky filters." As used herein, a "leaky filter" refers to a filter that selectively passes certain wavelengths of light that might otherwise be blocked, such as a SWP filter that passes some longer wavelengths of light or a LWP filter that selectively passes some shorter wavelengths of light. Many visible light sensors, such as CMOS sensors and image intensifiers have sensitivity in both the visible and near-IR range. Some subject materials have greater reflectivity in the near-IR than in the visible spectrum. This can distort the color rendition of the output image of a two-channel compared to how a scene looks to the naked eye. For example, because foliage often strongly reflects near-IR light, with a two-channel system using a short wave pass filtered channel and an unfiltered channel where the split point for the SWP filter is 610 nm, and the output of the SWP cannel is assigned to the output's blue and green color channels and the output of the unfiltered channel is assigned to the output's red channel, foliage can look red. If the SWP filter is configured to also pass amounts of selected wavelengths in the near-IR, for example wavelengths >780 nm, the addition this signal from these wavelengths to the blue and green channels of the output image has the effect of desaturating the red appearance of foliage and making it appear more of a brown color to the viewer. In addition, the addition of the near-IR light to the SWP channel increases the brightness of that channel, thus reducing the brightness disparity between the two-channels and improving the SWP channel's signal to noise ratio.

Various embodiments can employ band blocking filters. In some configurations, in order to improve overall color balance of the output image and/or to modify the appearance of certain materials in the subject area, the SWP or LWP filter can be configured to have the transmission of certain wavelength bands reduced or blocked. For example in a two-channel CMOS system with one unfiltered and one LWP filtered channel, with the signal from the LWP filtered channel assigned to the output image's red color channel and the signal from the unfiltered channel assigned to the output image's blue and green color channels, the LWP filter could be configured to begin transmission at approximately 610 nm, then reduce the transmission starting at approximately 780 nm. This will improve the green color of foliage in the output image. This will improve the green color of foliage in the output image since the reflectivity of foliage increases at approximately 780 nm. If this increased reflectivity is only expressed in the red channel, the foliage will tend to look brownish or reddish. If the transmission of the LWP filter is reduced >780 nm, then the blue and green light from the unfiltered channel will not be as overwhelmed and the color rendering of the foliage improved.

In certain implementations, the image processor may be further configured to scale a signal generated by a first photosensitive pixel as a function of distance between the first photosensitive pixel and a photosensitive pixel generating a strong signal. Some such implementations may perform white balance for images with more than one light source.

Various embodiments can perform histogram stretching. If the filtered and unfiltered channels take in the same exposure, as would happen with a sensor comprised of filtered and unfiltered pixels, the filtered channel receives less light and thus the histogram of the filtered channel will be compressed compared to the histogram of the unfiltered channel. Therefore, in some implementations, the image processor can stretch the histogram of the output of the filtered channel using methods common in the art such that it better matches the brightness range of the unfiltered channel's histogram.

In another case, the ISP can note that in a certain area of the image, the difference in brightness values between the two channels' outputs lie within certain defined ranges or ratios, and based on that data, the ISP can reassign the RGB values to a different set of RGB values selected from a lookup table that been empirically derived from tests of the two-channel sensor's accuracy in rendering a set of test colors.

Disclosed embodiments can also use other image processing techniques. The two-channel image is assembled, in some cases, by assigning signals from the two channels to the red, blue, and green output pixels for the display image, thus creating an RGB image. As a result, the image processor can make use of common image processing algorithms that are used with standard RGB images for such tasks as auto white balance, dynamic range control and more.

If the output of one channel is assigned to the blue and green color channels, that assignment may be of equal amounts to both blue and green color channels, or in differing amounts to the blue and green color channels. For example, the image processor's auto white balance algorithm may adjust the balance between the blue and green color channels in order to better adjust the overall white balance of the image. In another case, the ratio between the blue and green channels' values may be set in a general calibration step for the sensor. In another case, the ISP can note that in a certain area of the image, the difference in brightness values between the two channels' outputs lie within certain defined ranges or ratios, and based on that data, the ISP can reassign the RGB values to a different set of RGB values selected from a lookup table that been empirically derived from tests of the two-channel sensor's accuracy in rendering a set of test colors.

The assembled two-channel image can be formatted as a standard RGB still image formats such as TIFF, JPEG, GIF, or PNG, or in video formats as, MPEG-4, DivX, MPEG-2, HEVC (H.265).

In certain implementations, the second plurality of photosensitive pixels may comprise a third and a fourth plurality of photosensitive pixels, wherein a pixel of the third plurality generates a weaker signal than a pixel of the fourth plurality in response to a substantially identical light input. Some such implementations may be used to record details of both brightly and dimly lit portions of a scene.

In certain implementations, a photosensitive pixel of the first plurality is placed at the light-input end of a photosensitive pixel of the second plurality. In some such implementations, a first signal and a second signal may be generated at each point of the pixel array.

In certain implementations, the photosensitive pixels associated with the first plurality and the photosensitive pixels associated with the second plurality are arranged in a substantially checkerboard pattern.

Disclosed embodiments include a method performed by an imaging device for generating a color image from a low-light scene. The method includes filtering light from the low-light scene by a two-channel color filter array to produce a first light channel having unfiltered light and a second light channel having light filtered by a first filter. The method includes receiving the first light channel and the second light channel by a radiation sensitive sensor. The method includes producing a first information channel and a second information channel by the radiation sensitive sensor, wherein the first information channel includes first brightness information corresponding to the first light channel and the second information channel includes second brightness information corresponding to the second light channel. The method includes receiving the first information channel and the second information channel by an image processor. The method includes assigning, by the image processor, the first brightness information to a first color channel. The method includes assigning, by the image processor, the second brightness information to second color channel. The method includes assembling, by the image processor, a full-color image stream from the first color channel and the second color channel. The method includes outputting the full-color image stream.

In various embodiments, the first filter is a long wave pass filter. In various embodiments, the first color channel is a red color channel. In various embodiments, the second color channel includes blue and green color channels. In various embodiments, the first filter is a short wave pass filter. In various embodiments, the second color channel is a red color channel. In various embodiments, the first color channel includes blue and green color channels. Various embodiments also include stretching, by the image processor, a histogram of the second brightness information so that a dynamic range of the histogram of the second brightness information is substantially matched to a dynamic range of the first brightness information. Various embodiments also include extracting a grayscale component from at least one of the color channels, the grayscale component comprising information that defines sharpness and resolution of the full-color image stream. In various embodiments, the first color channel comprises green-red color information, and the second color channel comprises blue-yellow color information, and the method also includes blurring the first color channel and the second color channel and not blurring the grayscale component. In various embodiments, the grayscale component is extracted only from the first light channel. In various embodiments, the imaging devices processes the first color channel and the second color channel and does not process a third color channel.

Disclosed embodiments include a color imaging system comprising a two-channel color filter array, a radiation sensitive sensor, and an image processor, configured to perform processes as described herein.

Disclosed embodiments include a method performed by an imaging device for generating a color image from a low-light scene. The method incudes filtering light from the low-light scene by a two-channel color filter array to produce a first light channel having light filtered by a first filter and a second light channel having unfiltered light. The method includes receiving the first light channel and the second light channel by a radiation sensitive sensor and producing a first information channel and a second information channel by the radiation sensitive sensor. The first information channel includes first brightness information corresponding to the first light channel and the second information channel includes second brightness information corresponding to the second light channel. The method includes receiving the first information channel and the second information channel by an image processor and assigning, by the image processor, the first brightness information to a first color channel. The method includes assigning, by the image processor, the second brightness information to second color channel, and processing, by the image processor, the first color channel and the second color channel to produce a full-color image stream. The method includes outputting the full-color image stream.

Disclosed embodiments include a color imaging system having a two-channel color filter array, a radiation sensitive sensor, and an image processor, wherein the color imaging system is configured to perform processes as described herein.

BRIEF DESCRIPTION OF THE DRAWINGS

The systems and methods described herein are set forth in the appended claims. However, for the purpose of explanation, several implementations are set forth in the following figures.

FIGS. 8-13 are views of exemplary color filter array patterns;

DETAILED DESCRIPTION

In the following description, numerous details are set forth for the purpose of explanation. However, one of ordinary skill in the art will realize that the implementations described herein may be practiced without the use of these specific details and that the implementations described herein may be modified, supplemented, or otherwise altered without departing from the scope of the inventions disclosed herein.

Figure 1:
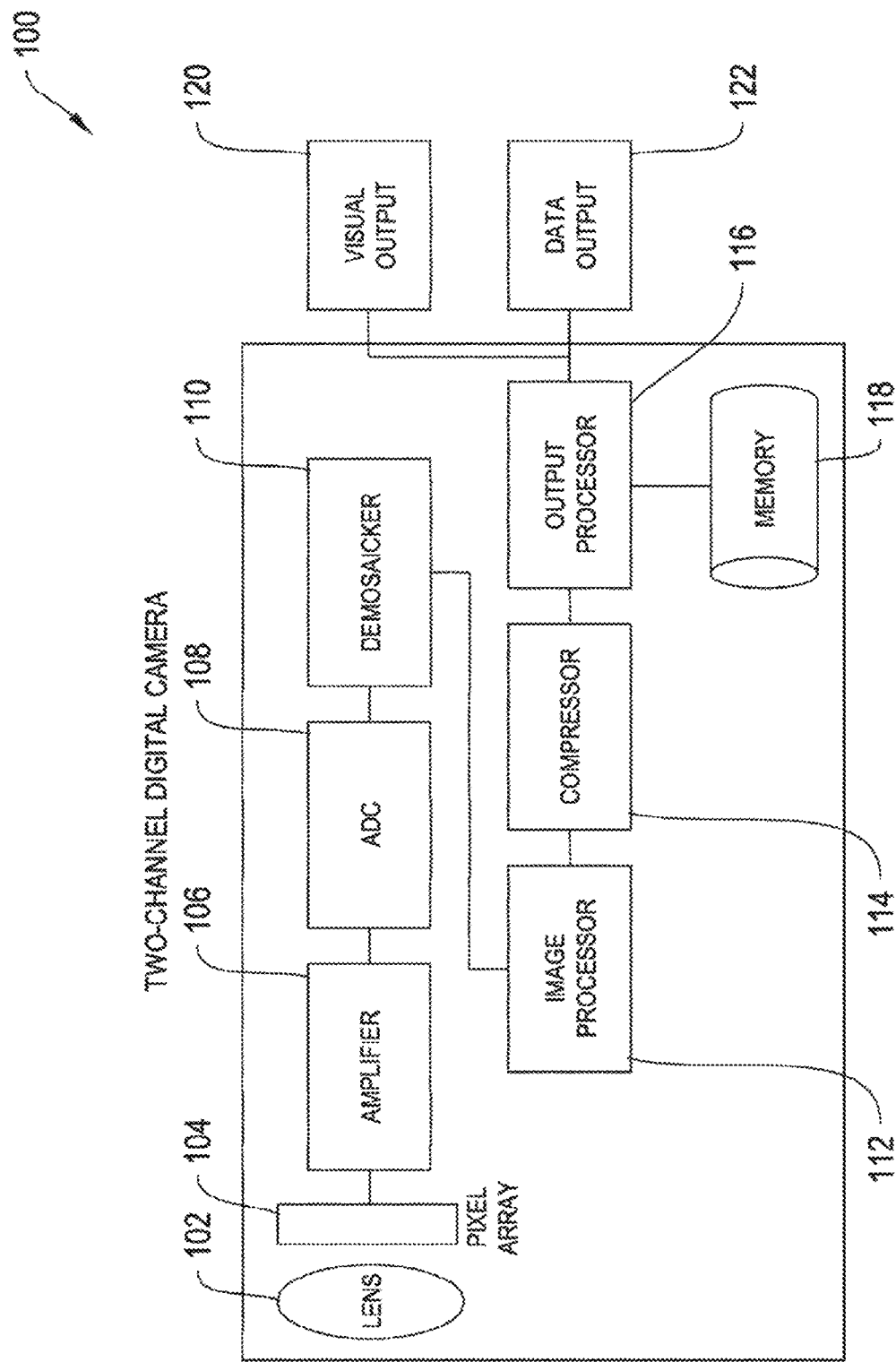
FIG. 1 is a block diagram of a digital camera using a two-light-channel sensor, according to an illustrative implementation.
Figure 2:
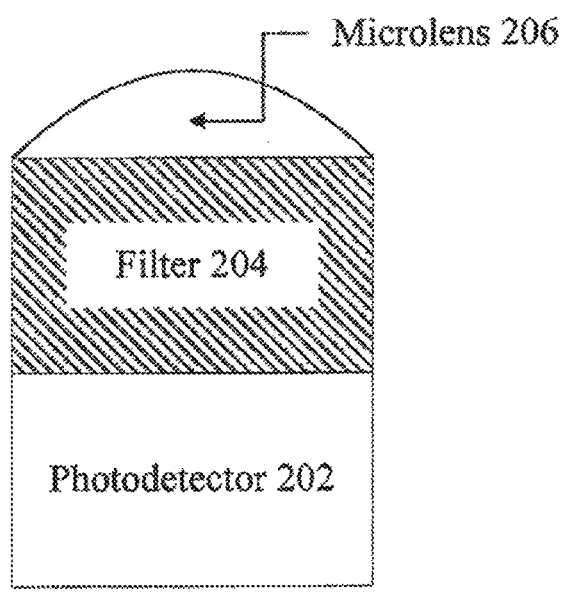
FIG. 2 is a block diagram of a photosensitive pixel, according to an illustrative implementation.
Figure 3:
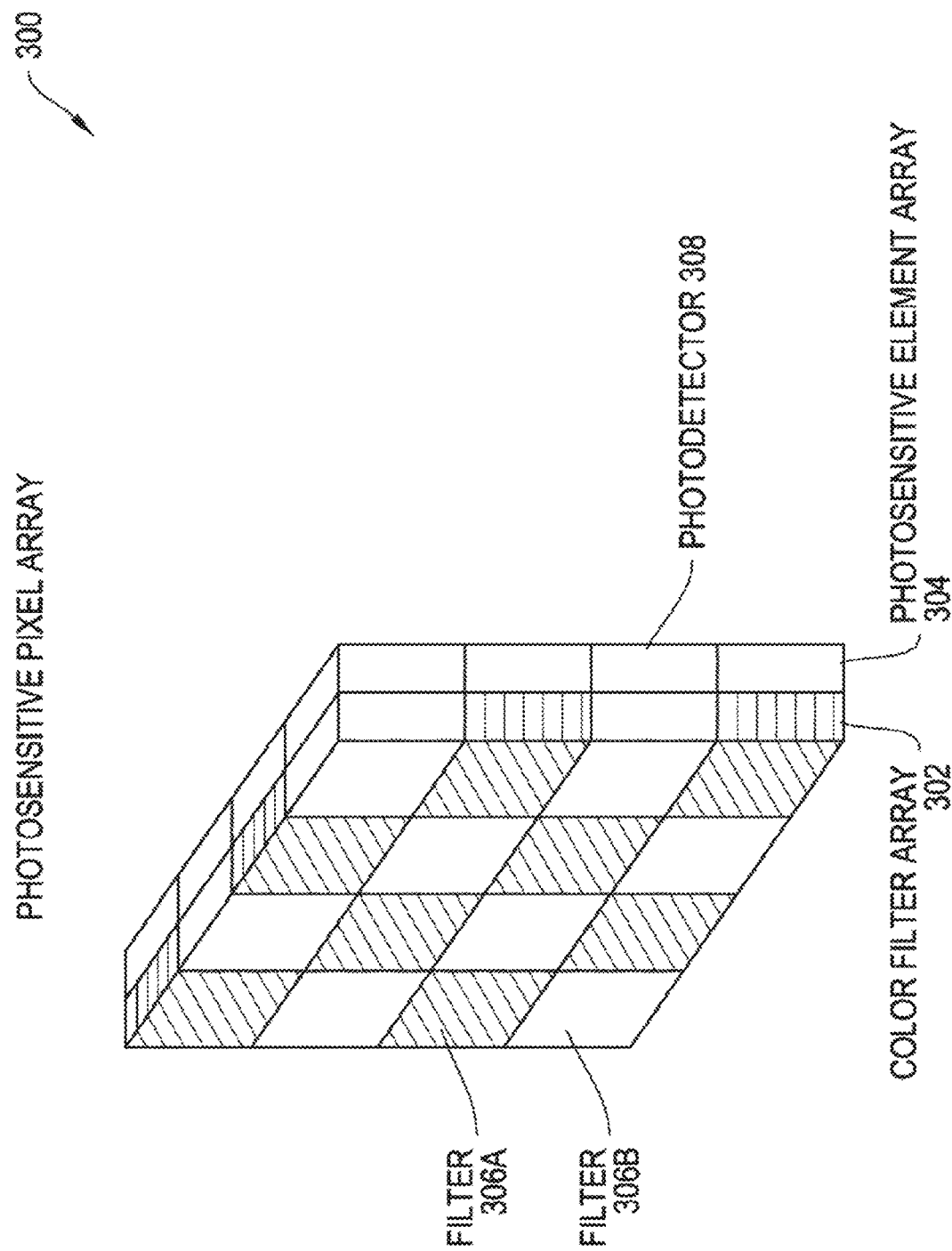
FIG. 3 is a block diagram of an array of photosensitive pixels, according to an illustrative implementation.
Figure 4:
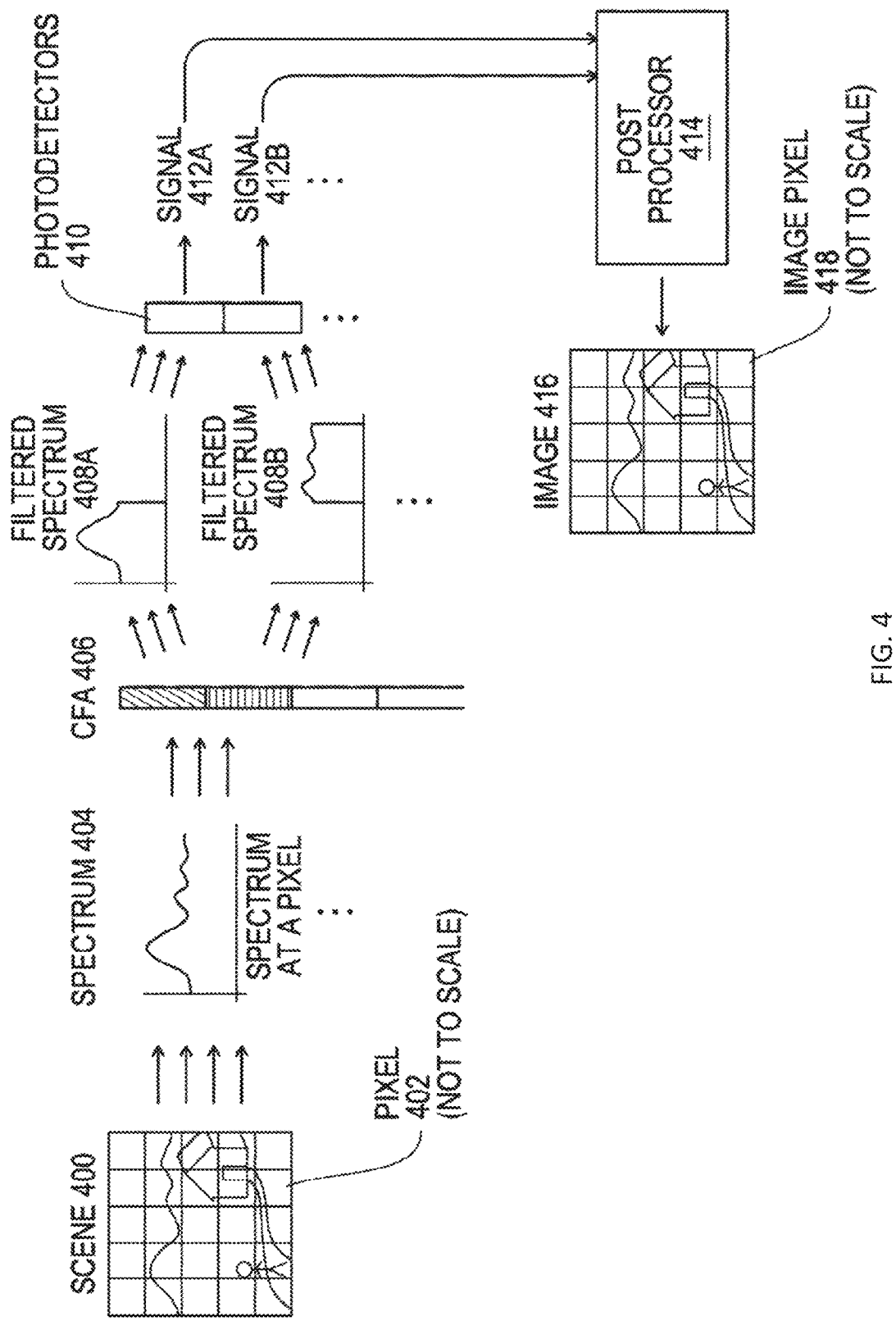
FIG. 4 depicts an illustrative implementation of an image generation process.
Figure 5:
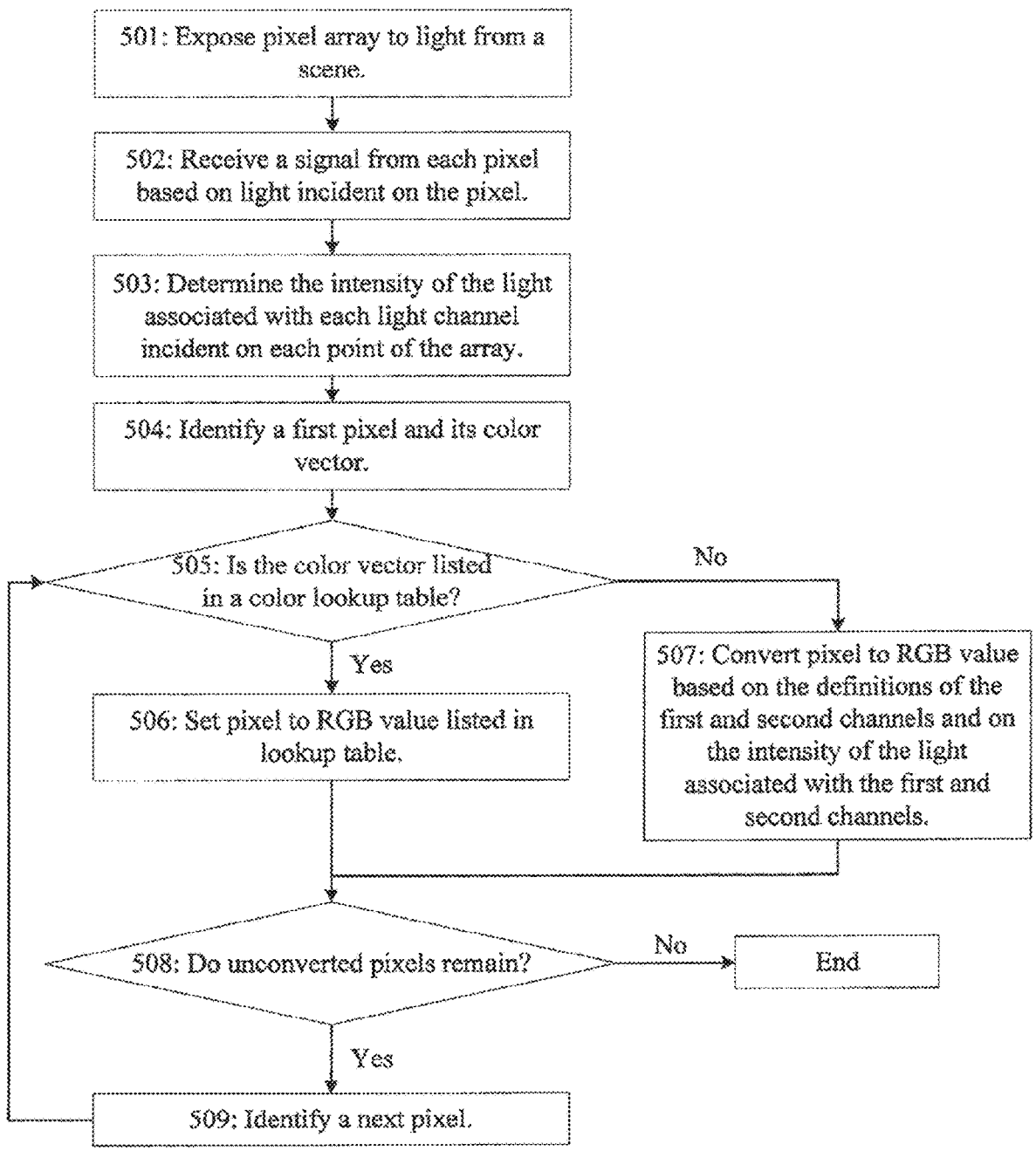
FIG. 5 is a flow chart of a process for generating a color image, according to an illustrative implementation.

The systems and methods described herein relate to generating color images using an array of photosensitive pixels. FIG. 1 provides an overview of an exemplary system used to generate such images using two light channels. FIG. 2 depicts a photosensitive pixel used within such a system, while FIG. 3 depicts an array of such pixels. FIG. 4 provides an overview of the image generation process, while FIG. 5 provides an exemplary method for generating a color image.

Figure 6:
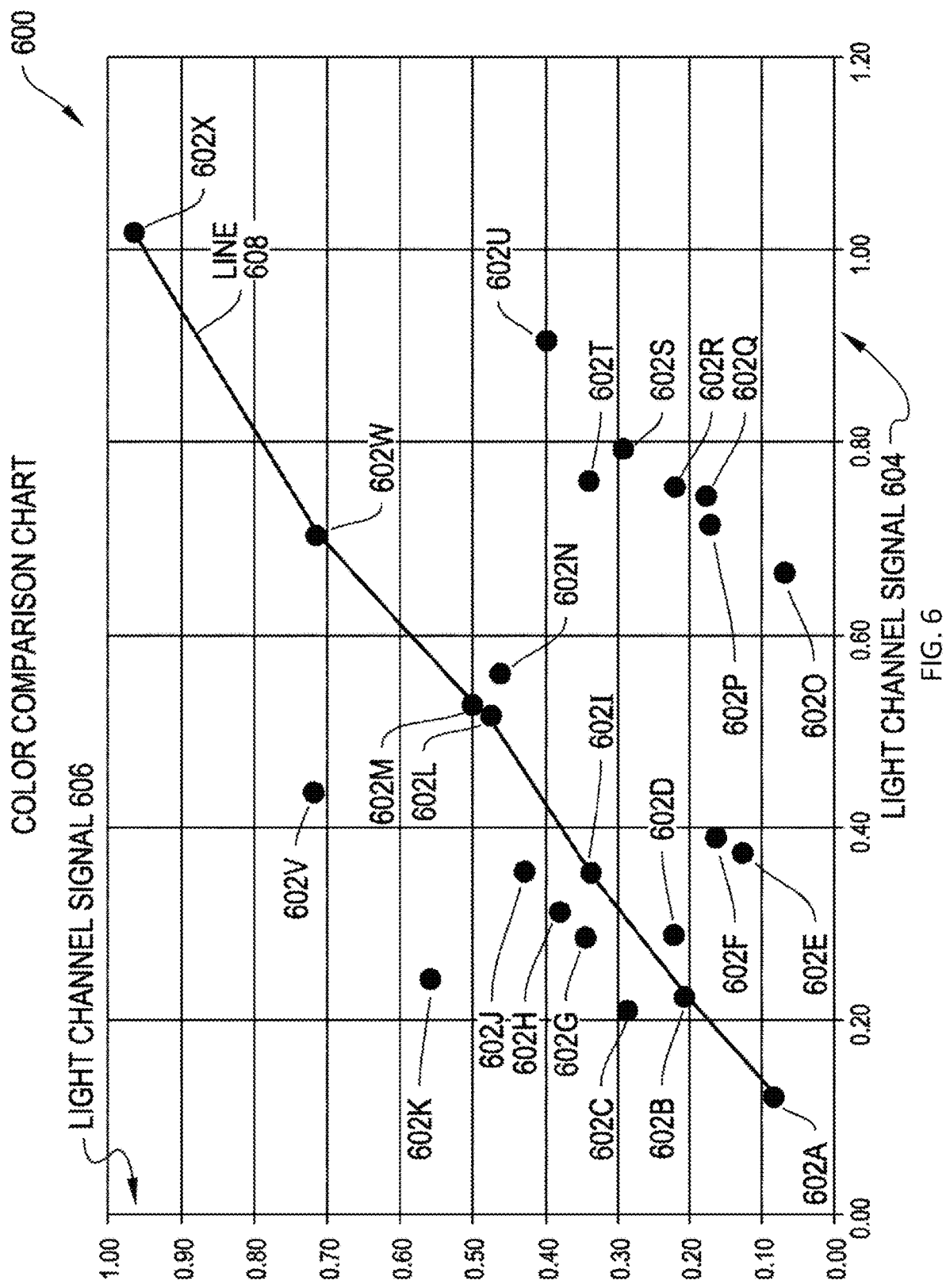
FIG. 6 is a graph illustrating the distinctions between colors in an exemplary two-light-channel imaging system.
Figure 7:
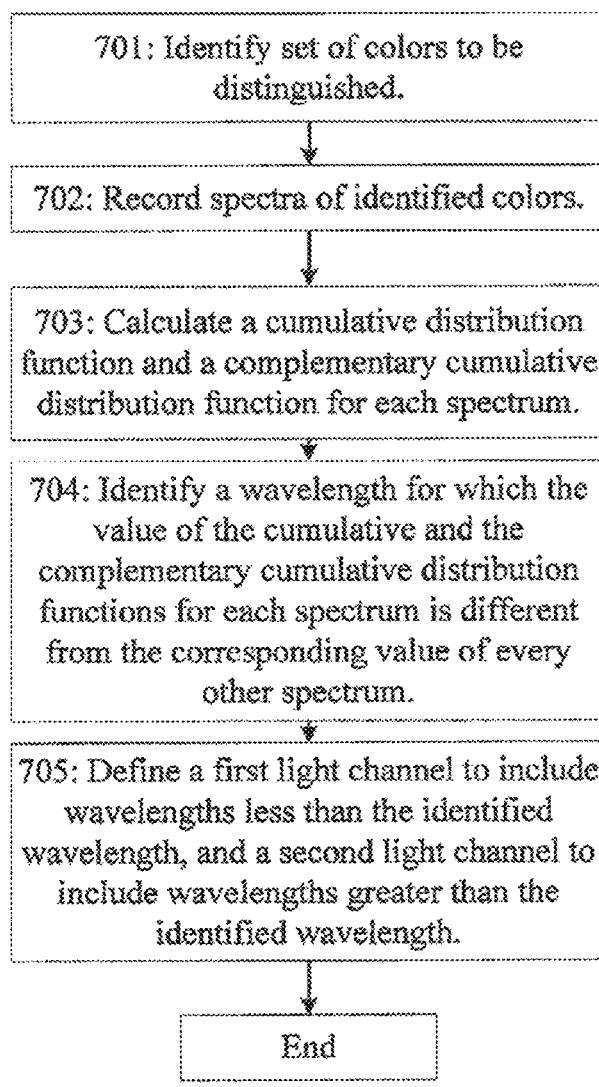
FIG. 7 is a flow chart of a process for selecting light channels for an imaging system, according to an illustrative implementation.
Figure 14:
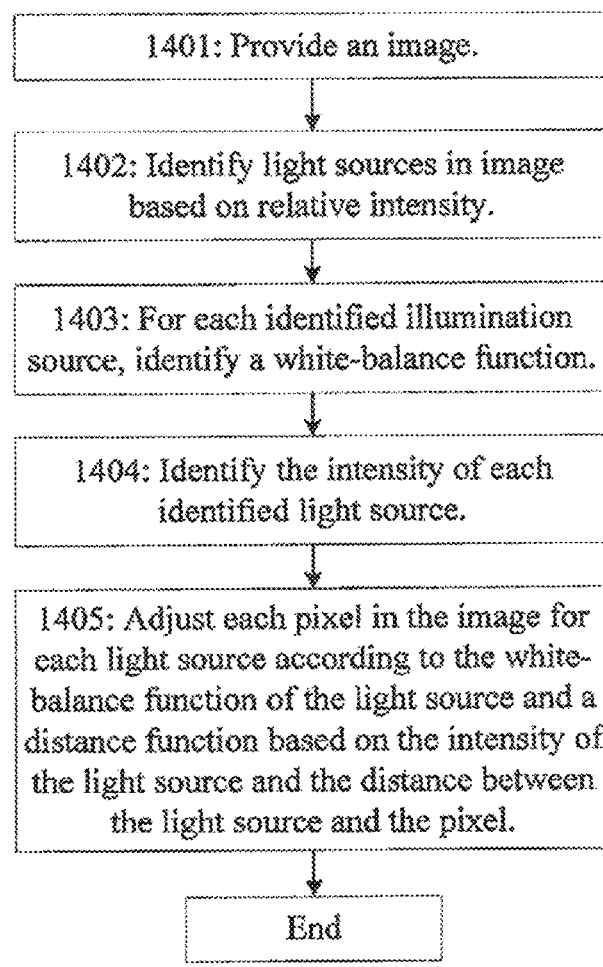
FIG. 14 is a flow chart of a process for correcting colors in an image based on illumination sources, according to an illustrative implementation.
Figure 15:
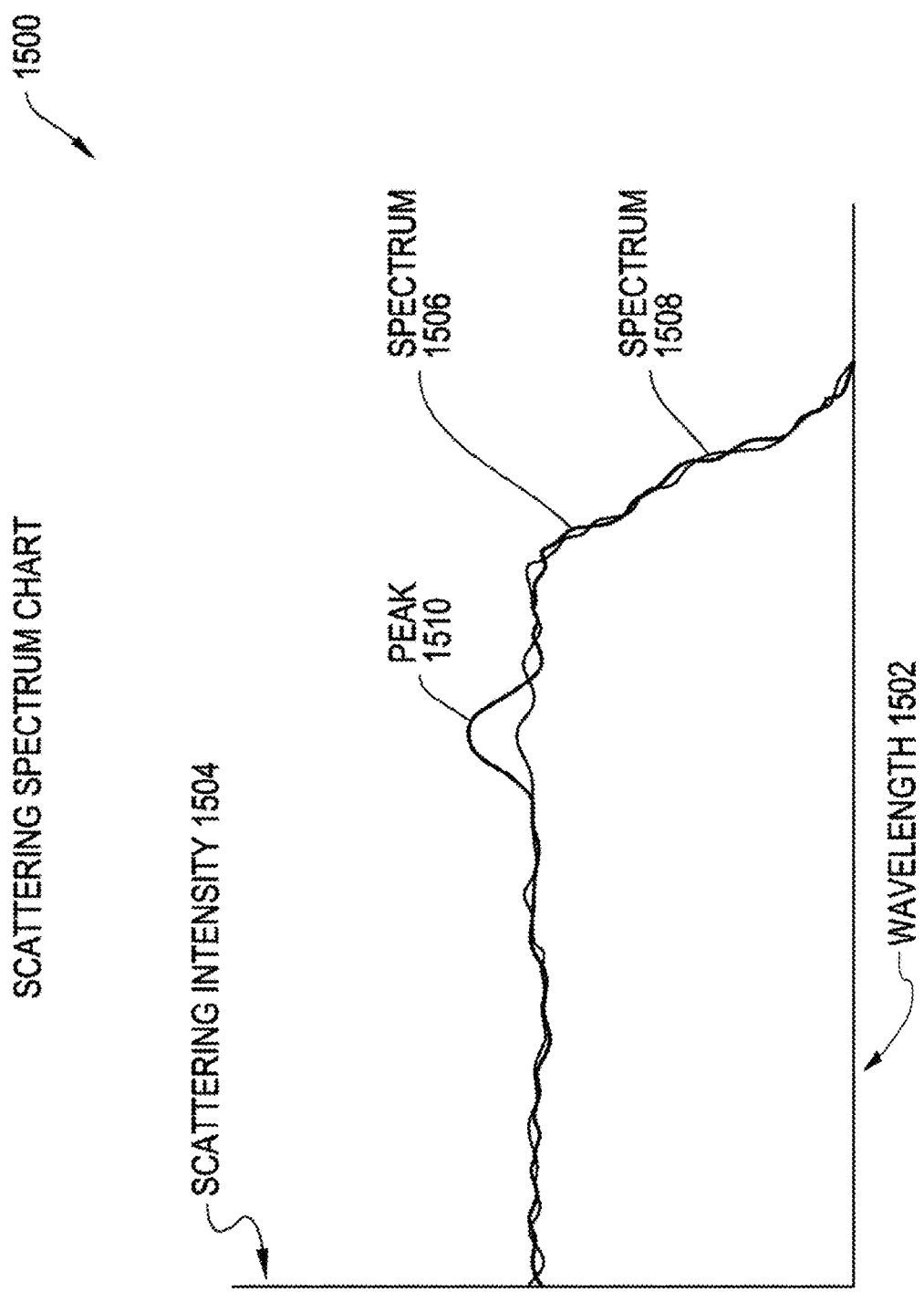
FIG. 15 is an illustrative graph depicting two colors with small distinguishing features.
Figure 16:
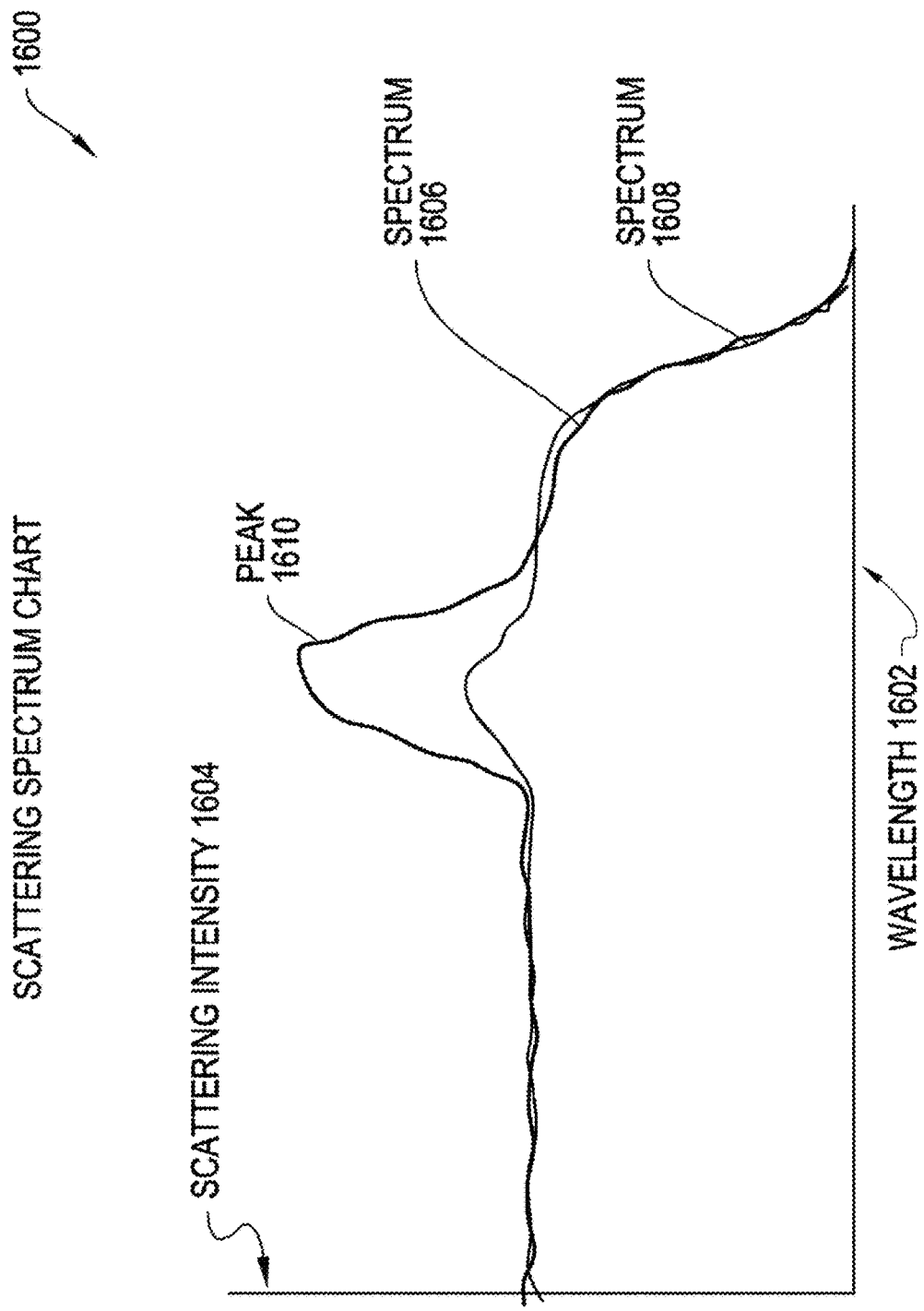
FIG. 16 is an illustrative graph depicting the two colors of FIG. 16 under differentiating illumination.
Figure 17:
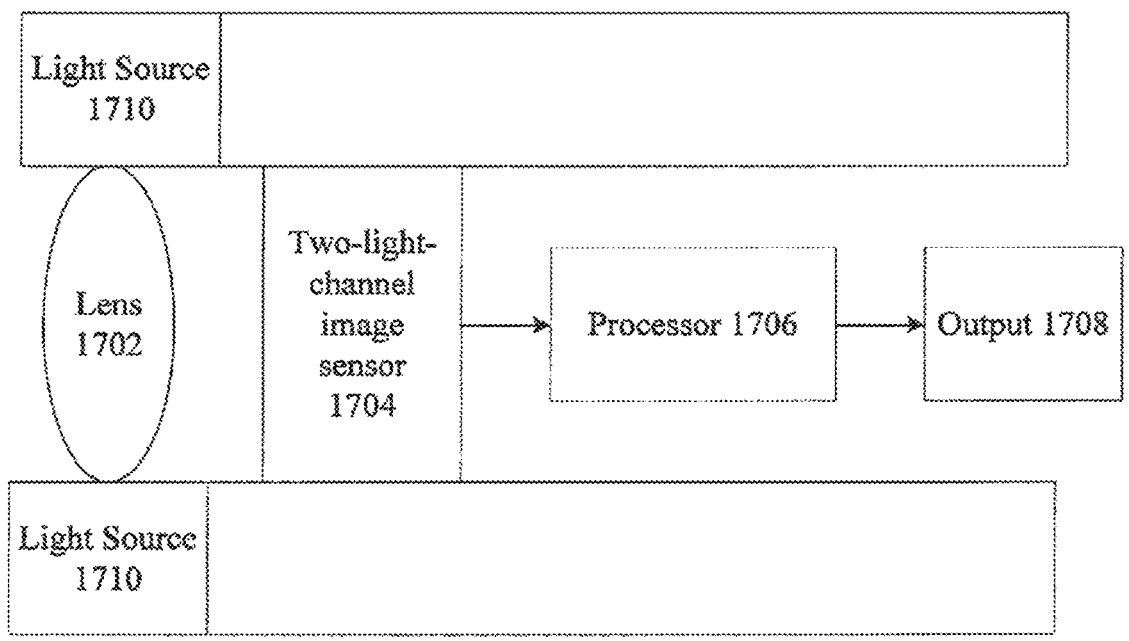
FIG. 17 is a block diagram of an endoscope using a two-light-channel sensor, according to an illustrative implementation.
Figure 18:
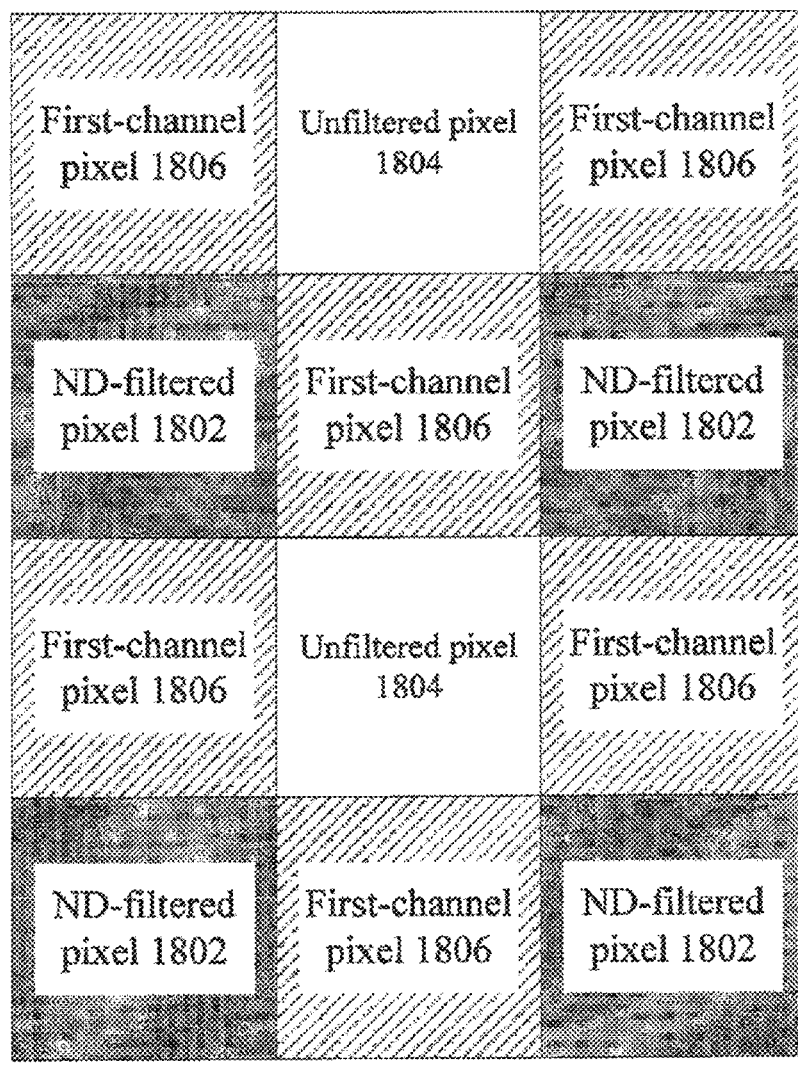
FIG. 18 is a view of a high dynamic range filter array, according to an illustrative implementation.
Figure 19:
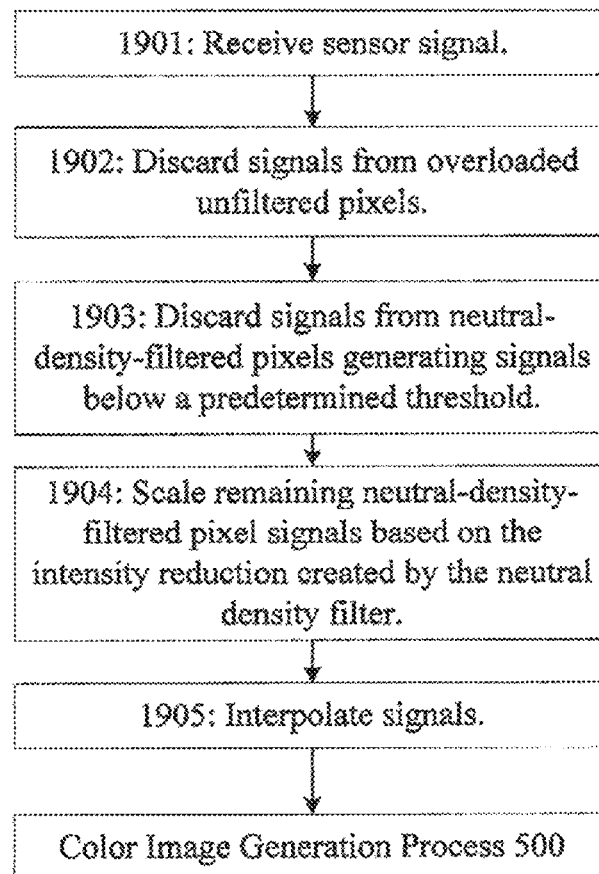
FIG. 19 is a flow chart of a process for high dynamic range imaging, according to an illustrative implementation.
Figure 20:
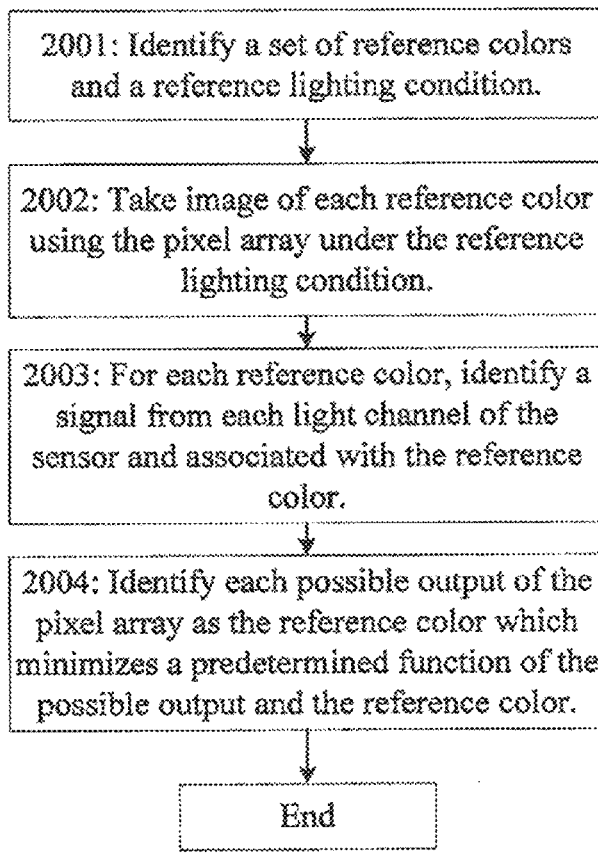
FIG. 20 is a flow chart of a process for generating a color lookup table, according to an illustrative implementation.
Figure 22:
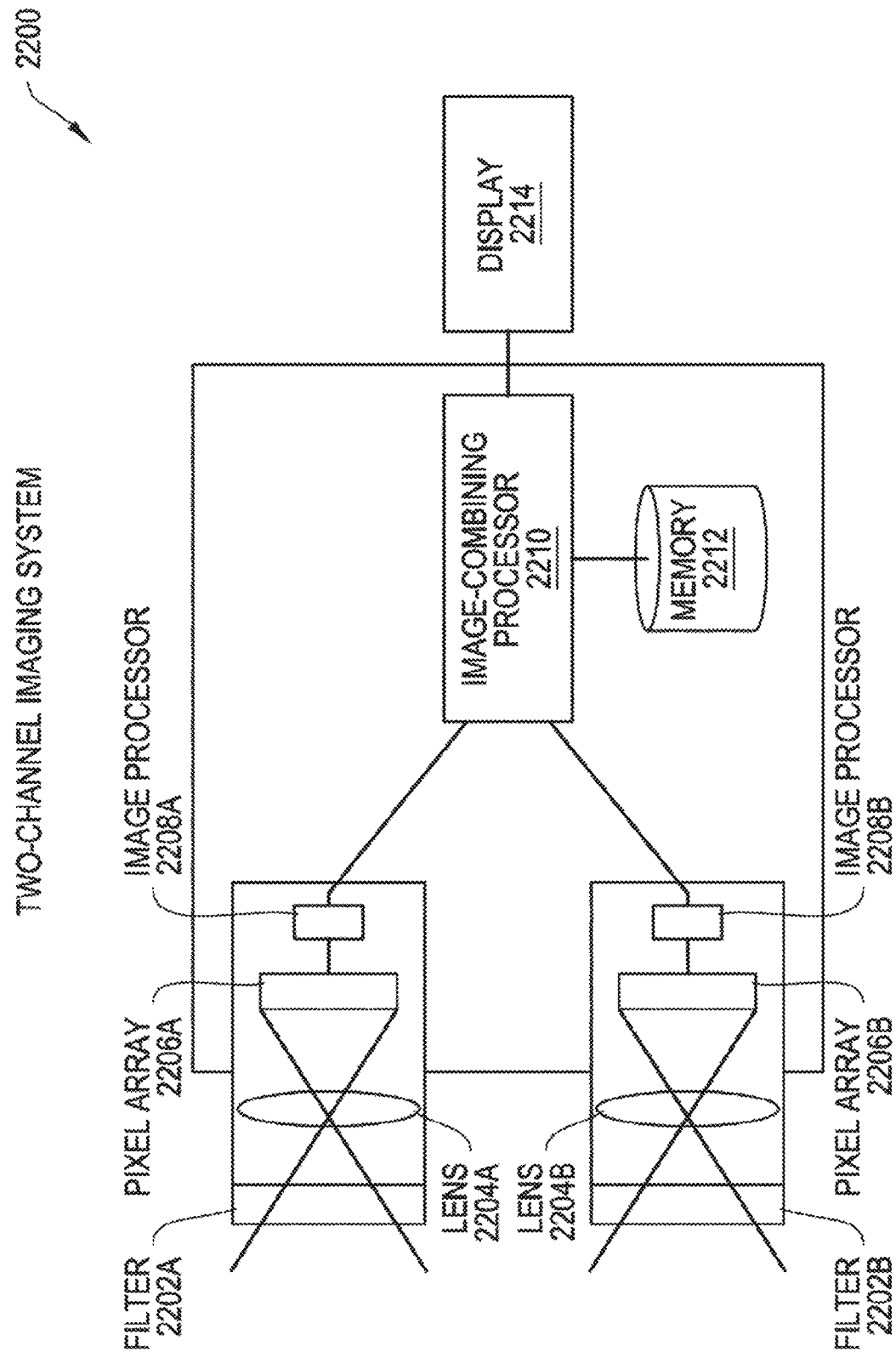
FIG. 22 is a block diagram of a digital camera using two parallel single-light-channel sensor arrays, according to an illustrative implementation.
Figure 23:
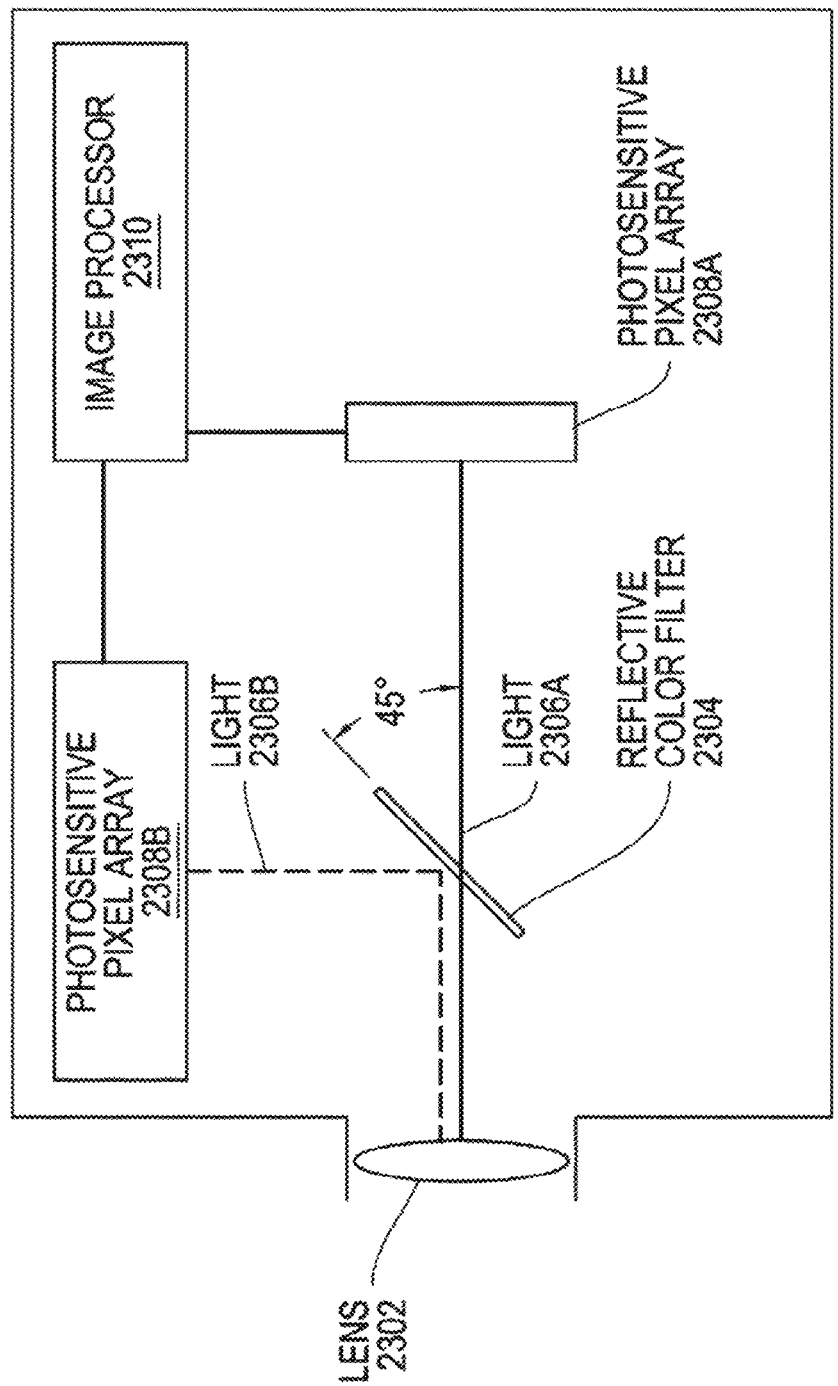
FIG. 23 is a block diagram of a digital camera using two single-light-channel sensors and a beam splitter, according to an illustrative implementation.

FIG. 6 is a graph illustrating how colors may be distinguished in a two-channel imaging system. FIG. 7 presents an exemplary method for selecting which light channels to use in an imaging system. FIG. 8-13 present a variety of exemplary color filter array patterns. FIG. 14 presents an exemplary white-balance method, a method for correcting recorded colors based on a source of illumination. FIG. 15 presents an illustrative graph depicting two colors with small distinguishing features, FIG. 16 illustrates the effect of differentiating illumination on the same two colors, and FIG. 17 presents an endoscope as an exemplary overview of a system combining a two-channel sensor and a differentiating illumination source. FIG. 18 illustrates a filter array that may be used for high dynamic range imaging, while FIG. 19 presents an exemplary method for high dynamic range imaging using the filter array of FIG. 18. FIG. 20 presents an exemplary method for generating a lookup table associating a digital sensor output with a reference color, and FIG. 21 applies lookup tables such as that generated by the method of FIG. 20 to automated color identification. FIGS. 22 and 23 depict multisensor two-channel imaging systems.

General System Description

FIG. 1 is an illustrative block diagram of a two-channel digital camera 100, which produces a color image of a scene using only two light channels. Camera 100 includes a lens 102 to focus light from a scene onto pixel array 104. Pixel array 104 may include only two varieties of pixels, as described in relation to FIG. 3, or may be sensitive to more than two light channels.

Signals generated by pixel array 104 in response to light are amplified by amplifier 106, and converted to digital signals by analog-to-digital converter (ADC) 108. Demosaicker 110 approximates signal values for points on pixel array 104 which do not generate a signal associated with a light channel. Image processor 112 may process the signals to reduce noise, scale the image, perform color correction, or otherwise process the raw image data. Compressor 114 may compress the raw image data into an image file, which output processor 116 may save to memory 118, output to visual output 120, output to data output 122, or some combination thereof.

FIG. 2 depicts a photosensitive pixel 200, which may be an element of the photosensitive pixel array 104 depicted in FIG. 1. As depicted, pixel 200 includes a photodetector 202, a filter 204, and a microlens 206. Photodetector 202 produces an electrical signal based on incident light, and may be a CCD pixel, a CMOS pixel, an organic photodetector, or some other suitable transducer.

Filter 204 is a selective wavelength filter that only allows light in a particular light channel to reach photodetector 202, and may include absorptive filters, reflective filters, or any suitable color filters. Pixel 200 will thus generate a signal based on the intensity of light that is passed by filter 204 and that photodetector 202 is sensitive to. Therefore, in certain implementations, photodetector 202 and filter 204 determine the light channel with which pixel 200 is associated. In certain implementations, a pixel 200 may not include a filter 204 or may include a filter 204 that does not selectively filter wavelengths. Such a pixel 200 will generate a signal based on the light to which photodetector 202 is sensitive, which may include a portion of visible light, all visible light, visible and infrared light, or some other light channel. Microlens 206 focuses incident light onto photodetector 202 to increase the amount of light available to the photosensitive region of the pixel 200. In certain implementations, pixel 200 may not include a microlens 206.

FIG. 3 depicts a photosensitive pixel array 300, such as the pixel array 104 depicted in FIG. 1. Pixel array 300 includes a color filter array (CFA) 302 and a photosensitive element array 304. CFA 302 is an array of filters 306A and 306B, and may be in a pattern such as those described in relation to FIGS. 8-13. Photosensitive element array 304 is an array of photodetectors 308, each of which is disposed behind a filter 306A or 306B. Each element of CFA 302 and photosensitive element array 304 thus form a photosensitive pixel, such as pixel 200 depicted in FIG. 2. Thus a photodetector 308 disposed behind a filter 306A will generate a signal indicating the intensity of light incident on the filter 306A and associated with a first light channel. Likewise, a photodetector 308 disposed behind a filter 306B will generate a signal indicating the intensity of light incident on the filter 306B and associated with a second light channel. In certain implementations, the CFA 302 includes only filter 306A and 306B arranged in any suitable pattern such that the array selectively filters light into only two light channels. In certain implementations, filters 306A or 306B may not selectively filter wavelengths of light, as described in relation to FIG. 2. Similarly, in certain implementations photosensitive element array 304 may be composed of more than one type of photodetector 308, and different types of photosensitive elements 308 may be sensitive to different light channels. In such implementations, photosensitive pixel array 300 may not include a CFA 302, and the different types of photodetectors 308 may be arranged in a pattern such as those described in relation to FIGS. 8-13. In certain implementations, photosensitive pixel array 300 may include more than two varieties of pixels.

Two-Light-Channel Imaging

FIG. 4 illustrates how light from a scene is converted to an image by a digital camera such as that described in relation to FIG. 1. Light from a scene 400 is incident on an array of pixels 402. The incident light has a spectrum 404 that may vary from between pixels 402 according to the variations in the light from the scene 400. For each pixel 402, the spectrum 404 is filtered by a CFA 406, such that each filter of CFA 406 filters out those parts of spectrum 404 which are not included in the light channel corresponding to the filter. In some implementations, a light channel may include two or more noncontiguous bands of wavelengths. In certain implementations, there may be more than two varieties of filters in CFA 406. Photodetectors 410 convert the resulting filtered spectra 408A and 408B to electrical signals 412A and 412B. In certain implementations, different photodetectors 410 may have different sensitivities to spectra, such that a photodetector 410 may generate the same signal in response to filtered spectra 408A as it would in response to spectrum 404. Such implementations may not include a CFA 406.

Signals 412A and 412B are provided to a post processor 414, which records the signals as an image 416 composed of image pixels 418. An image pixel 418 corresponds to a pixel 402, and may indicate the light channel associated with pixel 402 and the intensity of the signal generated by pixel 402. In certain implementations, post processor 414 may identify a color vector associated with each pixel 402. A color vector is an ordered set of numbers describing a color by the strength of the signal the color engenders in each of one or more light channels. As an illustrative example, a color displayed on a computer monitor may be described by the intensity of the red, green, and blue light used to generate the color. In a two-light-channel system, a color vector describing a color may represent a first-channel signal and a second-channel signal generated in response to the color. A color vector for the spectrum at a pixel 402 may be estimated by the signal generated by pixel 402 and by interpolating signals generated by one or more other pixels 402 that are sensitive to other light channels.

FIG. 5 is a flow chart representing a color image generation process 500. Referring to FIG. 1, color image generation process 500 begins with step 501, in which pixel array 104 is exposed to light from a scene, such as scene 400 of FIG. 4. As described in relation to FIG. 2, each pixel of pixel array 104 generates a signal (such as signal 412A or 412B of FIG. 4) as a function of the intensity of light incident on the pixel and the wavelengths to which the pixel is sensitive. In step 502, demosaicker 110 receives these generated signals, and in step 503 identifies a color vector for each pixel of pixel array 104. The intensity of light associated with a light channel to which a pixel is sensitive is indicated by the signal generated by the pixel. The intensity of light associated with a light channel to which a pixel is not sensitive may be estimated as a function of signals from other pixels that are sensitive to the light channel. Such a function may include nearest-neighbor interpolation, bilinear interpolation, or some other suitable demosaicing function. In certain implementations, the signals are not demosaicked, in which case a first-channel pixel is only associated with a first-channel signal, and a second-channel pixel is only associated with a second-channel signal. Step 504 identifies a starting pixel for interpretation and its associated color vector.

In step 505, image processor 112 determines whether the color vector for the pixel is listed in a color lookup table. A color lookup table records associations between color vectors and colors. Step 505 may include searching for an exact match for the color vector, searching for a match within a predetermined margin of the color vector, or searching for a match of the ratio between the elements of the color vector. In the latter case, the ratio between the elements of the color vector and the vector between the color vector and the entry in the lookup table may each provide color information, such as hue, brightness, or saturation. If the color vector is in the color table, step 506 defines the pixel as having the RGB value of the color indicated by the lookup table; otherwise, in step 507, image processor 112 translates the signals into an RGB value. Image processor 112 may translate the signals of a two-channel system into an RGB image by a predetermined formula based on the definitions of the two channels, by assigning the output of a first channel to a monitor's red output and the output of the second channel to the green and blue outputs, or some other suitable method. One illustrative example of a possible set of equations for translating signals from a two-channel imaging system into RGB values is:

$$red = 255*(0.19 + 0.84*channel\text{-}1 + 0.36*channel\text{-}2); \quad (1)$$

$$green = 255*(0.17 + 0.91*channel\text{-}1 + 0.17*channel\text{-}2); \quad (2)$$

$$blue = 255*(0.25 + 0.73*channel\text{-}1 - 0.48*channel\text{-}2), \quad (3)$$

In particular, the left-hand side of Equations 1, 2, and 3 respectively represent the red, green, and blue values used to generate output on a standard computer monitor. On the right-hand sides of Equations 1-3, "channel-1" represents the signal associated with the first channel and "channel-2" represents the signal associated with the second channel. Equations 1-3 are only example equations, and other equations may be applied or used to transform a two-channel output into an RGB or other output. Other equations may similarly be applied or used to transform outputs with more than two channels into two-channel, RGB, or other suitable outputs. In certain implementations, steps 506 and 507 may translate the two channel signals into a color space other than the RGB color space, such as the cyan-magenta-yellow-key (CMYK) color space or the hue-saturation-value (HSV) color space. Regardless of whether step 506 or 507 followed step 505, step 508 determines whether unconverted pixels remain.

If an unconverted pixel remains, step 509 identifies a next pixel for conversion, which may occur using a left-to-right, top-to-bottom pattern or any other suitable method for identifying an unconverted pixel, and color image generation process 500 returns to step 505. If no unconverted pixel remains, the process is complete. In certain implementations, the two channel signals are not translated at all, in which case steps 504 through 509 may be skipped. In certain implementations, color image generation process may be applied to a system with more than two light channels. FIG. 6 is a color comparison chart 600 showing the signals generated in a first and a second light channel by the colors 602A-X (collectively, colors 602) of the COLOR-CHECKER® Classic Color Rendition Chart. Each color 602 is represented by a dot on color comparison chart 600. The position of a color 602 along the light channel signal axis 604 represents the signal generated by the color 602 in a pixel associated with a first color channel, while the position of a color 602 along the light channel signal axis 606 represents the signal generated by the color 602 in a pixel associated with a second color channel. Line 608 is drawn between shades of gray as a guide to the eye, with the shades becoming lighter as the line moves towards the top right corner of color comparison chart 600. So long as an imaging system does not generate the same response in all of its color channels to two different colors, the two colors may be distinguished by the system.

As described in detail in relation to FIG. 7, the color channels of an imaging system may therefore be selected based on a set of colors the imaging system is meant to distinguish.

Light Channel Selection

FIG. 7 is a flow chart representing a light channel selection process 700 to identify light channels for a two-light-channel imaging system. Step 701 identifies a set of colors to be distinguished by the imaging system. The set of colors may include at least one of a set of primary colors, natural colors, and artificial colors. As an illustrative example, an imaging system used in a surveillance setting may be designed to distinguish between red, green, and blue cars, while an imaging system used in a medical setting may be designed to distinguish between healthy tissue and diseased tissue. Step 702 records the spectra associated with the identified colors, indicating the intensity of light associated with each color for each wavelength within a range of wavelengths.

The range of wavelengths may include a portion of visible light, all visible light, infrared light, visible and infrared light, or some other suitable combination of wavelengths. In certain implementations, the spectra may be multiplied at each wavelength by the sensitivity of a detector at that wavelength. As an illustrative example, if the imaging system will use CMOS pixels which generate a stronger signal in response to light with a 450 nm wavelength than light with a 680 nm wavelength, the intensity of the spectrum at 680 nm may be reduced relative to the intensity at 450 nm to reflect the smaller contribution of the 680 nm light to the signal generated by the CMOS pixels.

Step 703 calculates a cumulative distribution function and a complementary distribution function for each identified spectrum. A pixel associated with a light channel including all wavelengths up to and including a particular wavelength would respond to a reference color with a signal that is a function of the cumulative distribution function of the reference color spectrum at the particular wavelength. Similarly, a pixel associated with a light channel including all wavelengths greater than or equal to a particular wavelength would respond to a reference color with a signal that is a function of the complementary cumulative distribution function of the reference color spectrum at the particular wavelength. Therefore, step 704 identifies a wavelength at which no color of the set of colors to be distinguished will share both a value of the cumulative distribution function and a value of the complementary cumulative distribution function. Step 705 defines a first light channel to include wavelengths less than the identified wavelength, and a second light channel to include wavelengths greater than the identified wavelength. In certain implementations, step 705 may define a channel by choosing a filter from a set of predetermined filters on the basis of which filter most exactly filters out wavelengths above or below the identified wavelength. In certain implementations, pixels created to generate signals associated with the identified light channels are tested to determine that the colors are distinguished as intended, and if they are not process 700 returns to step 704 and identifies an alternate wavelength.

In certain implementations, light channel selection process 700 may be applied to identify n light channels, where n is an integer greater than two. In such implementations, process 700 may identify a set of n−1 wavelengths for each spectrum recorded in step 702 such that the cumulative distribution function at the first identified wavelength is 1/n of the cumulative distribution function at the end of the spectrum, and that each further identified wavelength represents an additional 1/n of the cumulative distribution function at the end of the spectrum. Process 700 may further take the median of each identified point for each of the recorded spectra, and assign light channels based on such medians. In such an implementation, if the resulting light channels do not distinguish between each color in the set of colors to be distinguished, the process may further identify the two contiguous light channels with the greatest number of colors having an identical response to each of the contiguous light channels, and redefine the light channels such that their boundary is located halfway between the current wavelength and the next closest identified wavelength for a color. In certain implementations, light channels may be selected such that each is equally sensitive to nonvisible light, such as infrared light. Such implementations may increase the light available to generate a signal while still allowing distinctions between visible colors.

Pixel Array Patterns

Figure 8:
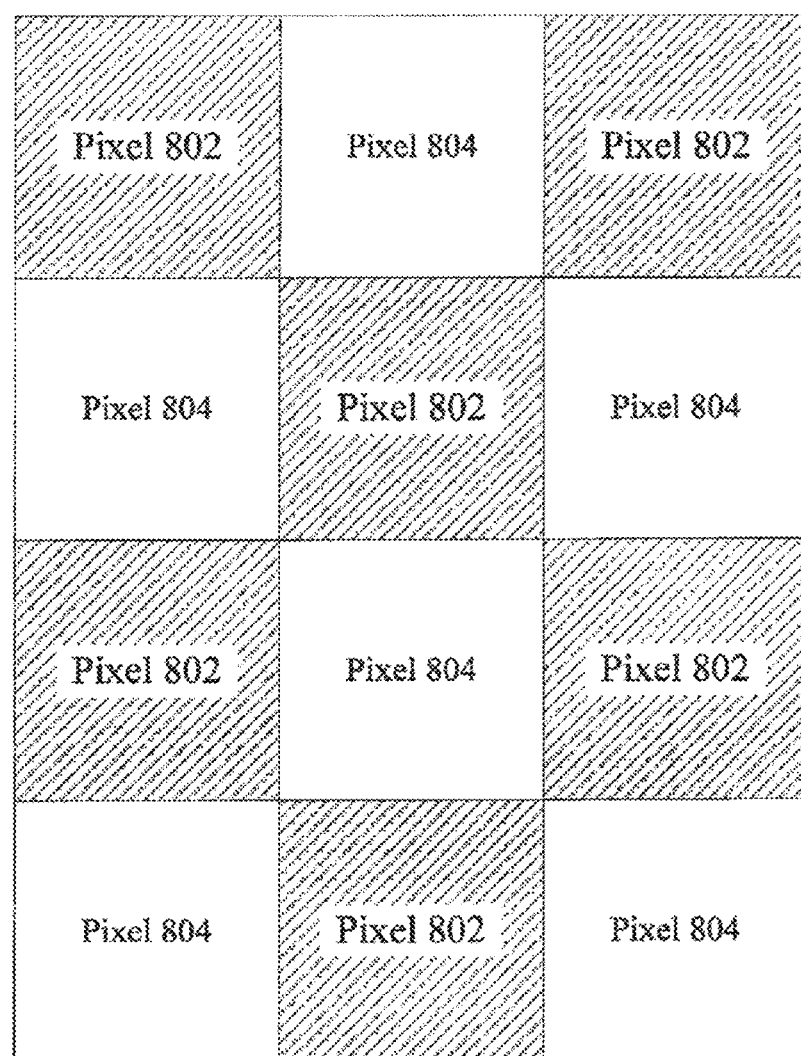
Figure 9:
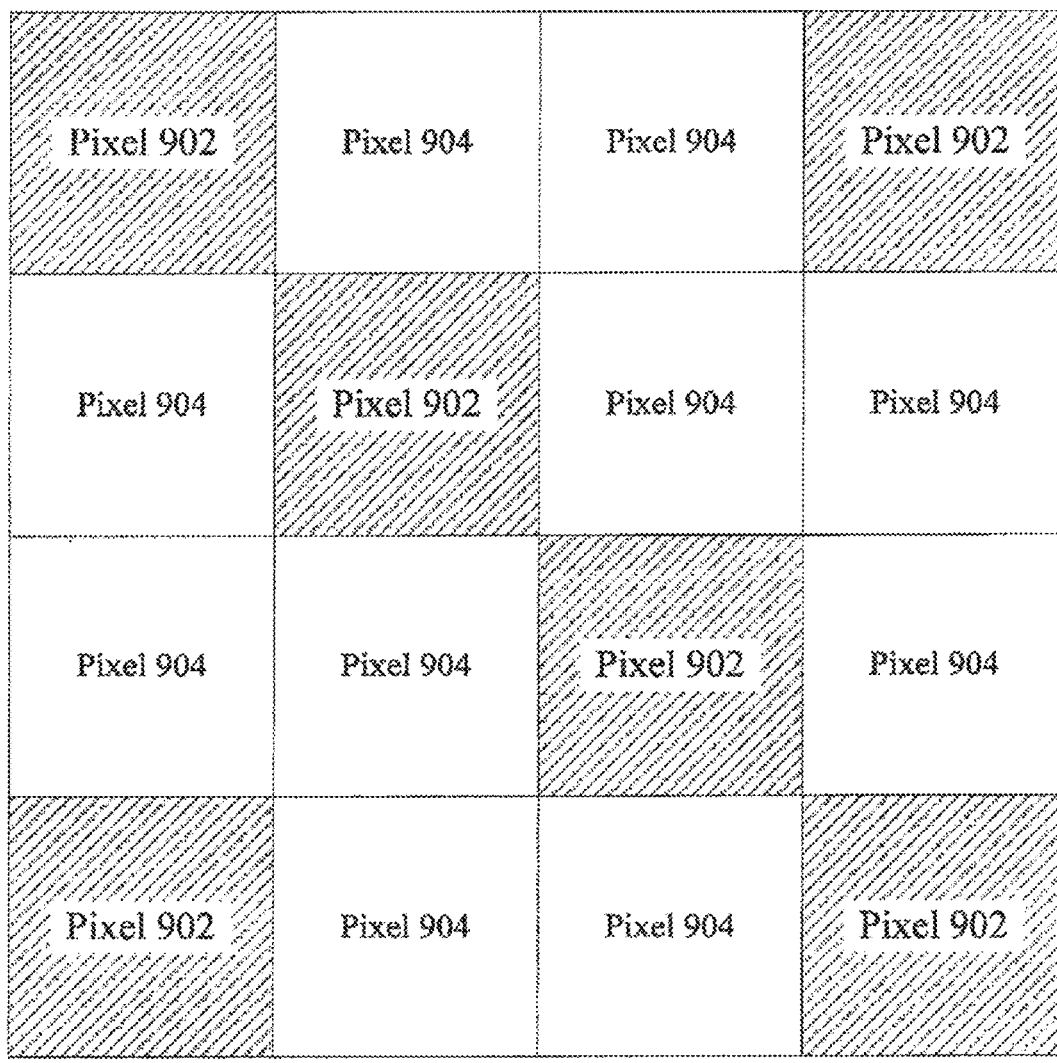

FIGS. 8-13 represent a variety of possible pixel patterns for a two-light-channel photosensitive pixel array such as that depicted in FIG. 3. As depicted, each pixel pattern includes two types of pixels, with a first type associated with a first light channel and a second type associated with a second light channel. FIG. 8 depicts a pixel pattern 800 including a checkerboard pattern of pixels 802 and 804. FIG. 9 depicts a pixel pattern 900 including a pattern of diagonal stripes, with two rows of pixels 902 for every row of pixels 904. FIG. 10 depicts a pixel pattern 1000 in which two pixels 1002 are placed on a diagonal line and two off of the diagonal line, with pixels 1004 filling in the rest of the pattern. FIG. 11 depicts a pixel pattern 1100 partly comprised of a checkerboard pattern and partly composed of an occasional pixel 1102 interspersed among a number of pixels 1104. FIG. 12 depicts a pixel pattern 1200 half-comprised of horizontal rows of pixels 1204, with the other half comprised of two horizontal rows, one comprised mainly of pixels 1202, the other comprised mainly of pixels 1204, and each row mirroring the other. FIG. 13 depicts a pixel pattern 1300 comprising a square of pixels 1302 pixels surrounded by a border of pixels 1304. The patterns depicted in FIGS. 8-13 are not an exhaustive collection of the possible two-light-channel pixel array patterns, but are meant to demonstrate the wide range of possible patterns. Accordingly, patterns for a two-channel pixel array may be selected as desired and in any combination and arrangement without departing from the scope of the systems and methods described herein.

In FIGS. 8-13, and as described in relation to FIGS. 2 and 3, pixels may be associated with a light channel by the sensitivity of a photodetector, by a color filter placed in front of the photodetector, or by some other suitable method. In certain implementations, both sets of pixels use the same photodetectors, but one set includes a color filter. In such implementations, the color filters may define a first light channel, and a signal associated with the first channel may be subtracted from a signal associated with an unfiltered pixel to generate a signal corresponding to those parts of the spectrum not included in the first light channel.

In the embodiments discussed herein, in some implementations, an "unfiltered" channel refers to a channel that is substantially unfiltered in the spectrum or wavelengths being processed, but that may have some specific filtering used to distinguish targeted elements in the scene. This can include received light that is entirely unfiltered and can include light that is filtered in selected spectrums but that the overall transmission of that channel includes the majority of light wavelengths without filtering.

One advantage of limited filtration on the "unfiltered channel" is to block the light from a specific laser, LED, or characteristic of a material to that the target element can be more effectively distinguished in the resulting image. Limited, selective filtering then allows the device to use color to identify the target element at that wavelength. For example, if laser wavelength passes through both the unfiltered and the filtered channel, it will appear white; if the laser wavelength passes through only a shortwave filter, it will look green/blue; and if the laser wavelength passes through only a LWP filter, it will look red. So, with tailored band block or band pass, a device as disclosed can make a certain lasers, such as a certain wavelength near-IR laser, appear as a certain color for rapid identification by a viewer.

As another example of the benefits of limited, selective filtering on the "unfiltered" channel described herein, there may be a subtle spectral difference between a camouflage material and a natural background where the two look the same to the naked eye or a color sensor, but by putting a band block or a band pass in one of the two channels, a device as disclosed can produce a difference in how the color of the camo material is rendered, allowing the viewer to easily differentiate the material from the background. Likewise, for example, there may be a subtle spectral difference between a healthy human tissue and a diseased tissue, where the two look the same to the naked eye or a color sensor, but by putting a band block or a band pass in one of the two channels, a device as disclosed can produce a difference in how the color of the diseased tissue is rendered, allowing the viewer to easily differentiate the healthy from the diseased tissue.

The color of any object in the produced image, in various embodiments, is created by the mix of red light from one channel and the blue and green light from the second channel. Thus, the perceived color in the image of a specific laser, LED or other light source may be adjusted by including a narrow band blocking filter in the "unfiltered channel" selected to block the wavelength of that light source of interest. In a like manner, a narrow band pass can be used in the blocking band of the filtered channel. This will change the mix of color that render the color of the light source and thus can be an aid in identification of the characteristics of that light source. Note that, in some cases depending on the characteristics of the light source, the spectrum range of the device sensor, and any selective filtering, the colors produced to a viewer may not be "true" colors but instead are colored for easy identification and distinction of various elements in the scene.

Local White Balance

FIG. 14 is a flow chart representing local white balance process 1400. Different light sources may generate different spectra, which in turn may affect the appearance of colors by changing the wavelengths of light available to scatter. As such, scaling colors in an image based on the illumination source of the image may improve the accuracy of color reproduction. Referring to FIG. 1, in step 1401 an image is provided to output processor 116. In step 1402, output processor 116 identifies light sources in the image based on their intensity, such as by identifying regions of the image with signals stronger than a predetermined threshold, identifying regions of the image with signals stronger than other areas of the image, or by some other suitable identifying feature.

Output processor 116 identifies a white-balance function for each light source in step 1403, such as by identifying a constant by which to multiple one or more light channel signals to meet an assumption that a light source appear to be white, by identifying the light source as matching one of a set of predetermined light source profiles with preestablished white balance functions, or by some other suitable method for establishing a white-balance function. Output processor 116 further identifies the intensity of each identified light source in step 1404. In certain implementations, the user may provide information regarding a light source, such as by selecting a light source within an image, by indicating a type, intensity, and location of a light source not pictured in the image, by taking a separate image of a light source and indicating its position relative to the photographer and scene, or by some other method of providing light source information.

Finally, in step 1405, output processor 116 adjusts each pixel in the image according to the identified light sources. The signals associated with each pixel are scaled based on both the identified white-balance function for each light source and a function of the distance between the light source and the pixel being adjusted. The function of the distance may be a Gaussian function, a cubic function, or some other suitable function to describe the extent to which a light source will influence a color at a distance. The distance may be measured by the number of pixels between the light source and the pixel being adjusted, by a calculation based on the intensity of light associated with the light source and the intensity of light associated with the pixel, by distance data provided by the user, generated through an autofocus system, or inferred from the image, or by some other suitable method for identifying a distance between the light source and a location in the image.

Selective Illumination for Color Differentiation

FIGS. 15 and 16 illustrate how different illumination sources can clarify the differences between colors. In FIG. 15, scattering spectrum chart 1500 presents wavelength 1502 along the x-axis and scattering intensity 1504 along the y-axis. Spectrum 1506 has a small peak 1510 which distinguishes it from spectrum 1508, but as the difference is small an imaging system may not reliably distinguish the two spectra. But illumination designed to heighten peak 1510 may change the situation to resemble that depicted in FIG. 16. In scattering spectrum chart 1600, wavelength 1602 is presented along the x-axis and scattering intensity 1604 along the y-axis. Spectrum 1606 corresponds to spectrum 1506, but with additional illumination to heighten peak 1610 as shown, heightening the distinction between spectra 1606 and 1608.

FIG. 17 is a block diagram of an endoscope 1700. Endoscope 1700 includes a lens 1702 to focus a scene onto a two-channel image sensor 1704 like pixel array 104 of FIG. 1. Two-channel image sensor 1704 generates electrical signals based on incident light from the scene, which processor 1706 converts to an image as described in relation to FIG. 5. The image generated is transmitted to output 1708, which may include a display, a computer memory, or some other suitable image output. Endoscope 1700 may also include a light source 1710, which may serve to highlight a spectral difference between healthy and diseased tissue as depicted in FIGS. 15 and 16.

High Dynamic Range (HOR) Imaging

FIG. 18 depicts a photosensitive pixel array 1800, similar to the pixel array 104 depicted in FIG. 1. Pixel array 1800 is designed to capture details of a scene containing both bright and dark elements in a single photograph. Rather than combining a short- and a long-exposure photograph of a scene, risking blur caused by an element of the scene moving before the second image is captured, pixel array 1800 uses neutral density (ND) filters to effectively capture a short- and a long-exposure image at the same time. Neutral density (ND) filters evenly filter the full visible spectrum of light, and in some implementations may evenly filter other wavelength bands as well. Thus, an ND-filtered pixel 1802 can record light intensities that would overload an unfiltered pixel 1804 without affecting color determinations. At the same time, unfiltered pixels 1804 maintain a sensitivity to light intensities that would be below a response threshold for ND-filtered pixels 1802. In certain implementations, an ND-filtered pixel 1802 may not include an ND filter, but rather a photodetector which generates an electrical signal which is weaker than but uniformly proportional to the response of an unfiltered pixel 1804 at every wavelength. Pixel array 1800 also includes first-channel pixels 1806, which may be used in conjunction with the ND-filtered pixels 1802 and the unfiltered pixels 1804 to identify colors as described in relation to FIGS. 8-13. In certain implementations, the light channel represented by ND-filtered pixels 1802 and unfiltered pixels 1804 may not include every wavelength included in the light channel associated with first-channel pixels 1806. In certain implementations, pixel array 1800 may feature a different pattern of pixels, whether in relation to the pattern of elements with color filters and elements without, as depicted in FIGS. 8-13, or in relation between elements with and without a ND filter. In certain implementations, pixel array 1800 may include more than two light channels.

FIG. 19 is a flow chart representing a high dynamic range imaging process 1900. Referring to FIGS. 1 and 18, the process begins when demosaicker 110 receives a signal from a photosensitive pixel array 1800. In step 1902, demosaicker 110 discards signals from unfiltered pixels 1804 that indicate an overload, as the light intensity at such pixels was too great to accurately record. Similarly, in step 1903, demosaicker 110 discards signals that are below a predetermined threshold and generated by ND-filtered pixels 1802, as the light intensity at such pixels was too low to be accurately recorded. Then, in step 1904, demosaicker 110 scales the signals from ND-filtered pixels 1802 based on the ND filter applied: if an ND-filtered pixel 1802 produces the same signal as an unfiltered pixel 1804, the intensity of light at the ND-filtered pixel 1802 must be proportionally greater than the intensity of light at the unfiltered pixel 1804. In step 1905, demosaicker 110 determines a signal for both the first and the second channel for each pixel of pixel array 1800. As described in relation to FIG. 5, a signal generated by a pixel is used when possible, and a signal is estimated based on the signal from surrounding pixels when not, including a signal for both channels in cases where the signal from a pixel was discarded. Once signals for both channels have been identified for each pixel of pixel array 1800, a color image may be generated using color image generation process 500. In certain implementations, HDR imaging process 1900 may be applied to cases where there are more than two light channels.

Machine Color Vision

FIG. 20 is a flow chart representing a color lookup table generation process 2000. Process 2000 identifies the signals a photosensitive pixel array, such as that depicted in FIGS. 1 and 3, will generate in response to each color in a set of reference colors. Process 2000 thereby enables automatic color recognition as described in relation to FIG. 21. Process 2000 begins with step 2001, in which a set of reference colors and a reference lighting condition are identified. The lookup table generated in process 2000 will define any output of the associated pixel array as one or another of the set of reference colors. As indicated by FIGS. 14-16, the signals generated in response to a color may be affected by the lighting conditions under which the color is presented. Step 2002 takes an image of each reference color using the pixel array under the reference lighting condition. Then, for each reference color, step 2003 identifies a signal from each light channel of the pixel array associated with the reference color. Step 2003 thereby identifies an exact relationship between an output of the pixel array and a reference color. Step 2004 extends the association and completes the lookup table by identifying each possible output of the pixel array as the reference color minimizing a predetermined function of the possible output and the reference color. As an illustrative example, an output of the pixel array as graphed on a color comparison chart such as that depicted in FIG. 6 may be associated with whichever reference color it is closest to as measured on the color comparison chart. In certain implementations, multiple lookup tables may be identified for multiple lighting conditions.

Figure 21:
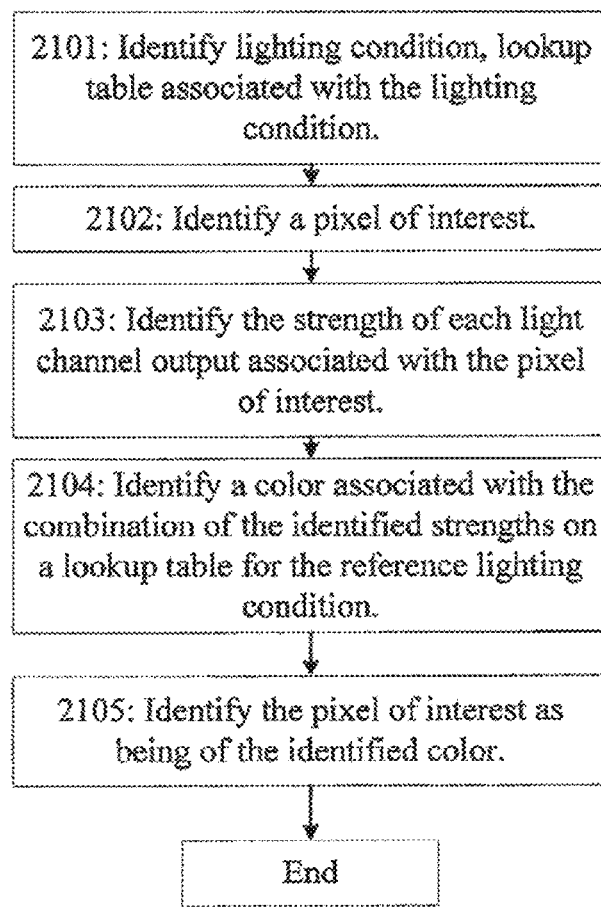
FIG. 21 is a flow chart of a process for automatic color identification, according to an illustrative implementation.

FIG. 21 is a flow chart depicting a machine color vision process 2100, an automated process for identifying a color in an image. As described in relation to FIG. 20, the lighting conditions in a scene may affect the output of an image taken of the scene. Process 2100 therefore begins with identifying a lighting condition of an image being processed and a lookup table associated with the lighting condition. The lighting condition may be identified by the user, by identifying the white balance of an illumination source as described in relation to FIG. 14, or by some other suitable method for identifying the lighting condition. In certain implementations, step 2101 may adjust the white balance of the image using a method such as local white balance process 1400, and identify a lookup table associated with a white-balanced image.

Step 2102 identifies a pixel of interest, whether by receiving a user selection, by pre-identification of a region of interest, by an automated process such as pattern recognition, or by some other suitable criteria for identifying a color to be identified. In some implementations, a region of interest may be identified rather than a single pixel. Step 2103 identifies the strength of each light channel output associated with the pixel of interest, and thereby identifies a color vector associated with the pixel of interest. Step 2104 compares the color vector with a lookup table, such as that generated by process 2000, to identify the reference color that the color vector is associated with. In certain implementations, a lookup table may indicate that a relationship between a color vector and a reference color is context-dependent, which may include cases where a color vector is equidistant between two reference colors on a color comparison chart such as that depicted in FIG. 6. In such implementations, the lookup table may indicate the contextual information required to identify the color, which may include the color of surrounding pixels or regions, the sharpness of the region in which the pixel lies, or other suitable information. Once the color vector is associated with a single reference color, step 2105 identifies the pixel of interest as being of the identified color and process 2100 is complete. In certain implementations, process 2100 may be applied to multiple pixels or regions, simultaneously or sequentially.

Alternative Imaging Devices

FIG. 22 is a block diagram of an alternative two-channel imaging system 2200. Light from a scene is filtered by filters 2202A and 2202B, corresponding to a first and a second light channel respectively. Lenses 2204A and 2204B focus incident light from a scene onto photosensitive pixel arrays 2206A and 2206B, which may be uniform arrays of photosensitive pixels, may include a pattern of ND and unfiltered pixels for HDR imaging as described in relation to FIG. 19, or be some other suitable photosensitive pixel arrays. Image processor 2208A translates signals from photosensitive pixel array 2206A into an image associated with a first light channel, while image processor 2208B translates signals from photosensitive pixel array 2206B into an image associated with a second light channel. The two images are combined into a single image by image-combining processor 2210, and may be stored in memory 2212, output to display 2214, or otherwise output.

FIG. 23 is a block diagram of an alternative two-channel imaging system 2300. Light from a scene is focused by a lens 2302. The focused light falls on a reflective color filter 2304, which transmits light 2306A that is associated with a first light channel to photosensitive pixel array 2308A and reflects light 2306B that is associated with a second channel to photosensitive pixel array 2308B. Pixel arrays 2308A and 2308B may be uniform arrays of photosensitive pixels, may include a pattern of ND and unfiltered pixels for HDR imaging as described in relation to FIG. 19, or be some other suitable photosensitive pixel arrays. Image processor 2310 may combine signals from corresponding pixels on the pixel arrays 2308A and 2308B to generate a color image as described in relation to FIG. 5 without requiring interpolation.

Figure 24:
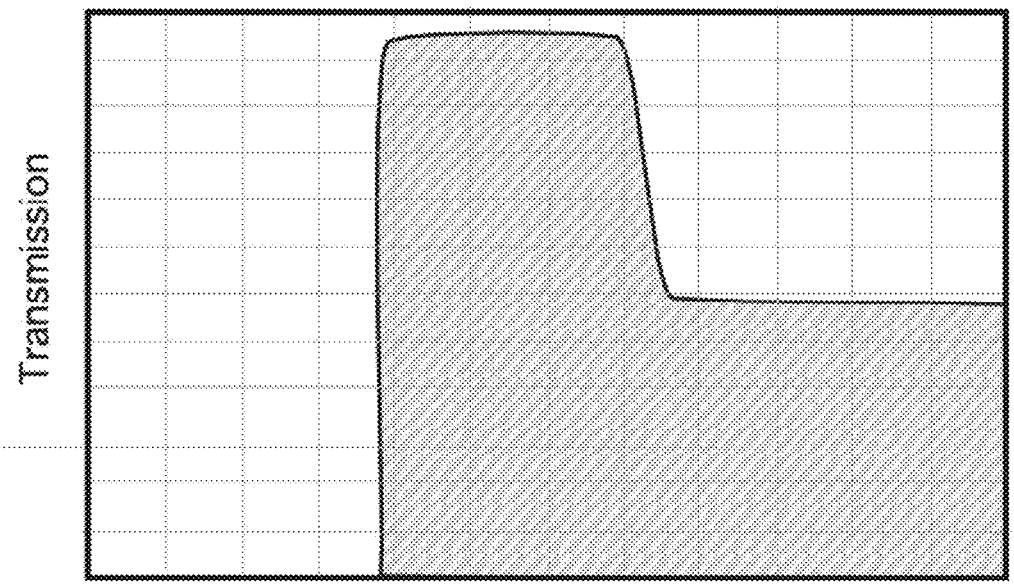
FIGS. 24-27 illustrate examples of transmission and blocking of selective wavelengths of light using leaky filters as disclosed herein.

FIG. 24 illustrates the transmission of a filter set in accordance with some embodiments, that includes one unfiltered channel and one predominantly long wave pass filtered channel. The objective of such a filter, for example, can be a desire to maintain a robust green rendition of foliage in the final image while still maintaining good color rendition of other materials in the scene. FIG. 24 illustrates the transmission of a filter in accordance with disclosed embodiments where the long wave pass filter passes a maximum amount of light beginning at 610 nm, then reduces the amount of light transmitted beginning at approximately 780 nm, a wavelength where the near IR reflectivity of foliage begins to ramp up. In this way red light from the foliage does not overwhelm the blue, green, or blue and green light that renders the foliage in the final image.

Figure 25:
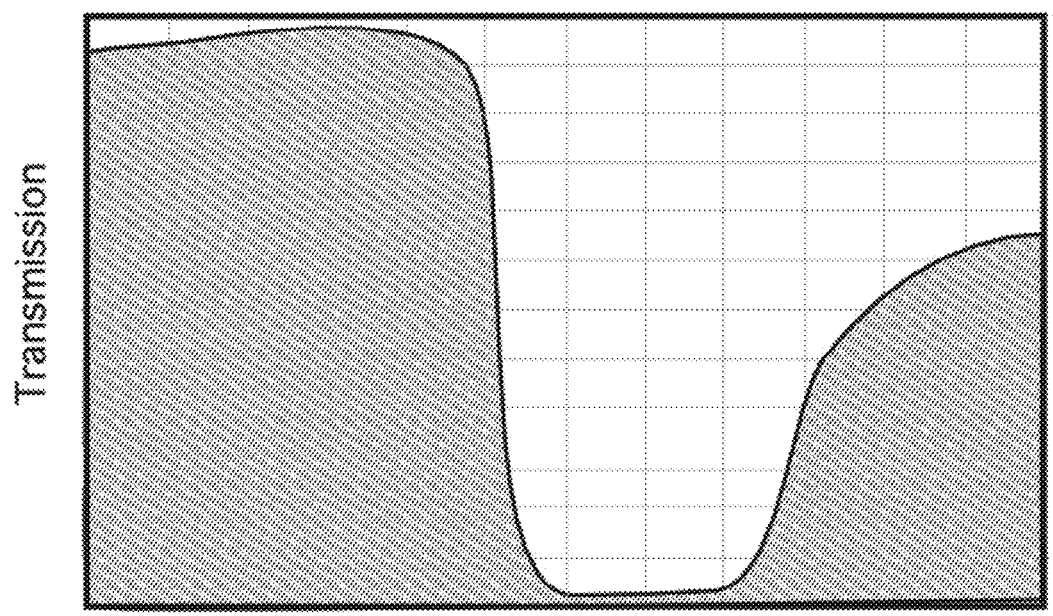

FIG. 25 illustrates the transmission of another filter set in accordance with some embodiments, that includes one unfiltered channel and one predominantly short wave pass filtered channel. The objective of such a filter, for example, can be a desire to minimize a red representation of foliage in the final image. FIG. 25 illustrates the transmission of a filter in accordance with disclosed embodiments where the short-wave pass filter also includes transmission of wavelengths >780 nm. In this way, a portion of near-IR light from the foliage is also represented in the final image with blue, green, or blue and green light, thus desaturating the red rendition of the foliage.

Figure 26:
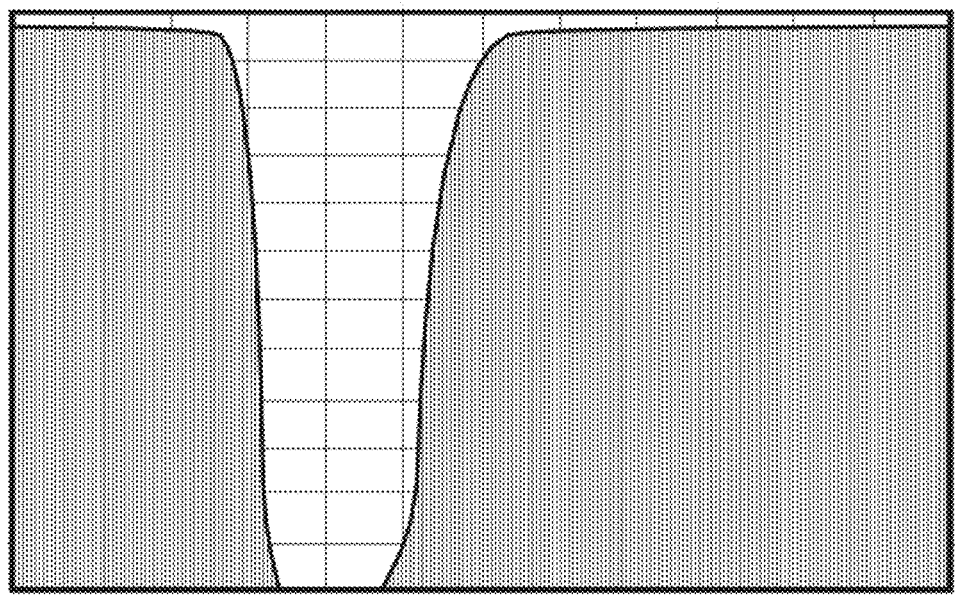
Figure 27:
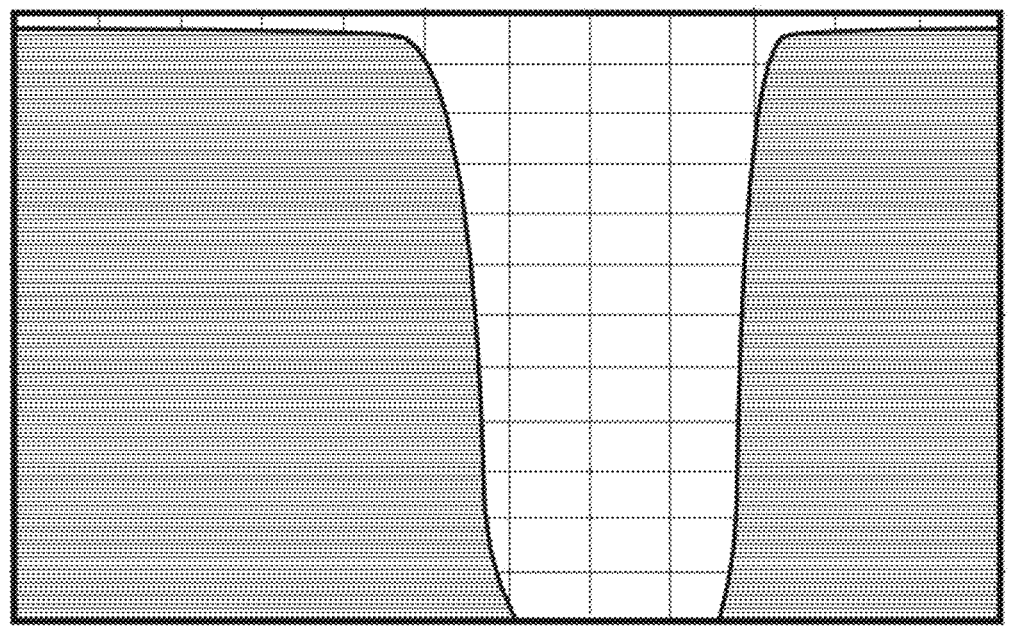

The creation of filters with multiple cut on and cot off curves can be an expensive process. FIGS. 26 and 27 show how less expensive band-blocking filters can achieve much of the desired transmission shaping of certain filters described herein, passing predominately short or low wave light plus wavelengths outside of those bands.

Figure 28:
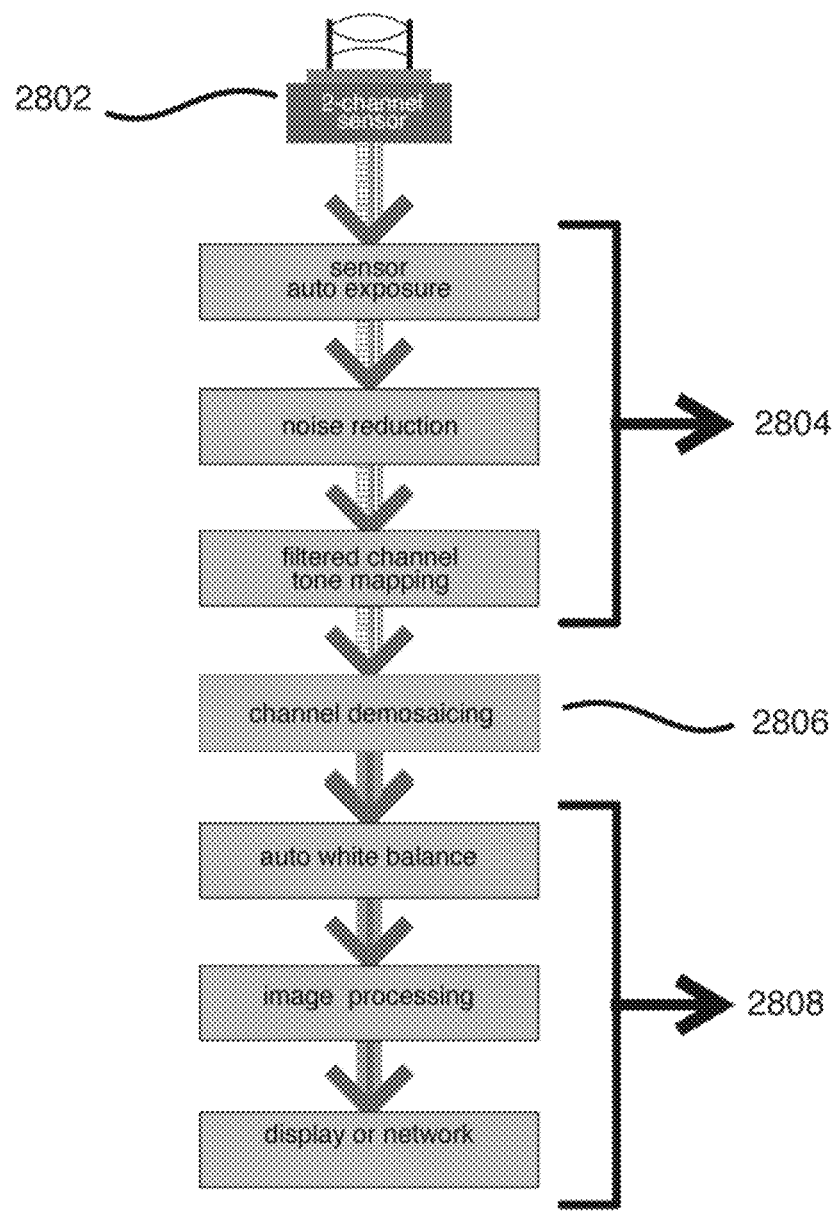
FIG. 28 illustrates a block diagram of an image creation process in accordance with disclosed embodiments.

FIG. 28 illustrates a block diagram of an image creation process in accordance with disclosed embodiments. The overall image processing "stack" or process for a disclosed two-channel image sensor makes use of image processing routines and algorithms commonly used in creating monochrome and color images from digital sensor. FIG. 28 depicts an image processing stack for a sensor in accordance with disclosed embodiments. The output channels of the two-channel sensor 8208 each have characteristics similar to a monochromatic sensor's output. Note that, while not illustrated specifically here, a CFA as described herein can be positioned between the light source and the two-channel sensor 2802 or integrated with two-channel sensor 2802. The processes 2804 represent common techniques used to adjust a monochrome sensor's gain and exposure, reduce the noise in the image, and tone map and adjust the histogram of the output. The demosaicing 2806 of two channels' sets of pixels uses techniques common in the art for demosaicing RGGB Bayer CFA sensors, with a smaller sample area reflecting the pixel pairs vs. the RGGB Bayer 2×2 pixel arrangement. After the demosaicing process, the resulting image is in a standard RGB form, and thus the processes 2808 shows the use common color sensor processing techniques for such tasks as auto white balance, further image optimization and formatting, and output to a display or network for transmission or saving.

Figure 29:
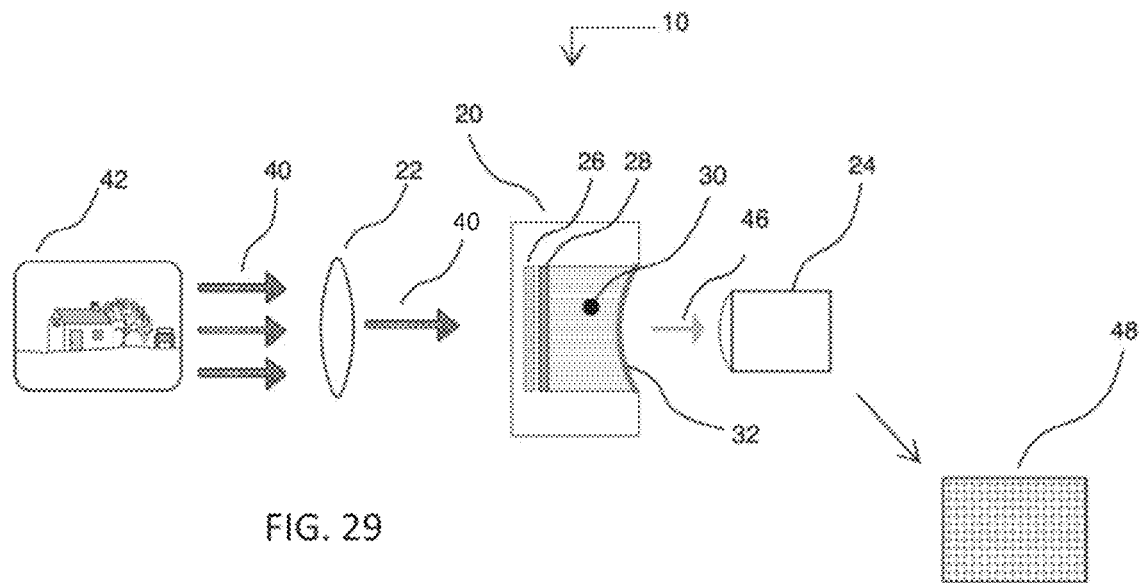
FIG. 29 illustrates a block diagram of a two-channel hybrid device in accordance with disclosed embodiments.

FIG. 29 illustrates a block diagram of a two-channel hybrid device 10 in accordance with disclosed embodiments. In this example, an image intensifier 20 is positioned behind an objective lens 22. The image intensifier has a two-channel filter plate 26 including a pixel pattern of unfiltered and filtered segments which is positioned in front of the intensifier's photocathode 28. The photocathode is positioned in front of the intensifier's microchannel plate 30. The intensifier's phosphor screen 32 is located at the rear of the microchannel plate. A monochrome digital sensor 24 is positioned to capture an image from the intensifier's output phosphor screen 32. The image 48 captured by the digital sensor will exhibit a pattern of filtered and unfiltered image segments as imposed on the photocathode by filter place 26.

Figure 30:
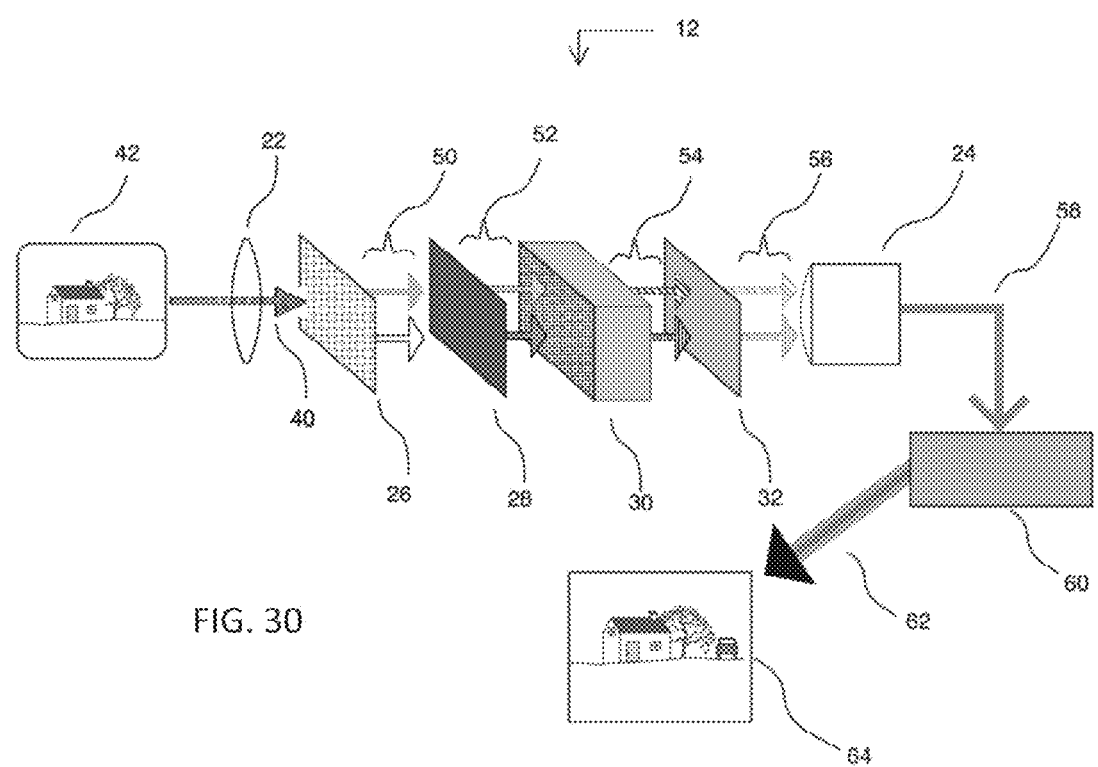
FIG. 30 illustrates a block diagram showing the image processing progression of one iteration of a hybrid sensor in accordance with disclosed embodiments.

FIG. 30 illustrates a block diagram showing the image processing progression of one iteration of a hybrid device in accordance with disclosed embodiments. Light 40 from the scene 42 is focused by the lens 22 onto the filter plate 26. Light rays 50 passing through the filter plate then hit the intensifier's photocathode 28 where they are converted into electrons 52. The electrons pass through the microchannel plate 30 where they are amplified. The amplified electrons 54 then strike the intensifier's phosphor screen 32 which converts the impinging electrons into photons 56. Because of the microchannel plate's fine scale configuration and collimation, the intensification process maintains the integrity of both the image and the pattern of filtered and unfiltered segments that has hit the photocathode. This patterned output image on the phosphor screen is captured by a monochromatic digital sensor 24 and passed on to the image processor 60. The image processor has been calibrated to know the position of the filtered and unfiltered image segments in the image. As described herein, the image processor uses this information to construct and output a full color image of the scene to a display 64 or for storage.

Figure 31:
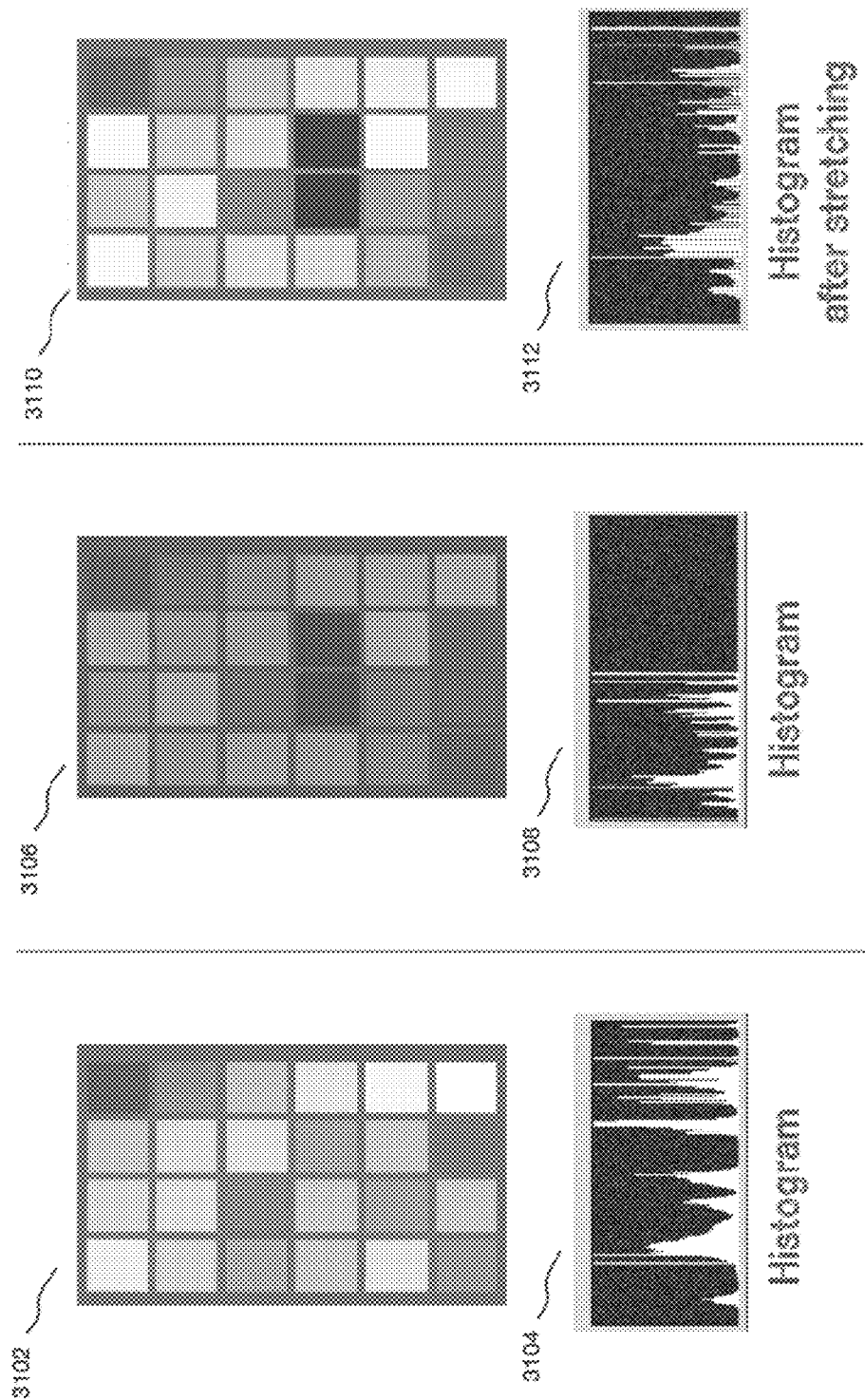
FIG. 31 illustrates exemplary channel outputs of an image produced in accordance with disclosed embodiments.

FIG. 31 shows exemplary channel outputs of an image produced in accordance with disclosed embodiments, such as by a two-channel device as described herein. The unfiltered image channel 3102 has a wider dynamic range as shown by its histogram 3104 than that of the filtered image channel 3106 due to the exposure reduction caused by the filter as shown by that image channel's histogram 3108. To better match the dynamic range of the two image channels prior to combining them to create the color image, the histogram of the filtered image channel can be stretched in accordance with the dynamic range of the unfiltered image channel 3102, resulting in a filtered image channel 3110 with a dynamic range that better matches that of the unfiltered image channel as shown by its histogram 3112.

In another example in accordance with disclosed embodiments, the output of a single sensor, visible or visible plus near-IR camera, with the sensor fitted with a two-channel CFA using techniques as described herein, the color image can be constructed in the following manner to avoid the traditional demosaicing procedure that can produce unwanted image artifacts. In RGB mode, the color information from the unfiltered pixels is assigned to the red channel, and the color information from the filtered pixels is assigned to the blue and green channels. The image is then converted to "Lab" mode, where (L) represents the grayscale lightness component, (a) represents the green-red color axis, and (b) represents the blue-yellow color axis. The (L) channel image is constructed by first stretching the histogram of the filtered channel's pixels to match that of the unfiltered channel, then combining the two pixel sets into one grayscale image base without demosaicing. The color information—(a) and (b) Lab channels—from the two channels is then blurred (gaussian or other) so that the color information from a pixel pair representing the two channels is spread over at least the output of the associated two pixel pair of the L channel image. Note that the blurring of the color channels can be increase beyond that necessary to match the L channel pixel pairs in order to reduce color noise artifacts. The image is then converted back to RGB mode and any number of white auto white balance or image color techniques common in the art may be applied.

The image is first created and converted to RGB mode, where the color information from the unfiltered pixels is assigned to the red channel, and the color information from the filtered pixels is assigned to the blue and green channels. Note that In RGB mode, both the brightness and color information is contained in each of the three channels. In a second step, the color information from the RGB color channels is saved separately into memory. The image is then converted to Lab mode.

In Lab mode, in this example, the (L) channel comprises the image's grayscale (lightness) component and contains the information that defines the sharpness and resolution of the image. The (a) channel comprising the green-red color information, and the channel (b) comprising the blue-yellow color information) and these two color information channels do not contribute markedly to image sharpness and resolution.

The (L) channel image is constructed by first stretching the histogram of the filtered channel's pixels to match that of the unfiltered channel, then combining the two pixel sets into one grayscale image that forms the (L) channel content without demosaicing.

The saved color information is then converted the (a) and (b) channels of Lab mode. The color information is then blurred (gaussian or other) so that the color information from a pixel pair representing the two channels is spread over at least the output of the associated two pixel pair of the L channel image. Note that the blurring of the color channels can be increased beyond that necessary to match the L channel pixel pairs in order to reduce color noise artifacts. The image is then converted back to RGB mode and any number of auto white balance or other image adjustments techniques common in the art are made before the RGB image stream is displayed or saved. In this manner a color image can be created with both good image sharpness and reduced color artifacts.

For a twin sensor camera, using Lab mode and blurring the color channels, the exposure of the filtered channel can be increased by binning that sensor's pixels, thus creating color channel information that in the process is in effect blurred, since binning pixels in combines the output of multiple pixels. The unfiltered sensor's color channel output would then be blurred separately to match the blurring of the filtered sensor caused by pixel binning. The overall blurring of the combined color information can be then re-adjusted if desired. As the subject matter gets closer to the camera, the camera ISP can determine the amount of parallax errors by looking at the offset between the two images and increase the amount of color channel blurring to minimize color fringing in the near objects caused by parallax between the L channel image which comes from the unfiltered sensor, and the color information which comes from both sensors, and thus exhibits parallax errors caused by spacing between the two sensors and the close distance to the subject.

With a twin sensor camera configuration with one sensor unfiltered and the other filtered with a filter as described herein, a similar technique can be used to improve final image resolution and quality. In this case, rather than creating the L channel image by combining the unfiltered and filtered streams, only the unfiltered image stream is used for the L channel, since that stream has received a fuller exposure that matches the sensor's dynamic range, and will therefore have a higher signal-to-noise ratio. The color information (a and b color channels) is then created using the two streams as discussed above. The color information from two sensor streams may or may not need be blurred, but in any case such blurring has small effect on image resolution, since image resolution primarily resides in the L channel's grayscale information that has been taken from the unfiltered sensor's capture. By this method, final image quality is improved since there is no demosaicing process that can produce image artifacts. Since color—as opposed to hue—does have a brightness component (for example, a light tan becomes a dark brown if the brightness is reduced, and likewise a pink becomes a dark red), the process described can be seen as trading absolute color accuracy for image resolution. However, in many applications where a low light color image is desired—such as for security, situational awareness or autonomous vehicles—the tradeoff can be worthwhile. Note that in a twin sensor camera with the color image created in the manner described above, parallax generally will not be a problem since only one sensor is used for the L channel and the color information can be sufficiently blurred so that parallax errors are minimal in all but extreme cases. In some cases, the camera's ISP—using image registration techniques common in the art—can actively determine when parallax errors caused by the distance between the two sensors' lenses and a short distance between the lenses and the subject of interest will be greater than a defined amount and then electronically align the two images using techniques common in the art, and or increase the amount of blurring applied to the color information channels to minimize color edge effects.

Note that, in various embodiments where two sensors and two lenses are described, other embodiments include cases where there are two sensors, a single lens, and a beam splitter.

With a twin sensor camera where both the unfiltered and the filtered sensor have been given the same exposure, it is noted that the filtered sensor will receive a reduced exposure, and thus may exhibit impaired tonal range and increase noise. In another technique, the pixels the filtered sensor may be binned. If the filter on the filtered sensor reduces light transmission by 50%, binning a 4×4 array of pixels on that sensor will increase the effective exposure by the square root of 4, thus better matching the brightness range of the two streams, requiring fewer adjustments of the histogram of the filtered stream and thus improving the final image quality.

This approach will also, in effect, blur the color information contained in the filtered stream as if it was down sampled by a factor of 4. Therefore, prior to creating the color information for use in the Lab conversion, the unfiltered sensor's information is also down sampled by a factor of 4. The resulting a and b channel color information will in this process be blurred to match the minimum required 2×2 color information blurring when the Lab mode image is assembled. For the Lab image assembly, the information from the unfiltered stream prior to down sampling is used to create the grayscale information for the L channel. The assembled image is then converted to RGB mode for display or storage.

Figure 32:
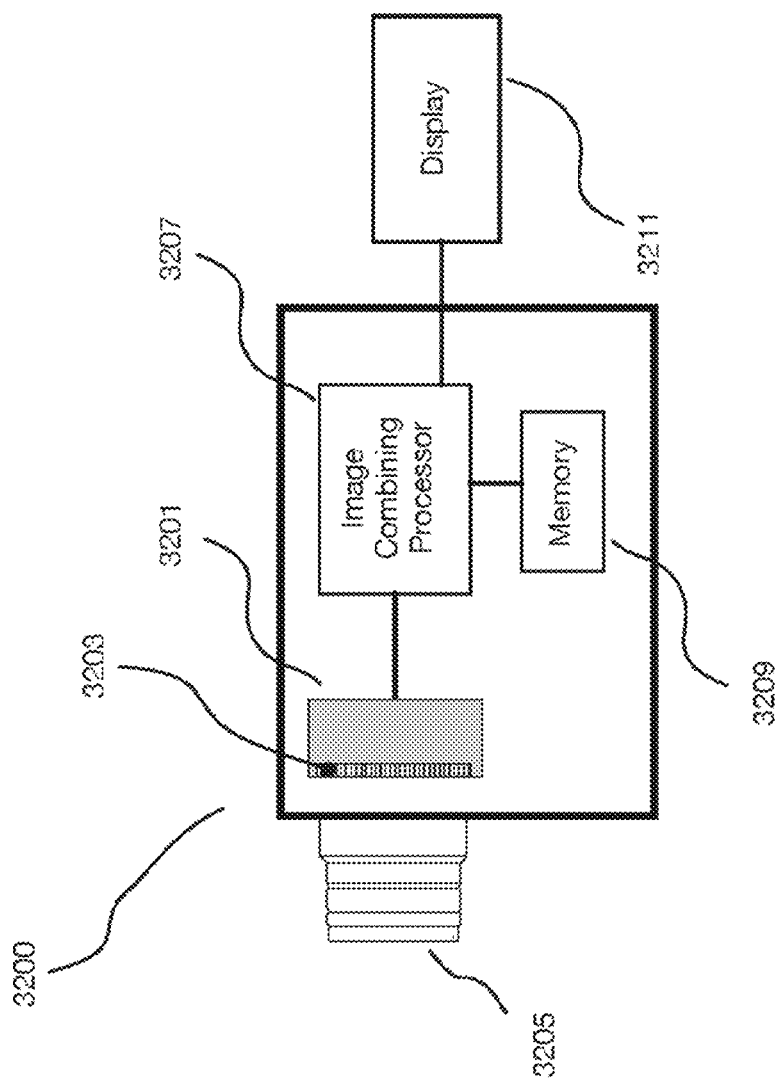
FIG. 32 illustrates a block diagram of a digital camera using a single digital image sensor in accordance with disclosed embodiments.

FIG. 32 is a block diagram of an alternative two-channel imaging system 3200 using a single imaging sensor 3201. Lens 3205 focuses light from a scene on the sensor where it is filtered by a two channel color filter array (CFA) 3203. Image combining processor 3207 uses the output of the sensor to construct a color image stream which may be stored in memory 3209, output to display 3211, or otherwise output.

Figure 33:
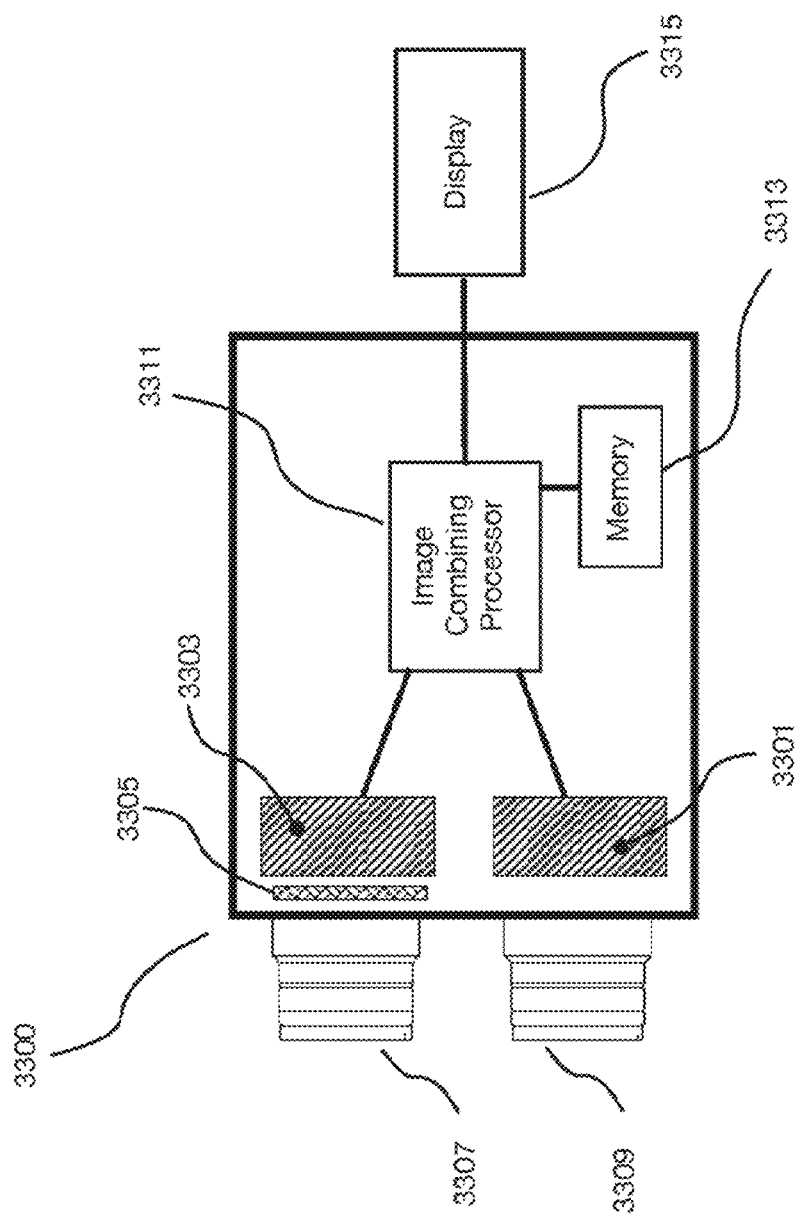
FIG. 33 illustrates a block diagram of a digital camera using two digital image sensors, one unfiltered and the other fitted with a filter in accordance with disclosed embodiments.

FIG. 33 is a block diagram of an alternative two-channel imaging system 3300 using a two imaging sensors. One sensor 3301 is unfiltered, the second sensor 3303 is fitted with a selected filter 3305 in its light path. Lens 3307 focuses light from a scene on the filtered sensor and lens 3309 focuses light from a scene onto the unfiltered sensor. Image combining processor 3311 uses the output of the two sensors to construct a color image stream which may be stored in memory 3313, output to display 3315, or otherwise output.

Figure 34:
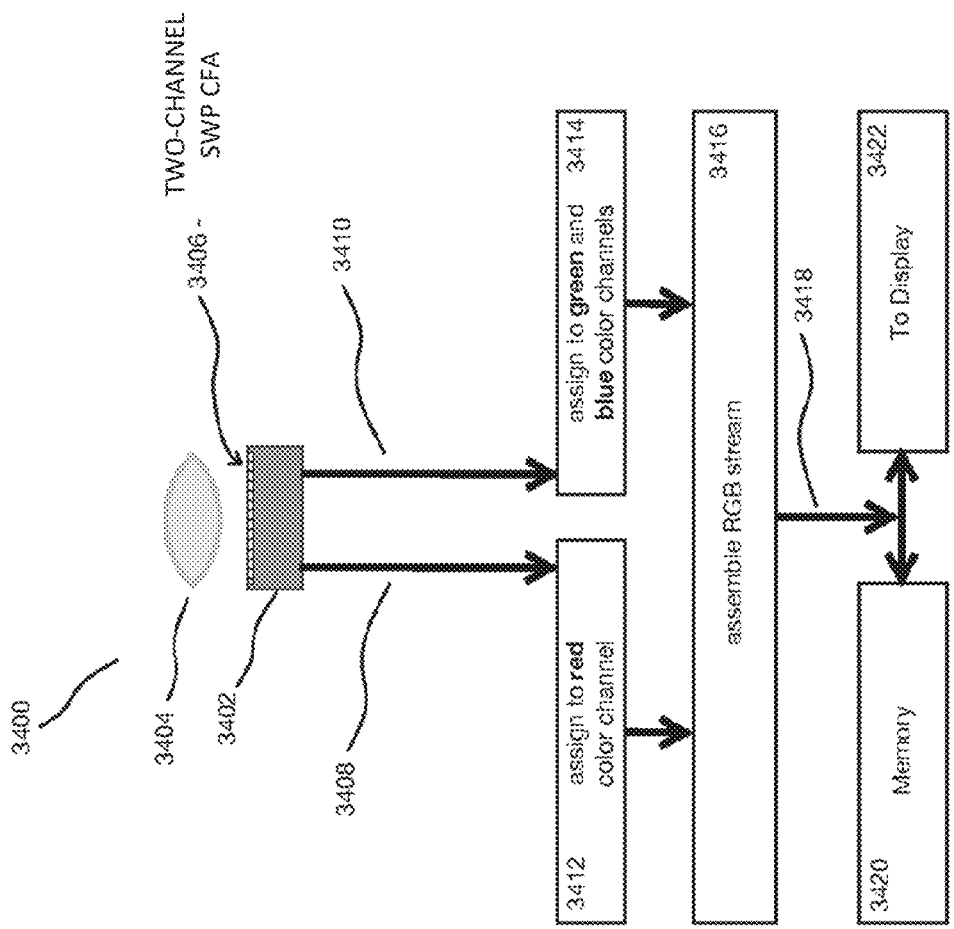
FIG. 34 illustrates a block diagram of another image creation process using a single sensor camera fitted with a two channel, short wave pass filtered/unfiltered CFA in accordance with disclosed embodiments.

FIG. 34 is a flow chart depicting a color image producing process 3400, an automated process for producing a color image stream from two information channels produced by a digital image sensor. Image sensor 3402 has a two channel color filter array (CFA) 3406, with one channel unfiltered and the other channel filtered by short wave pass (SWP) filter. Light from a scene is focused through the filter array onto the sensor by a lens 3404. The sensor outputs two information channels, one 3408 comprising brightness information from the sensor's unfiltered pixels and a second information channel 3410 comprising brightness information from the sensor's filtered pixels. In process step 3412 the brightness information from the unfiltered pixels is assigned to a red color channel. In process step 3414 the brightness information from the filtered pixels is assigned to green and blue color channels. In process step 3416, the red, blue and green color channels are assembled into a RGB color image stream 3418 which may be stored in memory 3420, output to display 3422, or otherwise output.

Figure 35:
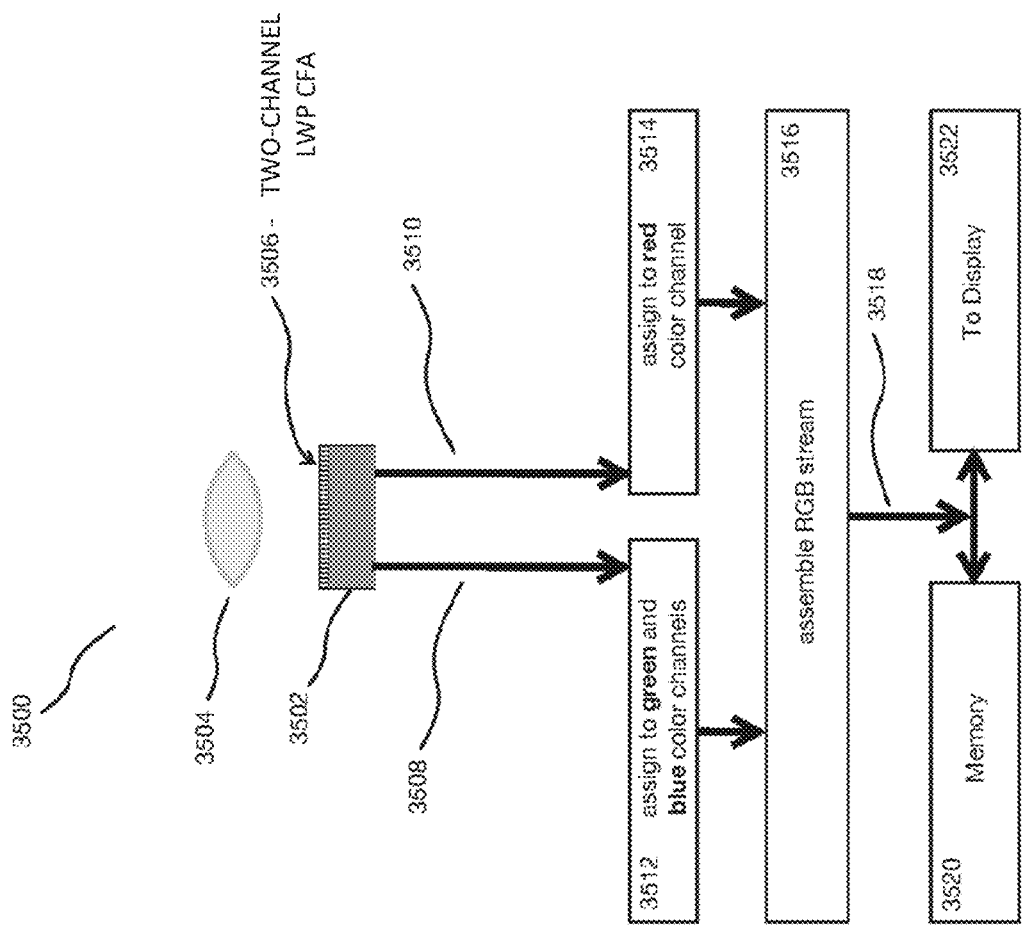
FIG. 35 illustrates a block diagram of another image creation process using a single sensor camera fitted with a two channel, long wave pass filtered/unfiltered CFA in accordance with disclosed embodiments.

FIG. 35 is a flow chart depicting a color image producing process 3500, an automated process for producing a color image stream from two information channels produced by a digital image sensor. Image sensor 3502 has a two channel color filter array (CFA) 3506, with one channel unfiltered and the other channel filtered by long wave pass (LWP) filter. Light from a scene is focused through the filter array onto the sensor by a lens 3504. The sensor outputs two information channels, one 3508 comprising brightness information from the sensor's unfiltered pixels and a second information channel 3510 comprising brightness information from the sensor's filtered pixels. In process step 3512 the brightness information from the unfiltered pixels is assigned to green and blue color channels. In process step 3514 the brightness information from the filtered pixels is assigned to a red color channel. In process step 3516, the red, blue and green color channels are assembled into a RGB color image stream 3418 which may be stored in memory 3520, output to display 3522, or otherwise output.

Figure 36:
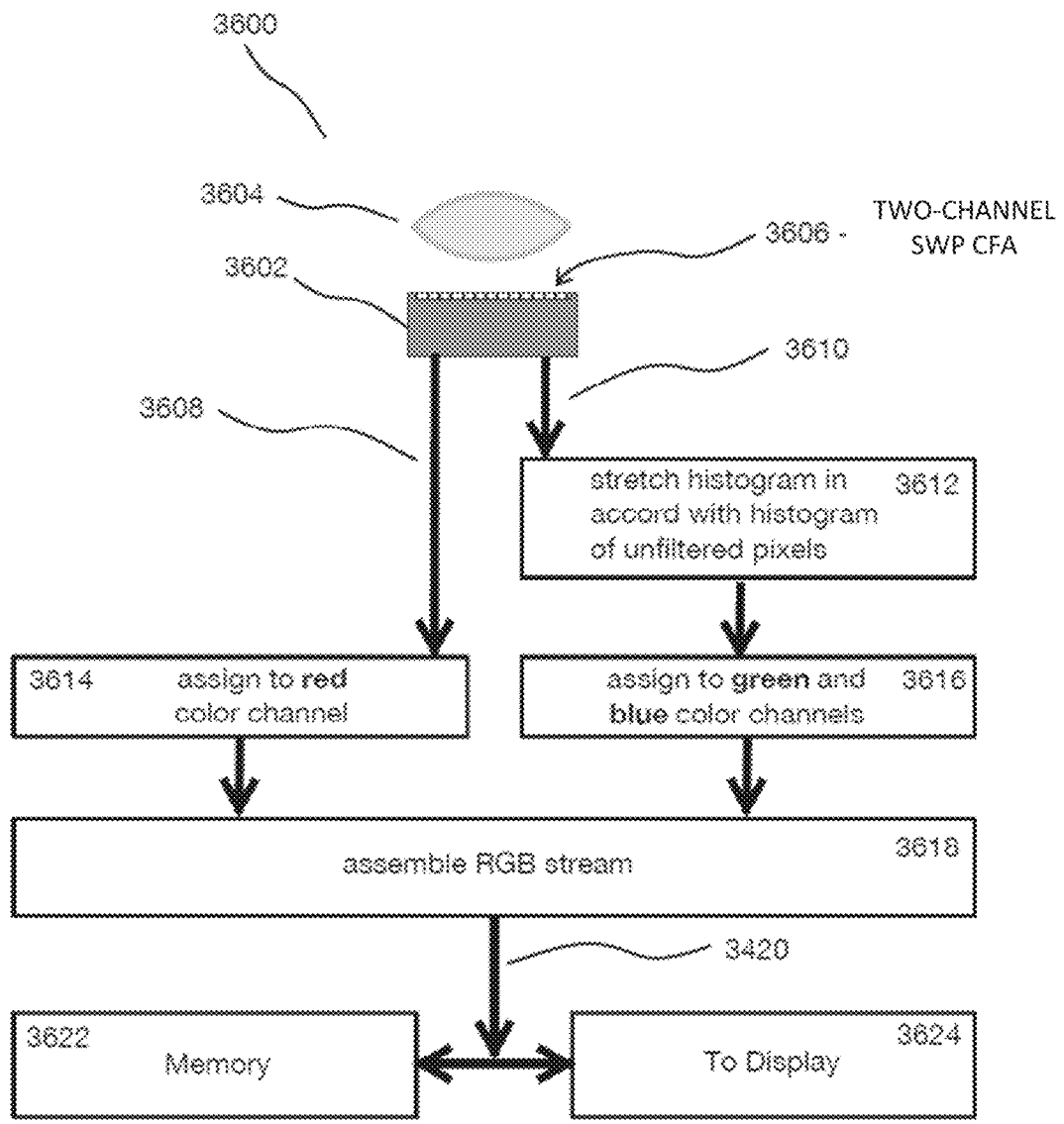
FIG. 36 illustrates a block diagram of another image creation process using a single sensor camera fitted with a two channel, short wave pass filtered/unfiltered CFA employing image adjustments made to the histogram of the filtered channel in accordance with disclosed embodiments.

FIG. 36 is a flow chart depicting a color image producing process 3600, an automated process for producing a color image stream from two information channels produced by a digital image sensor. Image sensor 3602 has a two channel color filter array (CFA) 3606, with one channel unfiltered and the other channel filtered by short wave pass (SWP) filter. Light from a scene is focused through the filter array onto the sensor by a lens 3604. The sensor outputs two information channels, one 3608 comprising brightness information from the sensor's unfiltered pixels and a second information channel 3610 comprising brightness information from the sensor's filtered pixels. In process step 3612 the histogram of the brightness information from the filtered pixels is stretched such that its dynamic range is substantially matched to the dynamic range of the image information from the unfiltered pixels. In process step 3614 the brightness information from the unfiltered pixels is assigned to a red color channel. In process step 3616 the brightness information from the filtered pixels is assigned to green and blue color channels. In process step 3618, the red, blue and green color channels are assembled into a RGB color image stream 3620 which may be stored in memory 3622, output to display 3624, or otherwise output.

Figure 37:
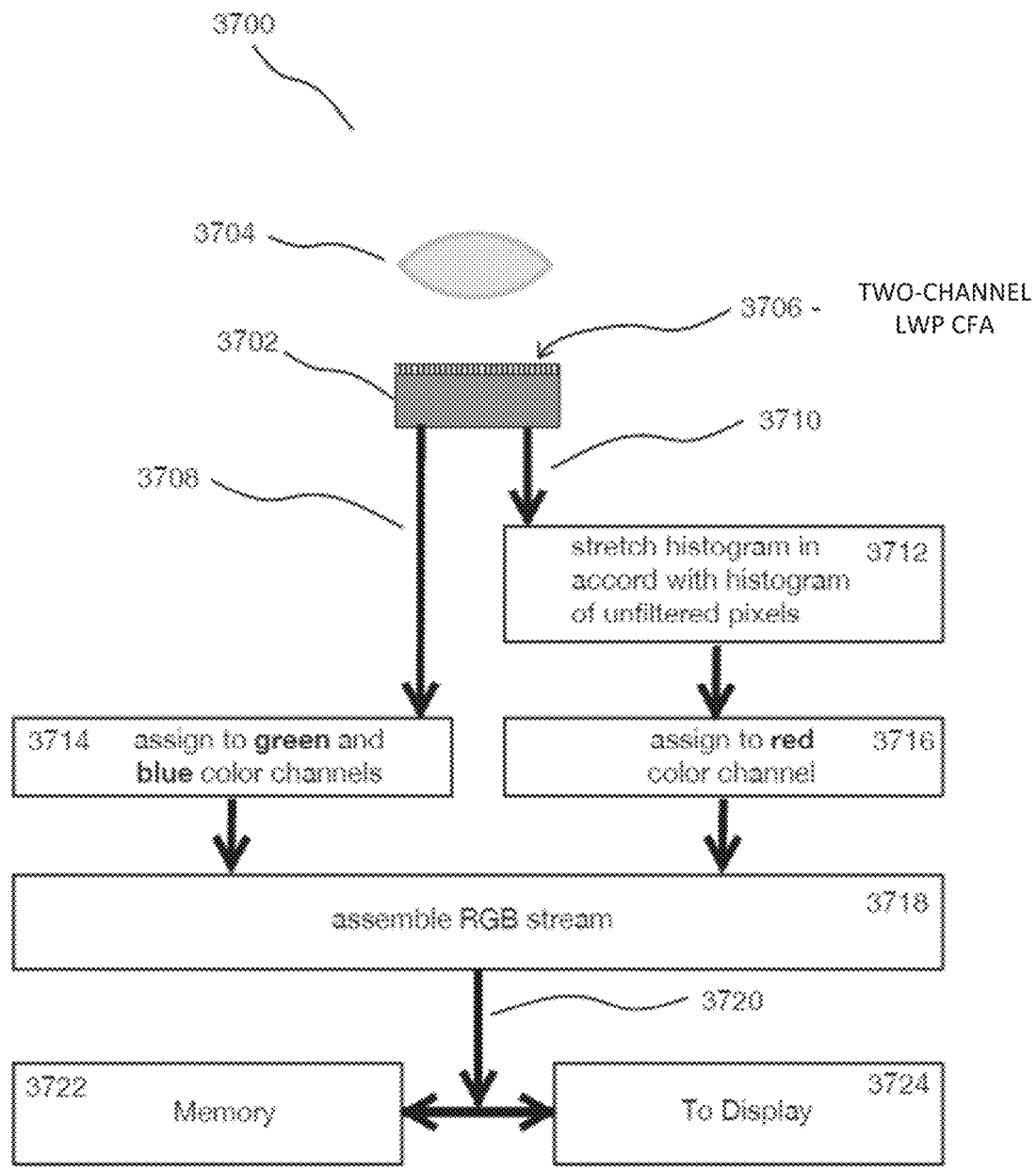
FIG. 37 illustrates a block diagram of another image creation process using a single sensor camera fitted with a two channel, long wave pass filtered/unfiltered CFA employing image adjustments made to the histogram of the filtered channel accordance with disclosed embodiments.

FIG. 37 is a flow chart depicting a color image producing process 3700, an automated process for producing a color image stream from two information channels produced by a digital image sensor. Image sensor 3702 has a two channel color filter array (CFA) 3706, with one channel unfiltered and the other channel filtered by long wave pass (LWP) filter. Light from a scene is focused through the filter array onto the sensor by a lens 3704. The sensor outputs two information channels, one 3708 comprising brightness information from the sensor's unfiltered pixels and a second information channel 3710 comprising brightness information from the sensor's filtered pixels. In process step 3712 the histogram of the brightness information from the filtered pixels is stretched such that its dynamic range is substantially matched to the dynamic range of the image information from the unfiltered pixels. In process step 3714 the brightness information from the unfiltered pixels is assigned to a red color channel. In process step 3716 the brightness information from the filtered pixels is assigned to green and blue color channels. In process step 3718, the red, blue and green color channels are assembled into a RGB color image stream 3720 which may be stored in memory 3722, output to display 3724, or otherwise output.

Figure 38:
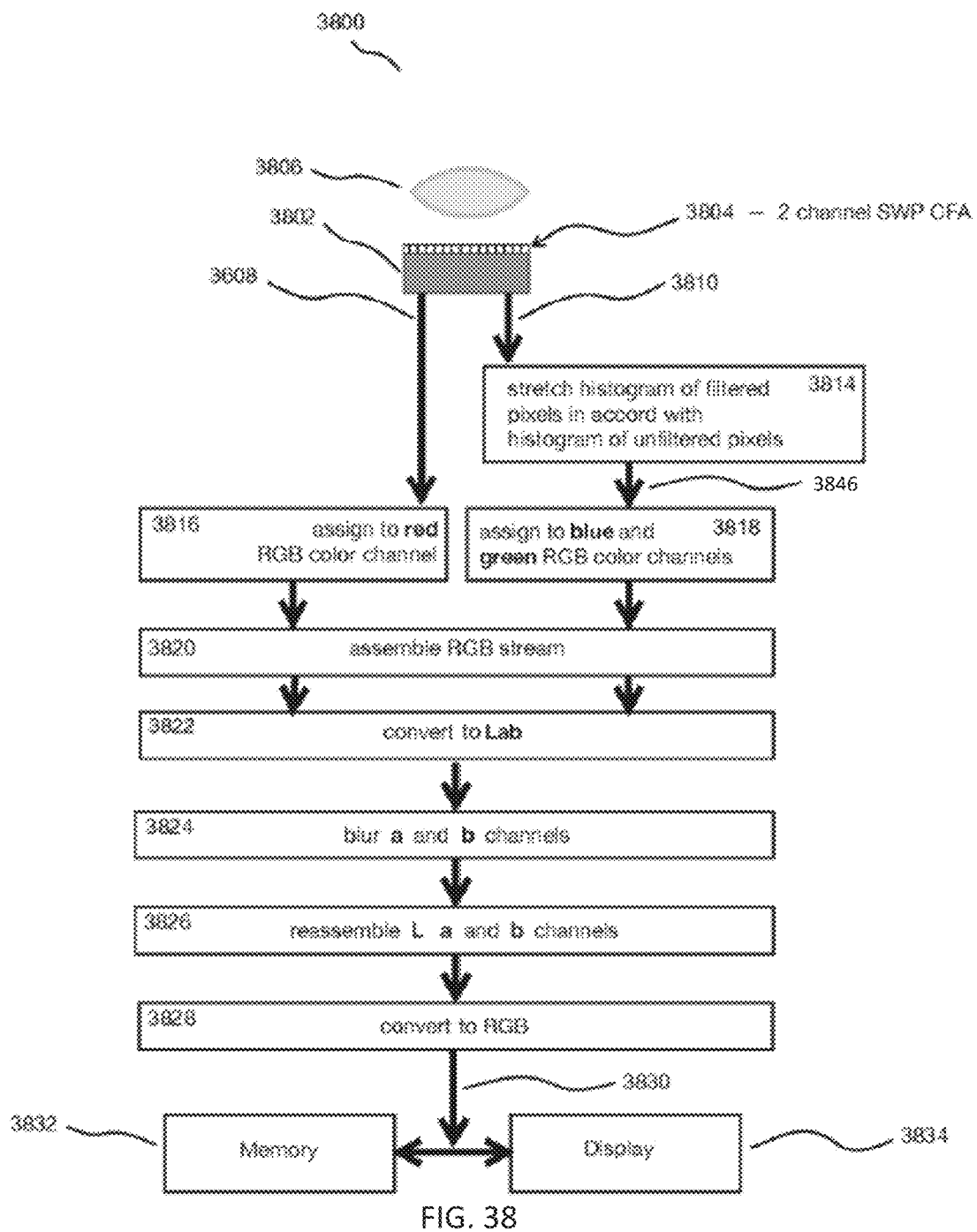
FIG. 38 illustrates a block diagram of another image creation process using a single sensor camera fitted with a two channel, short wave pass filtered/unfiltered CFA employing image adjustments made to the histogram of the filtered channel, and image adjustments made in Lab mode, in accordance with disclosed embodiments.

FIG. 38 is a flow chart depicting another color image producing process 3800, an automated process for producing a color image stream from two information channels produced by a digital image sensor. Image sensor 3802 has a two channel color filter array (CFA) 3804, with one channel unfiltered and the other channel filtered by short wave pass (SWP) filter. Light from a scene is focused through the filter onto the sensor by a lens 3806. The sensor outputs two information channels, a first information channel 3808 comprising brightness information from the sensor's unfiltered pixels and a second information channel 3810 comprising brightness information from the sensor's filtered pixels. In process step 3814 the histogram of the brightness information from the filtered pixels is stretched such that its dynamic range is substantially matched to the dynamic range of the image information from the unfiltered pixels. In process step 3816 the unfiltered pixels' brightness information 3808 is assigned to a red color channel. In process step 3818 the filtered pixels' histogram-adjusted brightness information 3846 is assigned to blue and green color channels. In process step 3820, the red, blue and green channels are assembled into a RGB color image. In process step 3822 the color image is converted to Lab mode. In process step 3824 the a and b color channels are blurred. In process step 3826 the color Lab mode image is reassembled. In process step 3828 the color image is converted to RGB mode and then output as a color image stream 3830 which may be stored in memory 3832, output to display 3834, or otherwise output.

Figure 39:
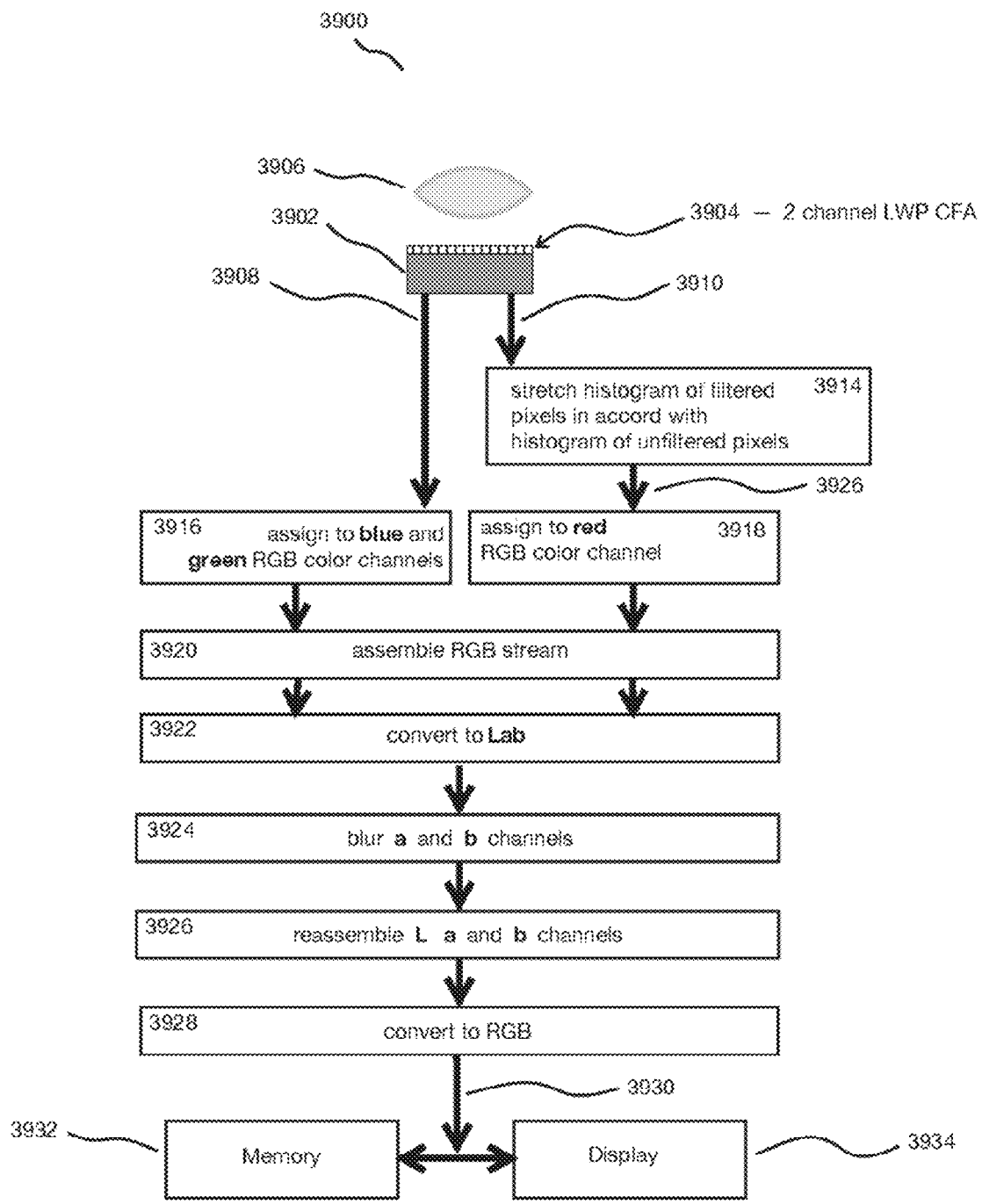
FIG. 39 illustrates a block diagram of another image creation process using a single sensor camera fitted with a two channel, long wave pass filtered/unfiltered CFA employing image adjustments made to the histogram of the filtered channel, and image adjustments made in Lab mode, in accordance with disclosed embodiments.

FIG. 39 is a flow chart depicting another color image producing process 3900, an automated process for producing a color image stream from two information channels produced by a digital image sensor. Image sensor 3902 has a two-channel color filter array (CFA) 3904, with one channel unfiltered and the other channel filtered by long wave pass (LWP) filter. Light from a scene is focused through the filter onto the sensor by a lens 3906. The sensor outputs two information channels, one 3908 comprising brightness information from the sensor's unfiltered pixels and a second information channel 3910 comprising brightness information from the sensor's filtered pixels. In process step 3914 the histogram of the brightness information from the filtered pixels is stretched such that its dynamic range is substantially matched to the dynamic range of the image information from the unfiltered pixels. In process step 3916 the unfiltered pixels' brightness information 3908 is assigned to blue and green color channels. In process step 3918 the filtered pixels' histogram-adjusted brightness information 3926 is assigned to a red color channel. In process step 3920, the red, blue and green channels are assembled into a RGB color image. In process step 3922 the color image is converted to Lab mode. In process step 3924 the a and b color channels are blurred. In process step 3926 the color Lab mode image is reassembled. In process step 3928 the color image is converted to RGB mode and then output as a color image stream 3930 which may be stored in memory 3932, output to display 3934, or otherwise output.

Figure 40:
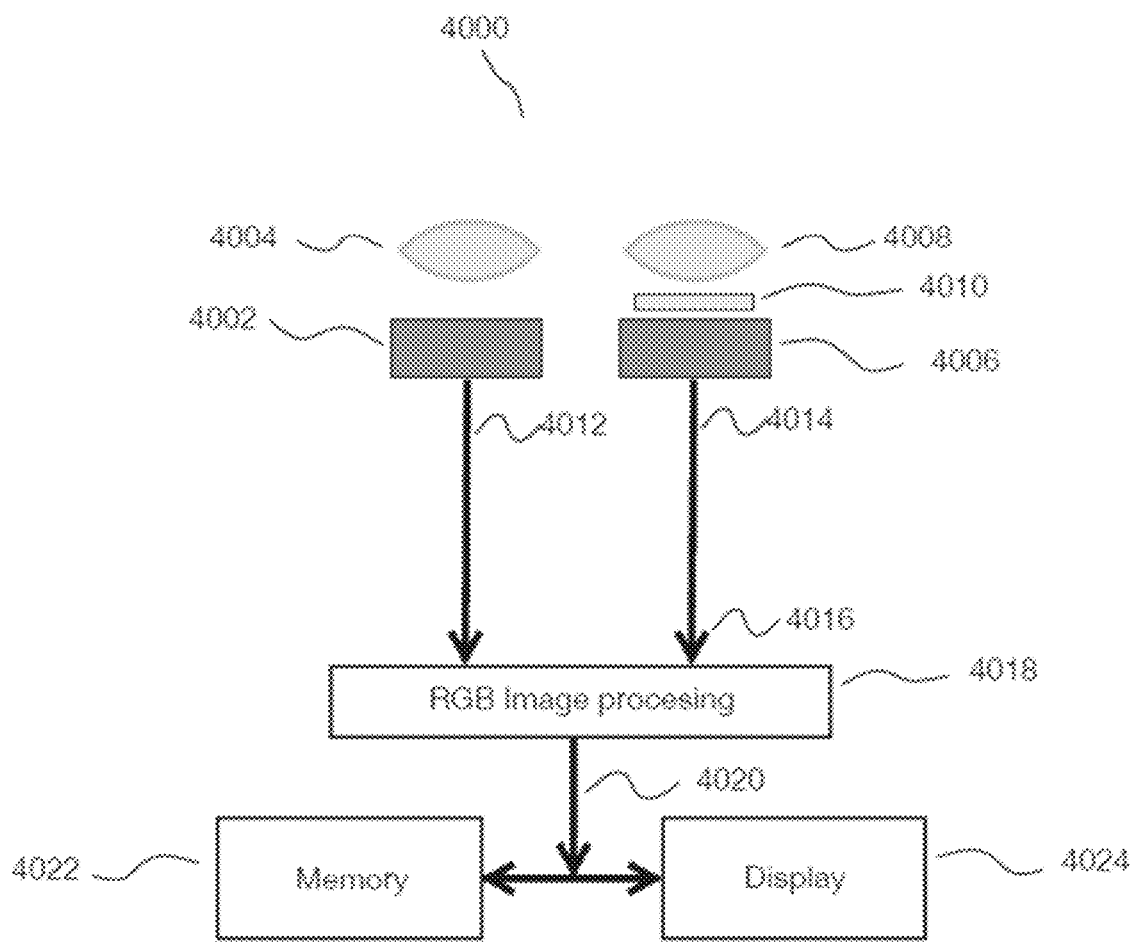
FIG. 40 illustrates a block diagram of another image creation process using a twin sensor camera fitted with one sensor fitted with either a short wave pass or long wave pass filter and a second sensor unfiltered in accordance with disclosed embodiments.

FIG. 40 is a flow chart depicting yet another color image producing process 4000, an automated process for producing a color image stream from two information channels produced by two digital image sensors. Image sensor 4002 is an unfiltered digital image sensor. Light from a scene is focused on this sensor by lens 4004. Image sensor 4006 is digital image sensor with either a SWP or LWP filter 4010 in the optical path. Light from a scene is focused on this sensor by lens 4008. The two sensors output two information channels, a first information channel comprising brightness information 4012 from the unfiltered sensor's pixels and a second information channel comprising brightness information 4014 from the filtered sensor's pixels. In process step 4018 the brightness information 4012 from the unfiltered sensor and the brightness information 4014 from the filtered sensor are constructed into an RGB image. In the case of a SWP filter the brightness information from the unfiltered sensor is assigned to the red color channel and the brightness information from the filtered sensor is assigned to the blue and green color channels of the RGB image. In the case of a LWP filter the brightness information from the unfiltered sensor is assigned to the blue and green color channels and the brightness information from the filtered sensor is assigned to the red color channel of the RGB image. The RGB image stream 4020 may be stored in memory 4022, output to display 4024, or otherwise output.

Figure 41:
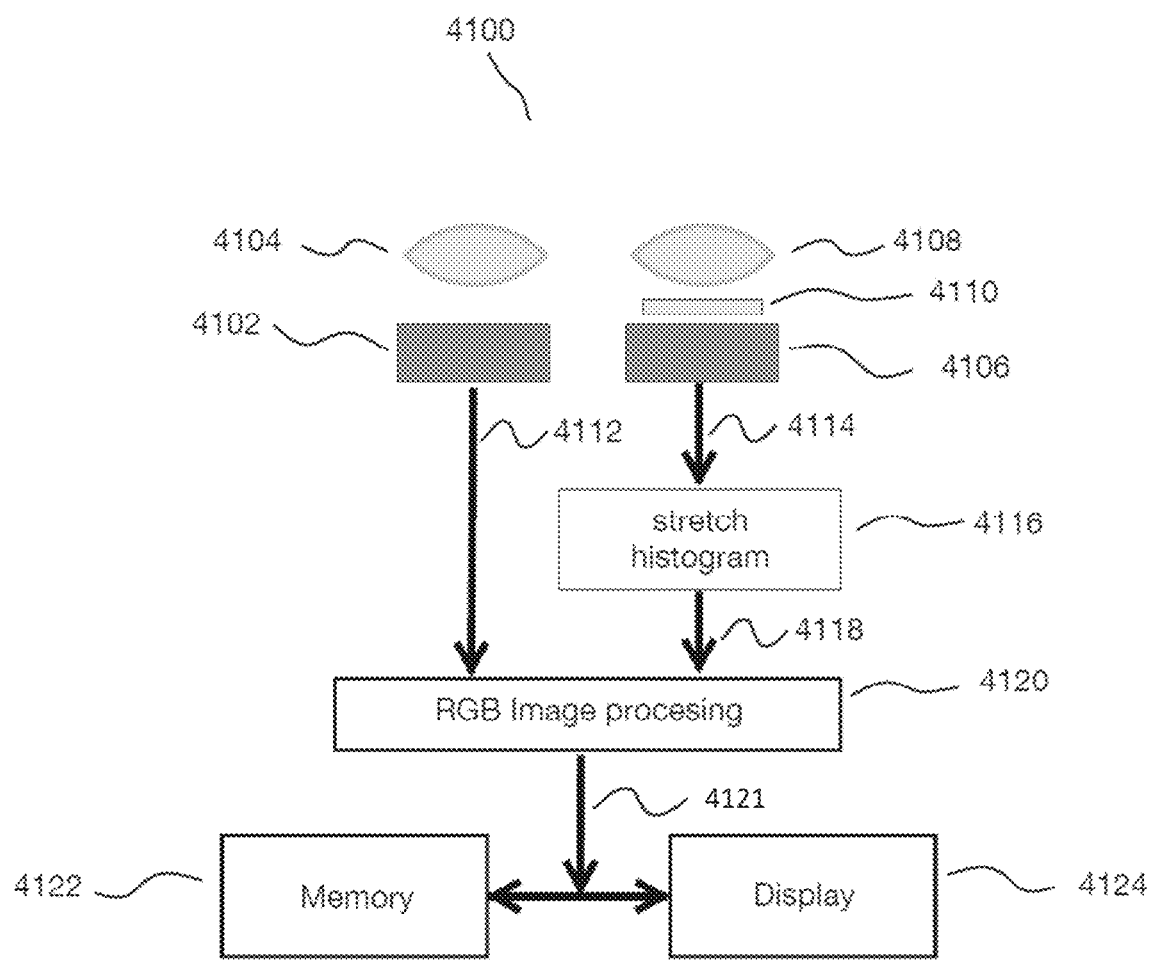
FIG. 41 illustrates a block diagram of another image creation process using a twin sensor camera fitted with one sensor fitted with either a short wave pass or long wave pass filter and a second sensor unfiltered, employing image adjustments made to the histogram of the filtered channel in accordance with disclosed embodiments.

FIG. 41 is a flow chart depicting yet another color image producing process 4100, an automated process for producing a color image stream from two information channels produced by two digital image sensors. Image sensor 4102 is an unfiltered digital image sensor. Light from a scene is focused on this sensor by lens 4104. Image sensor 4106 is digital image sensor with either a SWP or LWP filter 4110 in the optical path. Light from a scene is focused on this sensor by lens 4108. The two sensors output two information channels, a first information channel 4112 comprising brightness information from the unfiltered sensor's pixels and a second information channel 4114 comprising brightness information from the filtered sensor's pixels. In process step 4120 the histogram of the brightness information from the filtered sensor is stretched such that its dynamic range substantially matches the dynamic range of the image information from the unfiltered sensor. In process step 4120 the brightness information 4112 from the unfiltered sensor and the stretched brightness information 4122 from the filtered sensor are constructed into an RGB image stream 4121. In the case of a SWP filter the brightness information from the unfiltered sensor is assigned to the red color channel and the brightness information from the filtered sensor is assigned to the blue and green color channels of the RGB image. In the case of a LWP filter the brightness information from the unfiltered sensor is assigned to the blue and green color channels and the brightness information from the filtered sensor is assigned to the red color channel of the RGB image. The RGB image stream 4121 may be stored in memory 4122, output to display 4124, or otherwise output.

Figure 42:
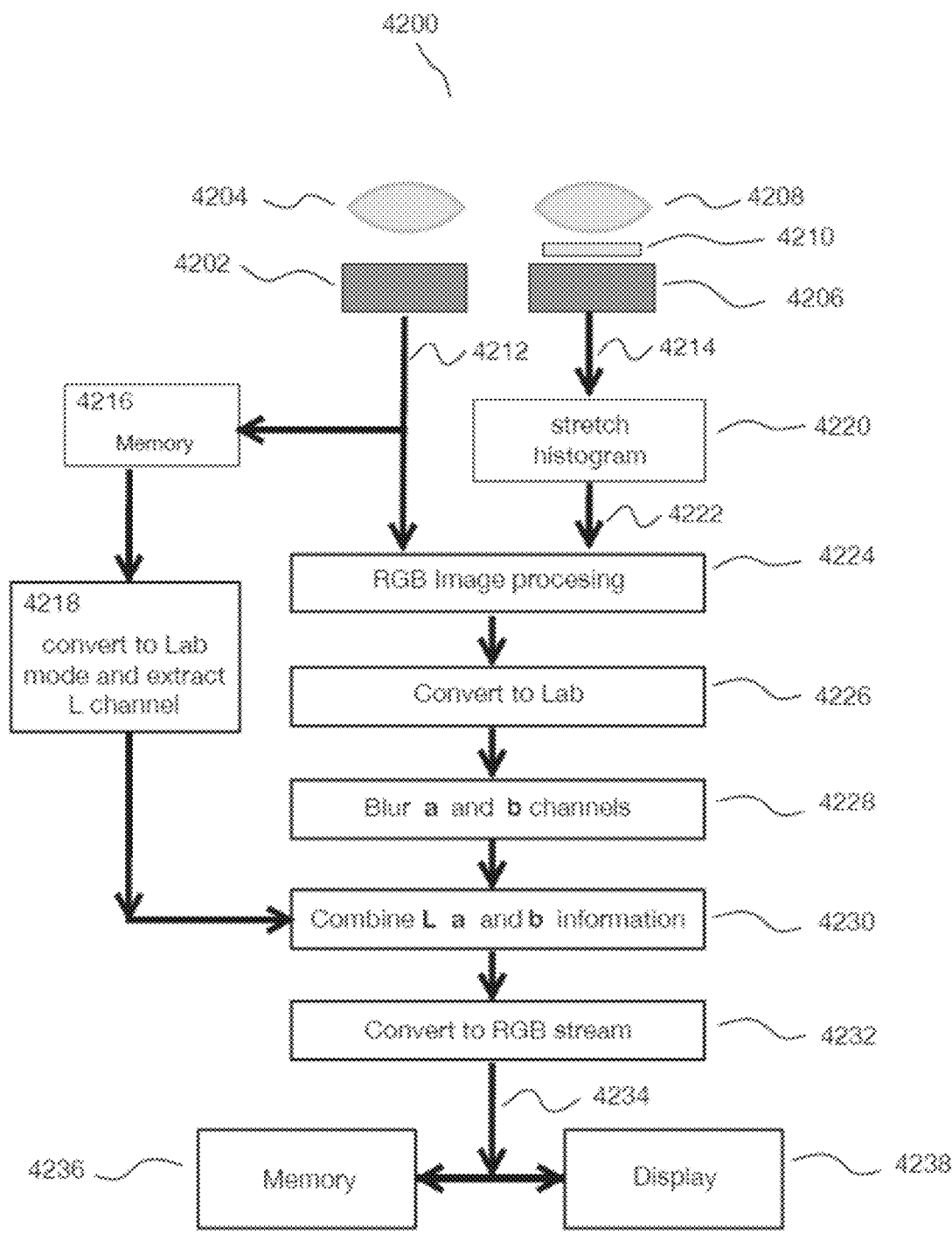
FIG. 42 illustrates a block diagram of another image creation process using a twin sensor camera fitted with one sensor fitted with either a short wave pass or long wave pass filter and a second sensor unfiltered, employing image adjustments made to the histogram of the filtered channel, and image adjustments made in Lab mode, in accordance with disclosed embodiments.

FIG. 42 is a flow chart depicting yet another color image producing process 4200, an automated process for producing a color image stream from two information channels produced by two digital image sensors. Image sensor 4202 is an unfiltered digital image sensor. Light from a scene is focused on this sensor by lens 4204. Image sensor 4206 is digital image sensor with either a SWP or LWP filter 4210 in the optical path. Light from a scene is focused on this sensor by lens 4208. The two sensors output two information channels, a first information channel 4212 comprising brightness information from the unfiltered sensor's pixels and a second information channel 4214 comprising brightness information from the filtered sensor's pixels. In process step 4216 brightness information from channel 4212 is stored in temporary memory. In process step 4218 the brightness information is converted to a Lab image and the L channel information extracted. In process step 4220 the histogram of the brightness information from the filtered sensor is stretched such that its dynamic range substantially matches the dynamic range of the image information from the unfiltered sensor. In process step 4224 the brightness information 4212 from the unfiltered sensor and the stretched brightness information 4222 from the filtered sensor are constructed into an RGB image. In the case of a SWP filter the brightness information from the unfiltered sensor is assigned to the red color channel and the brightness information from the filtered sensor is assigned to the blue and green color channels of the RGB image. In the case of a LWP filter the brightness information from the unfiltered sensor is assigned to the blue and green color channels and the brightness information from the filtered sensor is assigned to the red color channel of the RGB image. In process step 4226 the RGB image is converted to Lab mode. In process step 4228 the a and b color channels are blurred. In process step 4230 the L channel brightness information from process step 4218 replaces the brightness information from of the L channel produced in step 4226. In process step 4232 the Lab image is converted to an RGB image stream 4234 which may be stored in memory 4236, output to display 4238, or otherwise output.

Software and Hardware

As noted above, the sensors described with reference to the systems and methods described herein can be of any suitable type and may include CCD imaging sensors, CMOS imaging sensors, or any analog or digital imaging sensor. The sensors may be responsive to electromagnetic radiation outside the visible spectrum, and may include thermal, gamma, multi-spectral and x-ray sensors. The sensors, in combination with other components in the imaging system, may generate a file in any format, such as the raw data, GIF, JPEG, TIFF, PBM, PGM, PPM, EPSF, X11 bitmap, Utah Raster Toolkit RLE, PDS/VICAR, Sun Rasterfile, BMP, PCX, PNG, IRIS RGB, XPM, Targa, XWD, PostScript, and PM formats on workstations and terminals running the X11 Window System or any image file suitable for import into the data processing system. Additionally, the system may be employed for generating video images, including digital video images in the .AVI, .WMV, .MOV, .RAM and .MPG formats.

The systems and methods described herein may be implemented in an image processor which may include microcontrollers and microprocessors programmed to receive 2-channel data from the image sensor pixels and convert the data into an RGB value for display on a monitor. The image processors may be configured with hardware and software to perform one or more of the methods, and any combination of the one or more methods, described herein. In particular, the image processor may include a central processing unit (CPU), a memory, and an interconnect bus (not shown). The CPU may include a single microprocessor or a plurality of microprocessors for configuring the image processor as a multi-processor system. The memory may include a main memory and a read-only memory. The image processor also includes mass storage devices having, for example, various disk drives, tape drives, FLASH drives, etc. The main memory also includes dynamic random access memory (DRAM) and high-speed cache memory. In operation, the main memory stores at least portions of instructions and data for execution by a CPU.

The systems and methods may include a mass storage, which may include one or more magnetic disk or tape drives or optical disk drives, for storing data and instructions for use by the image processor. At least one component of the mass storage system, possibly in the form of a disk drive or tape drive, stores the database used for processing the signals measured from the image sensors. The mass storage system may also include one or more drives for various portable media, such as a floppy disk, a compact disc read-only memory (CD-ROM), DVD, or an integrated circuit non-volatile memory adapter (i.e. PC-MCIA adapter) to input and output data and code to and from the image processor.

The image processor may also include one or more input/output interfaces for data communications. The data interface may be a modem, a network card, serial port, bus adapter, or any other suitable data communications mechanism for communicating with one or more local or remote systems. The data interface may provide a relatively high-speed link to a network, such as the Internet. The communication link to the network may be, for example, optical, wired, or wireless (e.g., via satellite or cellular network). Alternatively, the image processor may include a mainframe or other type of host computer system capable of communications via the network. The image processor may also include suitable input/output ports or use the interconnect bus for interconnection with other components, a local display, and keyboard or other local user interface for programming and/or data retrieval purposes.

In certain implementations, the image processor includes circuitry for an analog-to-digital converter and/or a digital-to-analog converter. In such implementations, the analog-to-digital converter circuitry converts analog signals received at the sensors to digital signals for further processing by the image processor.

Certain components of the image processor are those typically found in imaging systems used for portable use as well as fixed use. In certain implementations, the image processor includes general purpose computer systems used as servers, workstations, personal computers, network terminals, and the like. Certain aspects of the systems and methods described herein may relate to the software elements, such as the executable code and database for the server functions of the image processor.

Generally, the methods and techniques described herein may be executed on a device such as a headset, goggles, a riflescope, a camera mounted on apparel, a vehicle, or a structure, or other device or "night-vision" equipment intended to produce or record quality images of a low-light scene for a viewer. Alternatively, the methods and techniques could be executed on a conventional data processing platform such as an IBM PC-compatible computer running the Windows operating systems, a SUN workstation running a UNIX operating system or another equivalent personal computer or workstation. Alternatively, the data processing system may comprise a dedicated processing system that includes an embedded programmable data processing unit.

Certain implementations of the systems and processes described herein may also be realized as software component operating on a conventional data processing system such as a UNIX workstation. In such implementations, the processes may be implemented as a computer program written in any of several languages well-known to those of ordinary skill in the art, such as (but not limited to) C, C++, FORTRAN, Java or BASIC. The processes may also be executed on commonly available clusters of processors, such as Western Scientific Linux clusters, which may allow parallel execution of all or some of the steps in the process.

Certain implementations of the methods described herein may be performed in either hardware, software, or any combination thereof, as those terms are currently known in the art. In particular, these methods may be carried out by software, firmware, or microcode operating on a computer or computers of any type, including pre-existing or already-installed image processing facilities capable of supporting any or all of the processor's functions. Additionally, software embodying these methods may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Furthermore, such software may also be in the form of a computer data signal embodied in a carrier wave, such as that found within the well-known Web pages transferred among devices connected to the Internet.

Accordingly, these methods and systems are not limited to any particular platform, unless specifically stated otherwise in the present disclosure.

The systems described herein may include additional electronic, electrical and optical hardware and software elements for capturing images without departing from the scope of the systems and methods described herein. For example, the system may include single-shot systems, which in turn, may include one or more color filters coupled with the imaging sensors (e.g., CCD or CMOS). In another implementation, the system includes multi-shot systems in which the sensor may be exposed to light from a scene in a sequence of three or more openings of the lens aperture. In such implementations, one or more imaging sensors may be combined with one or more filters passed in front of the sensor in sequence to obtain the additive color information. In other implementations, the systems described herein may be combined with computer systems for operating the lenses and/or sensors and processing captured images.

Alternative Implementations

Those skilled in the art will know or be able to ascertain using no more than routine experimentation, many equivalents to the implementations and practices described herein. Variations, modifications, and other implementations of what is described may be employed without departing from the spirit and scope of the present disclosure. More specifically, any of the method, system, and device features described above or incorporated by reference may be combined with any other suitable method, system, or device features disclosed herein or incorporated by reference, and such combinations are within the scope of the present disclosure, including combinations that omit specific elements. As an illustrative example, the processes described herein may be applied to a system with more than two light channels, including an RGB system. As another example, systems with twin sensors can be implemented using a single sensor in combination with a CFA or beam splitter. As another example, any of the filters discussed herein may or may not be implemented as "leaky" filters in various embodiments. As another example, various embodiments can use only two channels instead of three channels to create a color image, or can use two channels and only one filter. The systems and methods may be embodied in other specific forms without departing from the spirit or essential characteristics thereof. The foregoing implementations are therefore to be considered in all respects illustrative, rather than limiting of the present disclosure. The teachings of all references cited herein are hereby incorporated by reference in their entirety. Although an exemplary embodiment of the present disclosure has been described in detail, those skilled in the art will understand that various changes, substitutions, variations, and improvements disclosed herein may be made without departing from the spirit and scope of the disclosure in its broadest form. Various process steps can be omitted, repeated, performed sequentially or concurrently with other steps or processes, or combined with other steps or processes. The features or steps disclosed herein can be combined or exchanged with others within the scope of the disclosure.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle. The use of terms such as (but not limited to) "mechanism," "module," "device," "unit," "component," "element," "member," "apparatus," "machine," "system," "processor," or "controller," within a claim is understood and intended to refer to structures known to those skilled in the relevant art, as further modified or enhanced by the features of the claims themselves, and is not intended to invoke 35 U.S.C. § 112(f).

What is claimed is:

1. A method performed by an imaging device for generating a color image from a low-light scene, the method comprising:
   filtering light from the low-light scene by a two-channel color filter array to produce a first light channel having light filtered by a first filter and a second light channel having unfiltered light;
   receiving the first light channel and the second light channel by a radiation sensitive sensor;
   producing a first information channel and a second information channel by the radiation sensitive sensor, wherein the first information channel includes first brightness information corresponding to the first light channel and the second information channel includes second brightness information corresponding to the second light channel;
   receiving the first information channel and the second information channel by an image processor;
   stretching, by the image processor, a histogram of the first brightness information so that a dynamic range of the histogram of the first brightness information is substantially matched to a dynamic range of the second brightness information;
   assigning, by the image processor, the first brightness information to a first color channel;
   assigning, by the image processor, the second brightness information to second color channel;
   processing, by the image processor, the first color channel and the second color channel to produce a full-color image stream; and
   outputting the full-color image stream.

2. The method of claim 1, wherein the first filter is a short wave pass filter.

3. The method of claim 2, wherein the first color channel is designated as including blue and green color channels.

4. The method of claim 2, wherein the second color channel is designated as a red color channel.

5. The method of claim 1, wherein the first filter is a long wave pass filter.

6. The method of claim 1, wherein the first color channel is designated as a red color channel.

7. The method of claim 1, wherein the second color channel designated as blue and green color channels.

8. The method of claim 1, wherein the first filter is a predominantly short wave pass filter or a predominantly long wave pass filter that selectively passes other wavelengths of light.

9. The method of claim 1, wherein the imaging device processes the first color channel and the second color channel and does not process a third color channel.

10. A method performed by an imaging device for generating a color image from a low-light scene, the method comprising:
    filtering light from the low-light scene by a two-channel color filter array to produce a first light channel having light filtered by a first filter and a second light channel having unfiltered light;
    receiving the first light channel and the second light channel by a radiation sensitive sensor;
    producing a first information channel and a second information channel by the radiation sensitive sensor, wherein the first information channel includes first brightness information corresponding to the first light channel and the second information channel includes second brightness information corresponding to the second light channel;
    receiving the first information channel and the second information channel by an image processor;
    extracting a grayscale component from at least one of the information channels, the grayscale component comprising information that defines a brightness, a sharpness, and a resolution of a full-color image stream;
    assigning, by the image processor, the first brightness information to a first color channel;
    assigning, by the image processor, the second brightness information to second color channel;
    processing, by the image processor, the first color channel and the second color channel to produce the full-color image stream; and
    outputting the full-color image stream.

11. The method of claim 10, wherein the grayscale component is extracted only from the second information channel.

12. A method performed by an imaging device for generating a color image from a low-light scene, the method comprising:
    filtering light from the low-light scene by a two-channel color filter array to produce a first light channel having light filtered by a first filter and a second light channel having unfiltered light;
    receiving the first light channel and the second light channel by a radiation sensitive sensor;
    producing a fist information channel and a second information channel by the radiation sensitive sensor, wherein the first information channel includes first brightness information corresponding to the first light channel and the second information channel includes second brightness information corresponding to the second light channel;
    receiving the first information channel and the second information channel by an image processor;
    assigning, by the image processor, the first brightness information to a first color channel;
    assigning, by the image processor, the second brightness information to second color channel;
    processing, by the image processor, the first color channel and the second color channel to produce a full-color image stream, wherein processing the first color channel and the second color channel includes blurring the first color channel and the second color channel and does not include blurring the first brightness information or blurring the second brightness information; and
    outputting the full-color image stream.

13. A color imaging system comprising:
a two-channel color filter array;
a radiation sensitive sensor; and
an image processor, wherein the color imaging system is configured to:
 filter light from a low-light scene by the two-channel color filter array to produce a first light channel having light filtered by a first filter and a second light channel having unfiltered light;
 receive the first light channel and the second light channel by the radiation sensitive sensor;
 produce a first information channel and a second information channel by the radiation sensitive sensor, wherein the first information channel includes first brightness information corresponding to the first light channel and the second information channel includes second brightness information corresponding to the second light channel;
 receive the first information channel and the second information channel by the image processor;
 stretch a histogram of the first brightness information so that a dynamic range of the histogram of the first brightness information is substantially matched to a dynamic range of the second brightness information;
 assign, by the image processor, the first brightness information to a first color channel;
 assign, by the image processor, the second brightness information to a second color channel;
 process, by the image processor, the first color channel and the second color channel to produce a full-color image stream; and
 output the full-color image stream.

14. The color imaging system of claim 13, wherein the first filter is one of a short wave pass filter, a long wave pass filter, or a predominantly short wave pass filter that also allows transmission of wavelengths greater than 780 nanometers.

15. The color imaging system of claim 13, wherein the imaging system processes the first color channel and the second color channel and does not process a third color channel.

16. A color imaging system comprising:
a two-channel color filter array;
a radiation sensitive sensor; and
an image processor, wherein the color imaging system is configured to:
 filter light from a low-light scene by the two-channel color filter array to produce a first light channel having light filtered by a first filter and a second light channel having unfiltered light;
 receive the first light channel and the second light channel by the radiation sensitive sensor;
 produce a first information channel and a second information channel by the radiation sensitive sensor, wherein the first information channel includes first brightness information corresponding to the first light channel and the second information channel includes second brightness information corresponding to the second light channel;
 receive the first information channel and the second information channel by the image processor;
 extract a grayscale component from at least one of the information channels, the grayscale component comprising information that defines sharpness and resolution of a full-color stream;
 assign, by the image processor, the first brightness information to a first color channel;
 assign, by the image processor, the second brightness information to a second color channel;
 process, by the image processor, the first color channel and the second color channel to produce the full-color image stream; and
 output the full-color image stream.

17. The color imaging system of claim 16, wherein the grayscale component is extracted only from the second light channel.

18. A color imaging system comprising:
a two-channel color filter array;
a radiation sensitive sensor; and
an image processor, wherein the color imaging system is configured to:
 filter light from a low-light scene by the two-channel color filter array to produce a first light channel having light filtered by a first filter and a second light channel having unfiltered light;
 receive the first light channel and the second light channel by the radiation sensitive sensor;
 produce a first information channel and a second information channel by the radiation sensitive sensor, wherein the first information channel includes first brightness information corresponding to the first light channel and the second information channel includes second brightness information corresponding to the second light channel;
 receive the first information channel and the second information channel by the image processor;
 assign, by the image processor, the first brightness information to a first color channel;
 assign, by the image processor, the second brightness information to a second color channel;
 process, by the image processor, the first color channel and the second color channel to produce a full-color image stream, wherein processing the first color channel and the second color channel includes blurring the first color channel and the second color channel and does not include blurring the first brightness information or blurring the second brightness information; and
 output the full-color image stream.

* * * * *